US012557469B2

(12) United States Patent
Ko

(10) Patent No.: US 12,557,469 B2
(45) Date of Patent: Feb. 17, 2026

(54) ORGANIC LIGHT-EMITTING DEVICE AND ELECTRONIC APPARATUS INCLUDING THE SAME

(71) Applicant: SAMSUNG DISPLAY CO., LTD., Yongin-si (KR)

(72) Inventor: Heejoo Ko, Yongin-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 72 days.

(21) Appl. No.: 18/732,512

(22) Filed: Jun. 3, 2024

(65) Prior Publication Data

US 2024/0334727 A1 Oct. 3, 2024

Related U.S. Application Data

(63) Continuation of application No. 18/099,244, filed on Jan. 19, 2023, which is a continuation of application (Continued)

(30) Foreign Application Priority Data

Feb. 15, 2019 (KP) ........................ 10-2019-0017966

(51) Int. Cl.
*H01L 51/50* (2006.01)
*H10K 50/11* (2023.01)
(Continued)

(52) U.S. Cl.
CPC ............. *H10K 50/13* (2023.02); *H10K 50/11* (2023.02); *H10K 85/324* (2023.02);
(Continued)

(58) Field of Classification Search
None
See application file for complete search history.

(56) References Cited

U.S. PATENT DOCUMENTS 7,645,525 B2 1/2010 Aziz et al.
8,455,113 B2 6/2013 Yamada et al.
(Continued)

FOREIGN PATENT DOCUMENTS

CN 1809236 A 7/2006
CN 102709481 A 10/2012
(Continued)

OTHER PUBLICATIONS

Chinese Office Action issued on Apr. 2, 2024, in corresponding CN Patent Application No. 202010083881.3 (7 pages).
(Continued)

*Primary Examiner* — Gregory D Clark
(74) *Attorney, Agent, or Firm* — Womble Bond Dickinson (US) LLP

(57) ABSTRACT

An organic light-emitting device and an electronic apparatus incorporating the same. The organic light-emitting device includes an anode, a cathode, and an organic layer between the anode and the cathode and comprising an emission region. The emission region includes a first emission layer, a second emission layer, and a first exciton quenching layer. The first emission layer comprises a first host and a first dopant, the second emission layer comprises a second host and a second dopant, and the first exciton quenching layer is disposed between the first emission layer and the second emission layer and comprises a first quenching material.

15 Claims, 1 Drawing Sheet

Related U.S. Application Data

No. 16/788,628, filed on Feb. 12, 2020, now Pat. No. 11,600,795.

(51) Int. Cl.

| | |
|---|---|
| ***H10K 50/13*** | (2023.01) |
| ***H10K 85/30*** | (2023.01) |
| ***H10K 85/40*** | (2023.01) |
| ***H10K 85/60*** | (2023.01) |
| *H10K 101/10* | (2023.01) |

(52) U.S. Cl.

CPC .......... *H10K 85/381* (2023.02); *H10K 85/40* (2023.02); *H10K 85/622* (2023.02); *H10K 85/626* (2023.02); *H10K 85/631* (2023.02); *H10K 85/654* (2023.02); *H10K 85/6565* (2023.02); *H10K 85/6572* (2023.02); *H10K 85/6574* (2023.02); *H10K 85/6576* (2023.02); *H10K 2101/10* (2023.02)

(56) References Cited

U.S. PATENT DOCUMENTS

| | | | |
|---|---|---|---|
| 8,969,854 | B2 | 3/2015 | Takemura et al. |
| 9,368,741 | B2 | 6/2016 | Ishisone et al. |
| 9,406,897 | B2 | 8/2016 | Okamoto et al. |
| 9,812,647 | B2 | 11/2017 | Pillow et al. |
| 10,026,917 | B2 | 7/2018 | Ohsawa et al. |
| 2003/0137239 | A1 | 7/2003 | Matsuura et al. |
| 2004/0170863 | A1 | 9/2004 | Kim et al. |
| 2006/0158105 | A1 | 7/2006 | Kim et al. |
| 2013/0001612 | A1 | 1/2013 | Lee et al. |
| 2013/0105777 | A1 | 5/2013 | Adamovich et al. |
| 2014/0340888 | A1 | 11/2014 | Ishisone et al. |
| 2017/0047536 | A1 | 2/2017 | Wan |
| 2017/0053970 | A1 | 2/2017 | Ishisone et al. |
| 2018/0190193 | A1 | 7/2018 | Kim et al. |

FOREIGN PATENT DOCUMENTS

| | | | |
|---|---|---|---|
| CN | 104167494 | A | 11/2014 |
| EP | 3035403 | | 6/2016 |
| JP | 2012195572 | A | 10/2012 |
| JP | 2014241405 | A | 12/2014 |
| JP | 2015201508 | A | 11/2015 |
| JP | 2016-054138 | A | 4/2016 |
| KR | 10-2006-0055765 | A | 5/2006 |
| KR | 10-2007-0069022 | A | 7/2007 |
| KR | 10-2010-0067062 | A | 6/2010 |
| KR | 10-2010-0068617 | A | 6/2010 |
| KR | 10-2013-0097708 | A | 9/2013 |
| KR | 10-2014-0135628 | A | 11/2014 |
| KR | 10-2018- 0039769 | A | 4/2018 |
| WO | WO 2013/174104 | A | 11/2013 |

OTHER PUBLICATIONS

U.S. Non-Final Office Action mailed May 18, 2022, in U.S. Appl. No. 16/788,628.

U.S. Notice of Allowance issued Oct. 19, 2022, in U.S. Appl. No. 16/788,628.

U.S. Corrected Notice of Allowance issued Dec. 16, 2022, in U.S. Appl. No. 16/788,628.

Zhiheng Wang et al., Exciton-Adjustable Interlayers for High Efficiency, Low Efficiency Roll-Off, And Lifetime Improved Warm White Organic Light-Emitting Diodes (WOLEDs) Based on a Delayed Fluorescence Assistant Host, Advanced Functional Materials, Jan. 15, 2018, p. 1706922, vol. 28, No. 11.

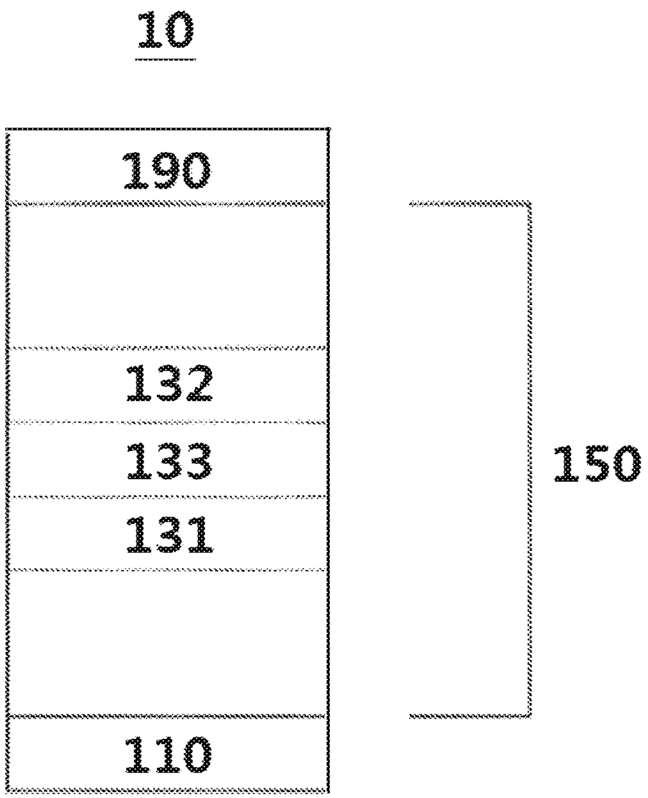
10
190
132
133
131
110
150

ORGANIC LIGHT-EMITTING DEVICE AND ELECTRONIC APPARATUS INCLUDING THE SAME

CROSS REFERENCE TO RELATED APPLICATIONS

This application is a Continuation of U.S. patent application Ser. No. 18/099,244, filed Jan. 19, 2023, which is a Continuation of U.S. patent application Ser. No. 16/788,628, filed Feb. 12, 2020, which claims priority from and the benefit of Korean Patent Application No. 10-2019-0017966, filed on Feb. 15, 2019, each of which is hereby incorporated by reference for all purposes as if fully set forth herein.

BACKGROUND

Field

One or more exemplary embodiments relate to an organic light-emitting device and an electronic apparatus including the same.

Discussion of the Background

Organic light-emitting devices are self-emission devices that produce full-color images. Compared to devices in the art, they have wide viewing angles, high contrast ratios, short response times, and excellent characteristics in terms of brightness, driving voltage, and response speed.

The organic light-emitting device may include a first electrode disposed on a substrate, and a hole transport region, an emission layer, an electron transport region, and a second electrode, which are sequentially disposed on the first electrode. Holes provided from the first electrode may move toward the emission layer through the hole transport region, and electrons provided from the second electrode may move toward the emission layer through the electron transport region. Carriers, such as holes and electrons, recombine in the emission layer to produce excitons.

According to electron spin statistics, singlet excitons and triplet excitons are formed at a ratio of 1:3. In these excitons, a transition occurs between the singlet excitons and the triplet excitons due to Inter-system crossing (ISC) or triplet-triplet fusion (TTF). In the case of a device using a fluorescence emitting body, light is formed while singlet excitons transit from an excited state to a ground state, and in the case of a device using a phosphorescence emitting body, light is formed while triplet excitons transit from an excited state to a ground state.

The above information disclosed in this Background section is only for understanding of the background of the inventive concepts, and, therefore, it may contain information that does not constitute prior art.

SUMMARY

Devices constructed according to exemplary implementations of the invention include an organic light-emitting device and an electronic apparatus including the same.

Additional features of the inventive concepts will be set forth in the description which follows, and in part will be apparent from the description, or may be learned by practice of the inventive concepts.

An exemplary embodiment of the inventive concepts includes an organic light-emitting device having: an anode; a cathode; an organic layer between the anode and the cathode and including an emission region. The emission region includes a first emission layer, a second emission layer, and a first exciton quenching layer. The first emission layer includes a first host and a first dopant, the second emission layer includes a second host and a second dopant, and the first exciton quenching layer is provided between the first emission layer and the second emission layer and includes a first quenching material.

Another exemplary embodiment of the inventive concepts includes an electronic apparatus having: a thin-film transistor including a source electrode, a drain electrode, and an activation layer; and the organic light-emitting device. The anode or the cathode of the organic light-emitting device is electrically connected to one of the source electrode and the drain electrode of the thin-film transistor.

It is to be understood that both the foregoing general description and the following detailed description are exemplary and explanatory and are intended to provide further explanation of the invention as claimed.

BRIEF DESCRIPTION OF THE DRAWING

The accompanying drawing, which is included to provide a further understanding of the invention and is incorporated in and constitutes a part of this specification, illustrates an exemplary embodiment of the invention, and together with the description serves to explain the inventive concepts.

The FIGURE is a schematic view of an organic light-emitting device according to an exemplary embodiment.

DETAILED DESCRIPTION

In the following description, for the purposes of explanation, numerous specific details are set forth in order to provide a thorough understanding of various exemplary embodiments or implementations of the invention. As used herein "embodiments" and "implementations" are interchangeable words that are non-limiting examples of devices or methods employing one or more of the inventive concepts disclosed herein. It is apparent, however, that various exemplary embodiments may be practiced without these specific details or with one or more equivalent arrangements. In other instances, well-known structures and devices are shown in block diagram form in order to avoid unnecessarily obscuring various exemplary embodiments. Further, various exemplary embodiments may be different, but do not have to be exclusive. For example, specific shapes, configurations, and characteristics of an exemplary embodiment may be used or implemented in another exemplary embodiment without departing from the inventive concepts.

Unless otherwise specified, the illustrated exemplary embodiment is to be understood as providing exemplary features of varying detail of some ways in which the inventive concepts may be implemented in practice. Therefore, unless otherwise specified, the features, components, modules, layers, films, panels, regions, and/or aspects, etc. (hereinafter individually or collectively referred to as "elements"), of the various embodiments may be otherwise combined, separated, interchanged, and/or rearranged without departing from the inventive concepts.

In the accompanying drawing, the size and relative sizes of elements may be exaggerated for clarity and/or descriptive purposes. When an exemplary embodiment may be implemented differently, a specific process order may be performed differently from the described order. For example, two consecutively described processes may be performed substantially at the same time or performed in an order opposite to the described order. Also, like reference numerals denote like elements.

When an element, such as a layer, is referred to as being "on," "connected to," or "coupled to" another element or layer, it may be directly on, connected to, or coupled to the other element or layer or intervening elements or layers may be present. When, however, an element or layer is referred to as being "directly on," "directly connected to," or "directly coupled to" another element or layer, there are no intervening elements or layers present. To this end, the term "connected" may refer to physical, electrical, and/or fluid connection, with or without intervening elements. For the purposes of this disclosure, "at least one of X, Y, and Z" and "at least one selected from the group consisting of X, Y, and Z" may be construed as X only, Y only, Z only, or any combination of two or more of X, Y, and Z, such as, for instance, XYZ, XYY, YZ, and ZZ. As used herein, the term "and/or" includes any and all combinations of one or more of the associated listed items.

Although the terms "first," "second," etc. may be used herein to describe various types of elements, these elements should not be limited by these terms. These terms are used to distinguish one element from another element. Thus, a first element discussed below could be termed a second element without departing from the teachings of the disclosure.

Spatially relative terms, such as "beneath," "below," "under," "lower," "above," "upper," "over," "higher," "side" (e.g., as in "sidewall"), and the like, may be used herein for descriptive purposes, and, thereby, to describe one elements relationship to another element(s) as illustrated in the drawing. Spatially relative terms are intended to encompass different orientations of an apparatus in use, operation, and/or manufacture in addition to the orientation depicted in the drawing. For example, if the apparatus in the drawing is turned over, elements described as "below" or "beneath" other elements or features would then be oriented "above" the other elements or features. Thus, the exemplary term "below" can encompass both an orientation of above and below. Furthermore, the apparatus may be otherwise oriented (e.g., rotated 90 degrees or at other orientations), and, as such, the spatially relative descriptors used herein interpreted accordingly.

The terminology used herein is for the purpose of describing particular embodiments and is not intended to be limiting. As used herein, the singular forms, "a," "an," and "the" are intended to include the plural forms as well, unless the context clearly indicates otherwise. Moreover, the terms "comprises," "comprising," "includes," and/or "including," when used in this specification, specify the presence of stated features, integers, steps, operations, elements, components, and/or groups thereof, but do not preclude the presence or addition of one or more other features, integers, steps, operations, elements, components, and/or groups thereof. It is also noted that, as used herein, the terms "substantially," "about," and other similar terms, are used as terms of approximation and not as terms of degree, and, as such, are utilized to account for inherent deviations in measured, calculated, and/or provided values that would be recognized by one of ordinary skill in the art.

Unless otherwise defined, all terms (including technical and scientific terms) used herein have the same meaning as commonly understood by one of ordinary skill in the art to which this disclosure is a part. Terms, such as those defined in commonly used dictionaries, should be interpreted as having a meaning that is consistent with their meaning in the context of the relevant art and should not be interpreted in an idealized or overly formal sense, unless expressly so defined herein.

The present disclosure will now be described more fully with reference to exemplary embodiments. The disclosure may, however, be embodied in many different forms and should not be construed as being limited to the embodiments set forth herein; rather, these embodiments are provided so that this disclosure will be thorough and complete, and will fully convey the concept of the disclosure to those skilled in the art. Advantages, features, and how to achieve them of the present invention will become apparent by reference to the embodiment that will be described later in detail, together with the accompanying drawing. This invention may, however, be embodied in many different forms and should not be limited to the exemplary embodiments.

The term "organic layer" as used herein refers to a single layer and/or a plurality of layers disposed between the anode and the cathode of the organic light-emitting device. A material included in the "organic layer" is not limited to an organic material.

The expression "(an organic layer) includes a compound represented by Formula N" (wherein N indicates a random integer) as used herein may include a case in which "(an organic layer) includes identical compounds represented by Formula N" and a case in which "(an organic layer) includes two or more different compounds represented by Formula N".

The term "lowest excitation triplet energy level" as used herein means a T1 energy level measured when a mixture of toluene and each Compound (1 mg of each Compounds is dissolved in 3 mL of toluene) is added to a quartz cell, liquid nitrogen (77 K) is added thereto, a photoluminescence spectrum is measured by using a photoluminescence measurement instrument, and the peak observed only at a low temperature is analyzed by comparing the photoluminescence spectrum with a general room-temperature photoluminescence spectrum.

Hereinafter, exemplary embodiments of the inventive concepts will be described in detail with reference to the FIGURE.

The FIGURE is a schematic view of an organic light-emitting device 10 according to an exemplary embodiment.

Referring to the FIGURE, the organic light-emitting device 10 includes: an anode 110; a cathode 190; an organic layer 150 between the anode 110 and the cathode 190 and including an emission region, wherein the emission region includes a first emission layer 131, a second emission layer 132, and a first exciton quenching layer 133, the first emission layer 131 includes a first host and a first dopant, the second emission layer 132 includes a second host and a second dopant, and the first exciton quenching layer 133 is disposed between the first emission layer 131 and the second emission layer 132 and includes a first quenching material.

Since the organic light-emitting device 10 includes the first exciton quenching layer including the first quenching material in the emission region, the triplet concentrations in the first emission layer and the second emission layer may be appropriately adjusted. The triplets existing in the first emission layer and the second emission layer do not participate in light emission, and the triplets may react with each other to disappear or may deteriorate the host and the dopant through various mechanisms such as reaction with charges or charged organic molecules. Therefore, since the organic light-emitting device includes the first exciton quenching layer, some of the triplets existing in the first emission layer and the second emission layer may be quenched and maintained at an appropriate concentration, thereby improving the luminescent efficiency and the lifespan of the organic light-emitting device.

In addition, since the first exciton quenching layer is present as a layer separate from the first emission layer and the second emission layer in the emission region, a region in which excitons recombine ("exciton recombination region") may be separated from a region in which excitons are quenched. Therefore, due to the inclusion of the first exciton quenching layer, the reduction in the luminescent efficiency of the organic light-emitting device may be prevented, and the lifespan of the organic light-emitting device may be improved.

The anode 110 may be formed by depositing or sputtering a material for forming the anode 110 on a substrate (not shown). The material for forming the anode 110 may be selected from materials with a high work function to facilitate hole injection.

The anode 110 may be a reflective electrode, a semi-transmissive electrode, or a transmissive electrode. When the anode 110 is a transmissive electrode, a material for forming the anode 110 may be selected from indium tin oxide (ITO), indium zinc oxide (IZO), tin oxide ($SnO_2$), zinc oxide (ZnO), and any combinations thereof, but exemplary embodiments of the inventive concepts are not limited thereto. In one or more exemplary embodiments, when the anode 110 is a semi-transmissive electrode or a reflective electrode, a material for forming the anode 110 may be selected from magnesium (Mg), silver (Ag), aluminum (Al), aluminum-lithium (Al—Li), calcium (Ca), magnesium-indium (Mg—In), magnesium-silver (Mg—Ag), and any combinations thereof, but exemplary embodiments of the inventive concepts are not limited thereto.

The anode 110 may have a single-layered structure, or a multi-layered structure including two or more layers. For example, the anode 110 may have a three-layered structure of ITO/Ag/ITO, but the structure of the anode 110 is not limited thereto.

The organic layer 150 may be disposed on the anode 110. As described above, the organic layer 150 may include an emission region, and the emission region may include a first emission layer 131, a second emission layer 132, and a first exciton quenching layer 133. The organic layer 150 may further include a hole transport region between the anode 110 and a first emission layer 131 and an electron transport region between a second emission layer 132 and the cathode 190.

The hole transport region may have i) a single-layered structure including a single layer including a single material, ii) a single-layered structure including a single layer including a plurality of different materials, or iii) a multi-layered structure having a plurality of layers including a plurality of different materials.

The hole transport region may include at least one layer selected from a hole injection layer, a hole transport layer, an emission auxiliary layer, and an electron blocking layer.

For example, the hole transport region may have a single-layered structure including a single layer including a plurality of different materials, or a multi-layered structure having a hole injection layer/hole transport layer structure, a hole injection layer/hole transport layer/emission auxiliary layer structure, a hole injection layer/emission auxiliary layer structure, a hole transport layer/emission auxiliary layer structure, or a hole injection layer/hole transport layer/electron blocking layer structure, wherein for each structure, constituting layers are sequentially stacked from the anode 110 in this stated order, but the structure of the hole transport region is not limited thereto.

The hole transport region may include at least one selected from m-MTDATA, TDATA, 2-TNATA, NPB (NPD), p-NPB, TPD, Spiro-TPD, Spiro-NPB, methylated-NPB, TAPC, HMTPD, 4,4',4"-tris(N-carbazolyl)triphenylamine (TCTA), CzSi, polyaniline/dodecylbenzenesulfonic acid (PANI/DBSA), poly(3,4-ethylenedioxythiophene)/poly(4-styrenesulfonate) (PEDOT/PSS), polyaniline/camphor sulfonic acid (PANI/CSA), polyaniline/poly(4-styrenesulfonate) (PANI/PSS), a compound represented by Formula 201, and a compound represented by Formula 202:

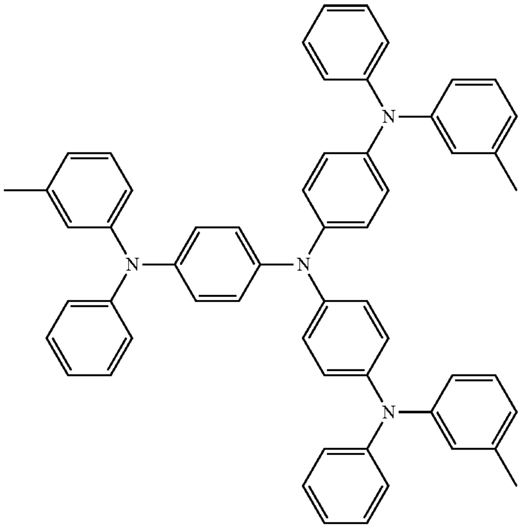

m-MTDATA

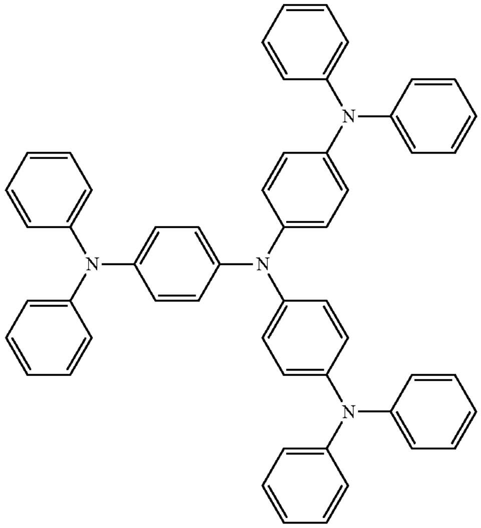

TDATA

-continued
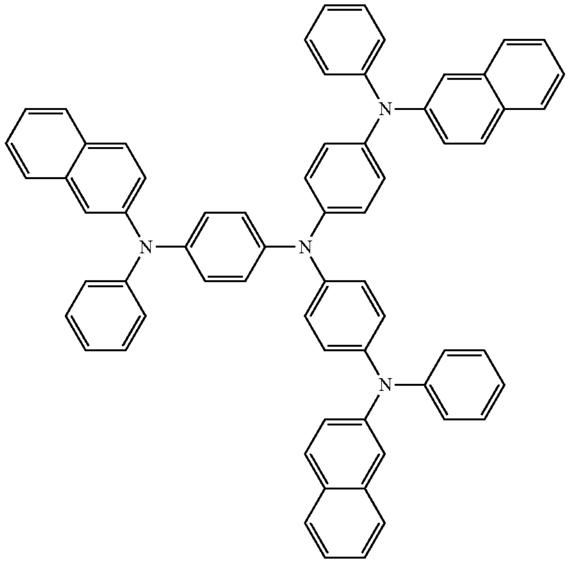
2 -TNATA
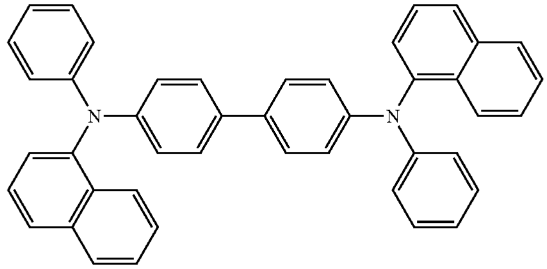
NPB
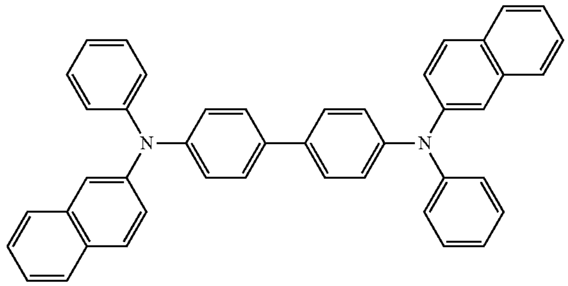
β-NPB
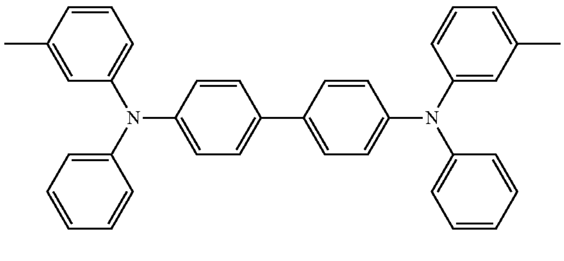
TPD
-continued
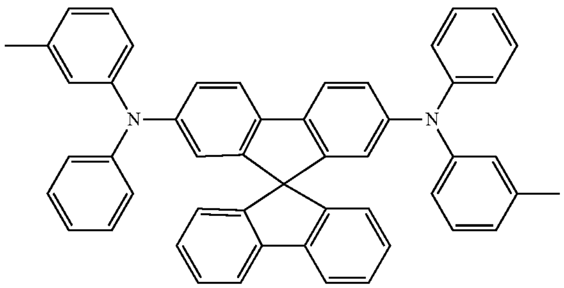
Spiro-TPD
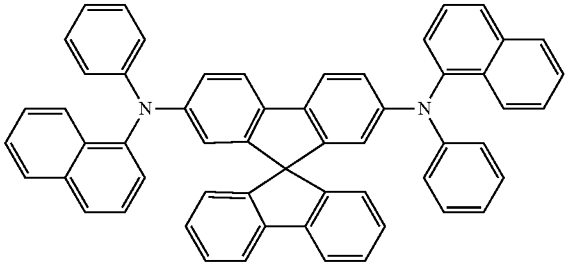
Spiro-NPB
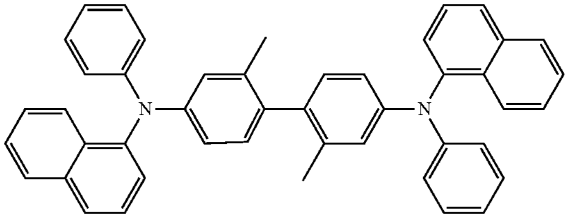
methylated NPB
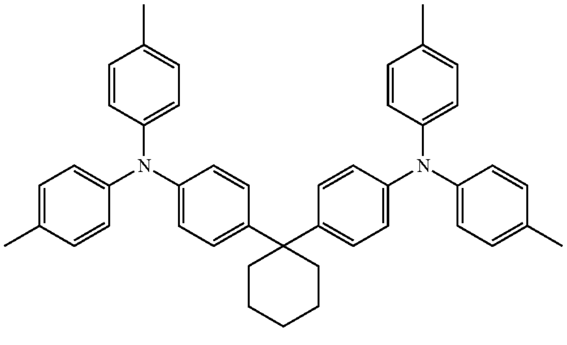
TAPC
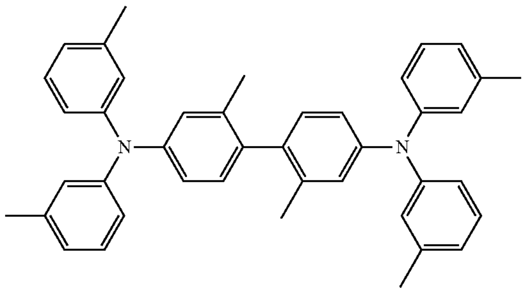
HMTPD -continued

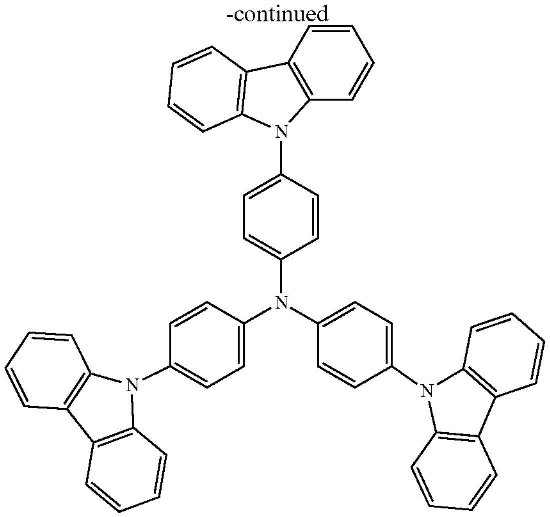

TCTA

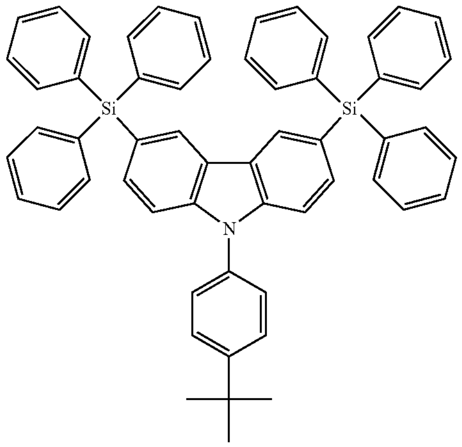

CzSi

<Formula 201>

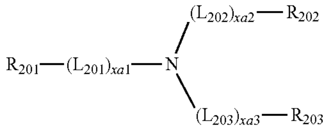

<Formula 202>

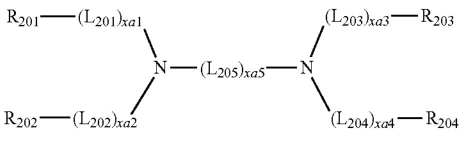

In Formulae 201 and 202, $L_{201}$ to $L_{204}$ may each independently be selected from a substituted or unsubstituted $C_3$-$C_{10}$ cycloalkylene group, a substituted or unsubstituted $C_1$-$C_{10}$ heterocycloalkylene group, a substituted or unsubstituted $C_3$-$C_{10}$ cycloalkenylene group, a substituted or unsubstituted $C_1$-$C_{10}$ heterocycloalkenylene group, a substituted or unsubstituted $C_6$-$C_{60}$ arylene group, a substituted or unsubstituted $C_1$-$C_{60}$ heteroarylene group, a substituted or unsubstituted divalent non-aromatic condensed polycyclic group, and a substituted or unsubstituted divalent non-aromatic condensed heteropolycyclic group, $L_{205}$ may be selected from *—O—*', *—S—*', *—N($Q_{201}$)-*', a substituted or unsubstituted $C_1$-$C_{20}$ alkylene group, a substituted or unsubstituted $C_2$-$C_{20}$ alkenylene group, a substituted or unsubstituted $C_3$-$C_{10}$ cycloalkylene group, a substituted or unsubstituted $C_1$-$C_{10}$ heterocycloalkylene group, a substituted or unsubstituted $C_3$-$C_{10}$ cycloalkenylene group, a substituted or unsubstituted $C_1$-$C_{10}$ heterocycloalkenylene group, a substituted or unsubstituted $C_6$-$C_{60}$ arylene group, a substituted or unsubstituted $C_1$-$C_{60}$ heteroarylene group, a substituted or unsubstituted divalent non-aromatic condensed polycyclic group, and a substituted or unsubstituted divalent non-aromatic condensed heteropolycyclic group, xa1 to xa4 may each independently be an integer from 0 to 3, xa5 may be an integer from 1 to 10, and $R_{201}$ to $R_{204}$ and $Q_{201}$ may each independently be selected from a substituted or unsubstituted $C_3$-$C_{10}$ cycloalkyl group, a substituted or unsubstituted $C_1$-$C_{10}$ heterocycloalkyl group, a substituted or unsubstituted $C_3$-$C_{10}$ cycloalkenyl group, a substituted or unsubstituted $C_1$-$C_{10}$ heterocycloalkenyl group, a substituted or unsubstituted $C_6$-$C_{60}$ aryl group, a substituted or unsubstituted $C_6$-$C_{60}$ aryloxy group, a substituted or unsubstituted $C_6$-$C_{60}$ arylthio group, a substituted or unsubstituted $C_1$-$C_{60}$ heteroaryl group, a substituted or unsubstituted monovalent non-aromatic condensed polycyclic group, and a substituted or unsubstituted monovalent non-aromatic condensed heteropolycyclic group.

For example, in Formula 202, $R_{201}$ and $R_{202}$ may optionally be linked via a single bond, a dimethyl-methylene group, or a diphenyl-methylene group, and $R_{203}$ and $R_{204}$ may optionally be linked via a single bond, a dimethyl-methylene group, or a diphenyl-methylene group.

In one exemplary embodiment, in Formulae 201 and 202, $L_{201}$ to $L_{205}$ may each independently be selected from:

phenylene group, a pentalenylene group, an indenylene group, a naphthylene group, an azulenylene group, a heptalenylene group, an indacenylene group, an acenaphthenylene group, a fluorenylene group, a spirobifluorenylene group, a benzofluorenylene group, a dibenzofluorenylene group, a phenalenylene group, a phenanthrenylene group, an anthracenylene group, a fluoranthenylene group, a triphenylenylene group, a pyrenylene group, a chrysenylene group, a naphthacenylene group, a picenylene group, a perylenylene group, a pentaphenylene group, a hexacenylene group, a pentacenylene group, a rubicenylene group, a coronenylene group, an ovalenylene group, a thiophenylene group, a furanylene group, a carbazolylene group, an indolylene group, an isoindolylene group, a benzofuranylene group, a benzothiophenylene group, a dibenzofuranylene group, a dibenzothiophenylene group, a benzocarbazolylene group, a dibenzocarbazolylene group, a dibenzosilolylene group, and a pyridinylene group; and a phenylene group, a pentalenylene group, an indenylene group, a naphthylene group, an azulenylene group, a heptalenylene group, an indacenylene group, an acenaphthenylene group, a fluorenylene group, a spirobifluorenylene group, a benzofluorenylene group, a dibenzofluorenylene group, a phenalenylene group, a phenanthrenylene group, an anthracenylene group, a fluoranthenylene group, a triphenylenylene group, a pyrenylene group, a chrysenylene group, a naphthacenylene group, a picenylene group, a perylenylene group, a pentaphenylene group, a hexacenylene group, a pentacenylene group, a rubicenylene group, a coronenylene group, an ovalenylene group, a thiophenylene group, a furanylene group, a carbazolylene group, an indolylene group, an isoindolylene group, a benzofuranylene group, a benzothiophenylene group, a dibenzofuranylene group, a dibenzothiophenylene group, a benzocarbazolylene group, a dibenzocarbazolylene group, a dibenzosilolylene group, and a pyridinylene group, each substituted with at least one selected from deuterium, —F, —Cl, —Br, —I, a hydroxyl group, a cyano group, a nitro group, an amidino group, a hydrazino group, a hydrazono group, a $C_1$-$C_{20}$ alkyl group, a $C_1$-$C_{20}$ alkoxy group, a cyclopentyl group, a cyclohexyl group, a cycloheptyl group, a cyclopentenyl group, a cyclohexenyl group, a phenyl group, a biphenyl group, a terphenyl group, a phenyl group substituted with a $C_1$-$C_{10}$ alkyl group, a phenyl group substituted with —F, a pentalenyl group, an indenyl group, a naphthyl group, an azulenyl group, a heptalenyl group, an indacenyl group, an acenaphthenyl group, a fluorenyl group, a spiro-bifluorenyl group, a benzofluorenyl group, a dibenzofluorenyl group, a phenalenyl group, a phenanthrenyl group, an anthracenyl group, a fluoranthenyl group, a triphenylenyl group, a pyrenyl group, a chrysenyl group, a naphthacenyl group, a picenyl group, a perylenyl group, a pentaphenyl group, a hexacenyl group, a pentacenyl group, a rubicenyl group, a coronenyl group, an ovalenyl group, a thiophenyl group, a furanyl group, a carbazolyl group, an indolyl group, an isoindolyl group, a benzofuranyl group, a benzothiophenyl group, a dibenzofuranyl group, a dibenzothiophenyl group, a benzocarbazolyl group, a dibenzocarbazolyl group, a dibenzosilolyl group, a pyridinyl group, —$Si(Q_{31})(Q_{32})(Q_{33})$, and —$N(Q_{31})(Q_{32})$, and $Q_{31}$ to $Q_{33}$ may each independently be selected from a $C_1$-$C_{10}$ alkyl group, a $C_1$-$C_{10}$ alkoxy group, a phenyl group, a biphenyl group, a terphenyl group, and a naphthyl group.

In one or more exemplary embodiments, xa1 to xa4 may each independently be 0, 1, or 2.

In one or more exemplary embodiments, xa5 may be 1, 2, 3, or 4.

In one or more exemplary embodiments, $R_{201}$ to $R_{204}$ and $Q_{201}$ may each independently be selected from:

a phenyl group, a biphenyl group, a terphenyl group, a pentalenyl group, an indenyl group, a naphthyl group, an azulenyl group, a heptalenyl group, an indacenyl group, an acenaphthenyl group, a fluorenyl group, a spiro-bifluorenyl group, a benzofluorenyl group, a dibenzofluorenyl group, a phenalenyl group, a phenanthrenyl group, an anthracenyl group, a fluoranthenyl group, a triphenylenyl group, a pyrenyl group, a chrysenyl group, a naphthacenyl group, a picenyl group, a perylenyl group, a pentaphenyl group, a hexacenyl group, a pentacenyl group, a rubicenyl group, a coronenyl group, an ovalenyl group, a thiophenyl group, a furanyl group, a carbazolyl group, an indolyl group, an isoindolyl group, a benzofuranyl group, a benzothiophenyl group, a dibenzofuranyl group, a dibenzothiophenyl group, a benzocarbazolyl group, a dibenzocarbazolyl group, a dibenzosilolyl group, and a pyridinyl group; and a phenyl group, a biphenyl group, a terphenyl group, a pentalenyl group, an indenyl group, a naphthyl group, an azulenyl group, a heptalenyl group, an indacenyl group, an acenaphthenyl group, a fluorenyl group, a spiro-bifluorenyl group, a benzofluorenyl group, a dibenzofluorenyl group, a phenalenyl group, a phenanthrenyl group, an anthracenyl group, a fluoranthenyl group, a triphenylenyl group, a pyrenyl group, a chrysenyl group, a naphthacenyl group, a picenyl group, a perylenyl group, a pentaphenyl group, a hexacenyl group, a pentacenyl group, a rubicenyl group, a coronenyl group, an ovalenyl group, a thiophenyl group, a furanyl group, a carbazolyl group, an indolyl group, an isoindolyl group, a benzofuranyl group, a benzothiophenyl group, a dibenzofuranyl group, a dibenzothiophenyl group, a benzocarbazolyl group, a dibenzocarbazolyl group, a dibenzosilolyl group, and a pyridinyl group, each substituted with at least one selected from deuterium, —F, —Cl, —Br, —I, a hydroxyl group, a cyano group, a nitro group, an amidino group, a hydrazino group, a hydrazono group, a $C_1$-$C_{20}$ alkyl group, a $C_1$-$C_{20}$ alkoxy group, a cyclopentyl group, a cyclohexyl group, a cycloheptyl group, a cyclopentenyl group, a cyclohexenyl group, a phenyl group, a biphenyl group, a terphenyl group, a phenyl group substituted with a $C_1$-$C_{10}$ alkyl group, a phenyl group substituted with —F, a pentalenyl group, an indenyl group, a naphthyl group, an azulenyl group, a heptalenyl group, an indacenyl group, an acenaphthenyl group, a fluorenyl group, a spiro-bifluorenyl group, a benzofluorenyl group, a dibenzofluorenyl group, a phenalenyl group, a phenanthrenyl group, an anthracenyl group, a fluoranthenyl group, a triphenylenyl group, a pyrenyl group, a chrysenyl group, a naphthacenyl group, a picenyl group, a perylenyl group, a pentaphenyl group, a hexacenyl group, a pentacenyl group, a rubicenyl group, a coronenyl group, an ovalenyl group, a thiophenyl group, a furanyl group, a carbazolyl group, an indolyl group, an isoindolyl group, a benzofuranyl group, a benzothiophenyl group, a dibenzofuranyl group, a dibenzothiophenyl group, a benzocarbazolyl group, a dibenzocarbazolyl group, a dibenzosilolyl group, a pyridinyl group, —$Si(Q_{31})(Q_{32})(Q_{33})$, and —$N(Q_{31})(Q_{32})$, and $Q_{31}$ to $Q_{33}$ are the same as described above.

In one or more exemplary embodiments, at least one selected from $R_{201}$ to $R_{203}$ in Formula 201 may each independently be selected from:

a fluorenyl group, a spiro-bifluorenyl group, a carbazolyl group, a dibenzofuranyl group, and a dibenzothiophenyl group; and a fluorenyl group, a spiro-bifluorenyl group, a carbazolyl group, a dibenzofuranyl group, and a dibenzothiophenyl group, each substituted with at least one selected from deuterium, —F, —Cl, —Br, —I, a hydroxyl group, a cyano group, a nitro group, an amidino group, a hydrazino group, a hydrazono group, a $C_1$-$C_{20}$ alkyl group, a $C_1$-$C_{20}$ alkoxy group, a cyclopentyl group, a cyclohexyl group, a cycloheptyl group, a cyclopentenyl group, a cyclohexenyl group, a phenyl group, a biphenyl group, a terphenyl group, a phenyl group substituted with a $C_1$-$C_{10}$ alkyl group, a phenyl group substituted with —F, a naphthyl group, a fluorenyl group, a spiro-bifluorenyl group, a carbazolyl group, a dibenzofuranyl group, and a dibenzothiophenyl group, but exemplary embodiments of the inventive concepts are not limited thereto.

In one or more exemplary embodiments, in Formula 202, i) $R_{201}$ and $R_{202}$ may be linked via a single bond, and/or ii) $R_{203}$ and $R_{204}$ may be linked via a single bond.

In one or more exemplary embodiments, in Formula 202, at least one selected from $R_{201}$ to $R_{204}$ may be selected from:

a carbazolyl group; and a carbazolyl group substituted with at least one selected from deuterium, —F, —Cl, —Br, —I, a hydroxyl group, a cyano group, a nitro group, an amidino group, a hydrazino group, a hydrazono group, a $C_1$-$C_{20}$ alkyl group, a $C_1$-$C_{20}$ alkoxy group, a cyclopentyl group, a cyclohexyl group, a cycloheptyl group, a cyclopentenyl group, a cyclohexenyl group, a phenyl group, a biphenyl group, a terphenyl group, a phenyl group substituted with a $C_1$-$C_{10}$ alkyl group, a phenyl group substituted with —F, a naphthyl group, a fluorenyl group, a spiro-bifluorenyl group, a carbazolyl group, a dibenzofuranyl group, and a dibenzothiophenyl group, but exemplary embodiments of the inventive concepts are not limited thereto.

The compound represented by Formula 201 may be represented by Formula 201A:

<Formula 201A>

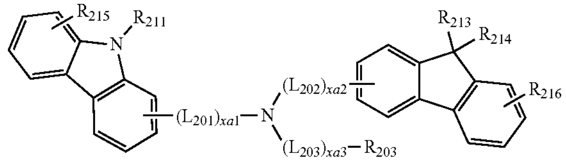

For example, the compound represented by Formula 201 may be represented by Formula 201A(1), but exemplary embodiments of the inventive concepts are not limited thereto:

<Formula 201A(1)>

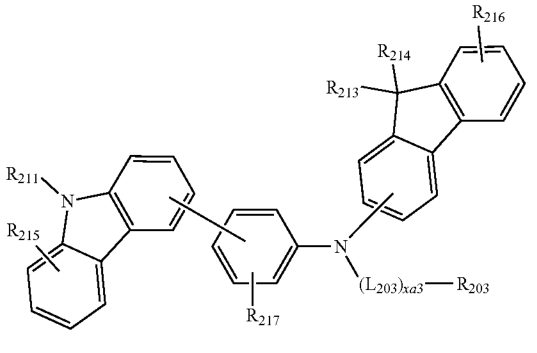

In one exemplary embodiment, the compound represented by Formula 201 may be represented by Formula 201A-1, but exemplary embodiments of the inventive concepts are not limited thereto:

<Formula 201A-1>

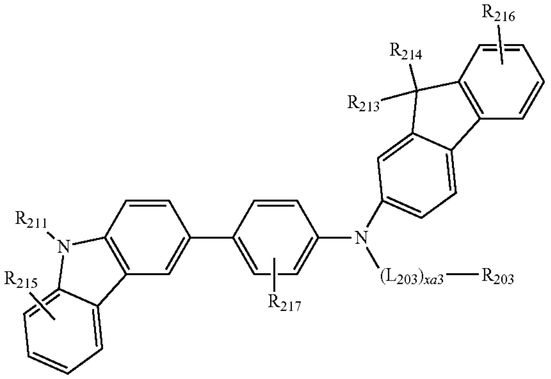

In one exemplary embodiment, the compound represented by Formula 202 may be represented by Formula 202A:

<Formula 202A>

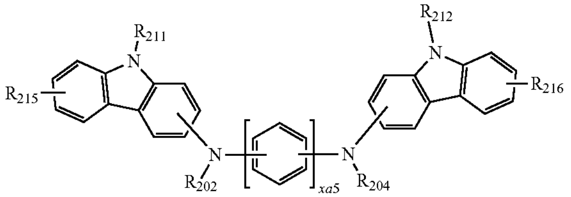

In one exemplary embodiment, the compound represented by Formula 202 may be represented by Formula 202A-1:

<Formula 202A-1>

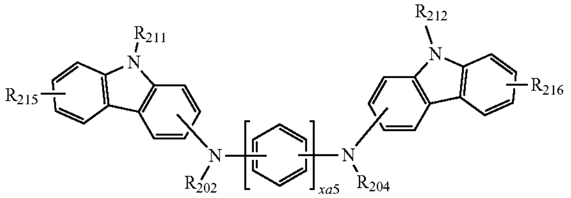

In Formulae 201A, 201A(1), 201A-1, 202A, and 202A-1, $L_{201}$ to $L_{203}$, xa1 to xa3, xa5, and $R_{202}$ to $R_{204}$ are the same as described above, $R_{211}$ and $R_{212}$ may each independently be the same as defined in connection with $R_{203}$, and $R_{213}$ to $R_{217}$ may each independently be selected from hydrogen, deuterium, —F, —Cl, —Br, —I, a hydroxyl group, a cyano group, a nitro group, an amidino group, a hydrazino group, a hydrazono group, a $C_1$-$C_{20}$ alkyl group, a $C_1$-$C_{20}$ alkoxy group, a cyclopentyl group, a cyclohexyl group, a cycloheptyl group, a cyclopentenyl group, a cyclohexenyl group, a phenyl group, a biphenyl group, a terphenyl group, a phenyl group substituted with a $C_1$-$C_{10}$ alkyl group, a phenyl group substituted with —F, a pentalenyl group, an indenyl group, a naphthyl group, an azulenyl group, a heptalenyl group, an indacenyl group, an acenaphthenyl group, a fluorenyl group, a spiro-bifluorenyl group, a benzofluorenyl group, a dibenzofluorenyl group, a phenalenyl group, a phenanthrenyl group, an anthracenyl group, a fluoranthenyl group, a triphenylenyl group, a pyrenyl group, a chrysenyl group, a naphthacenyl group, a picenyl group, a perylenyl group, a pentaphenyl group, a hexacenyl group, a pentacenyl group, a rubicenyl group, a coronenyl group, an ovalenyl group, a thiophenyl group, a furanyl group, a carbazolyl group, an indolyl group, an isoindolyl group, a benzofuranyl group, a benzothiophenyl group, a dibenzofuranyl group, a dibenzothiophenyl group, a benzocarbazolyl group, a dibenzocarbazolyl group, a dibenzosilolyl group, and a pyridinyl group.

The hole transport region may include at least one compound selected from Compounds HT1 to HT39, but exemplary embodiments of the inventive concepts are not limited thereto:

HT1

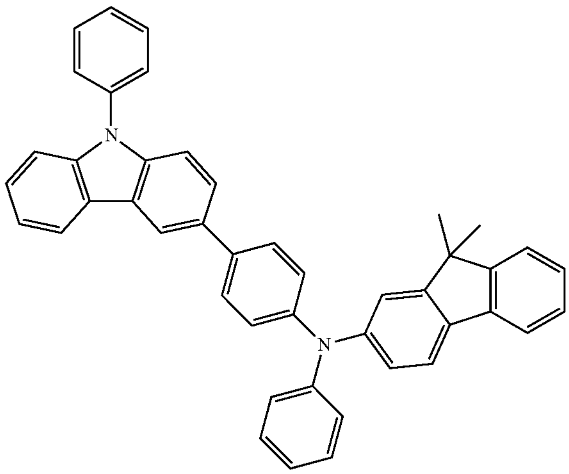

HT2

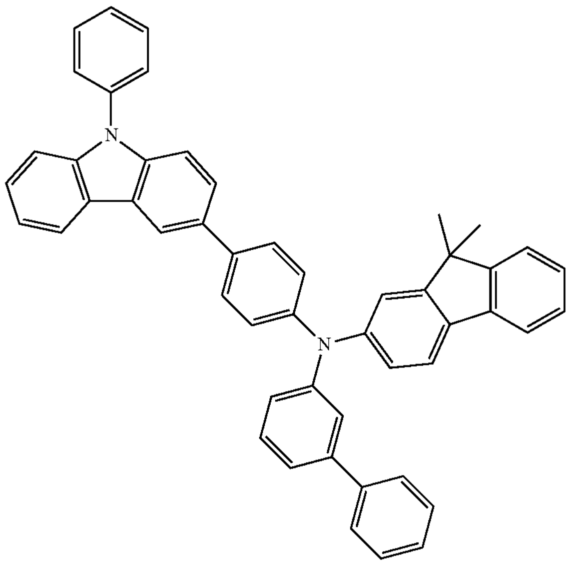

-continued

HT3

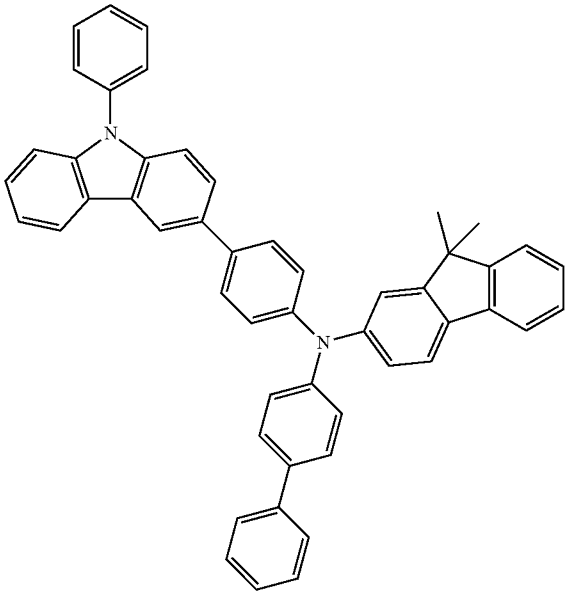

HT4

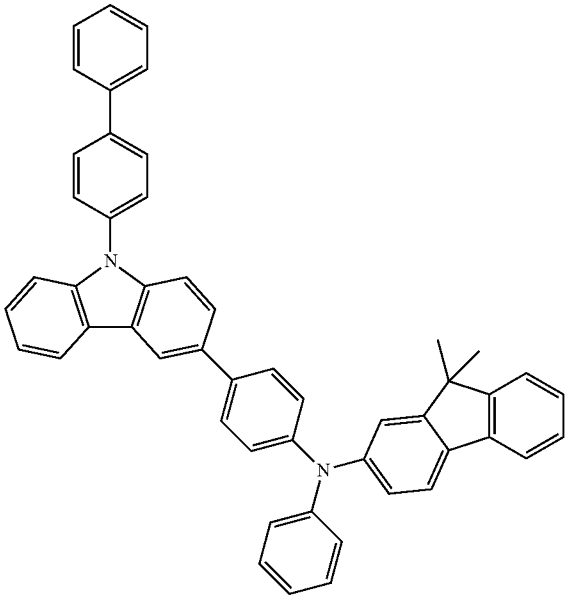

-continued
HT5
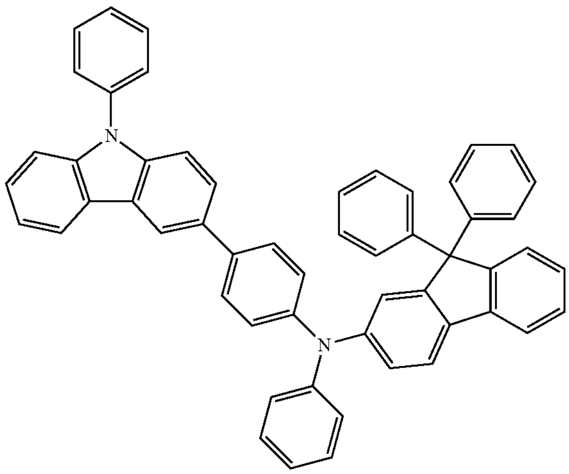
-continued
HT7
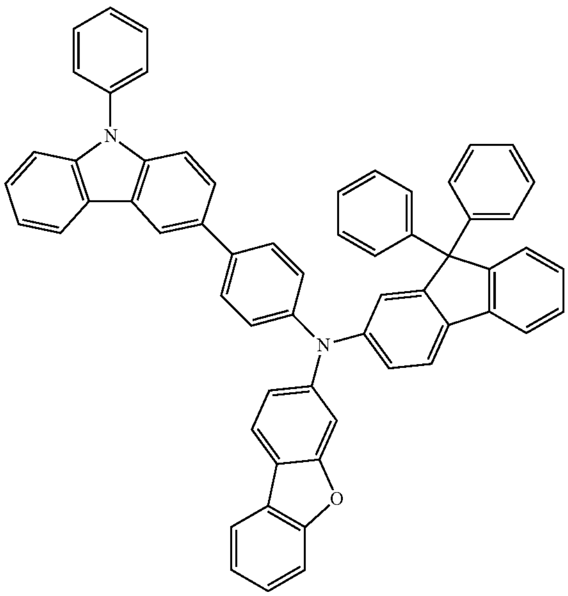
HT6
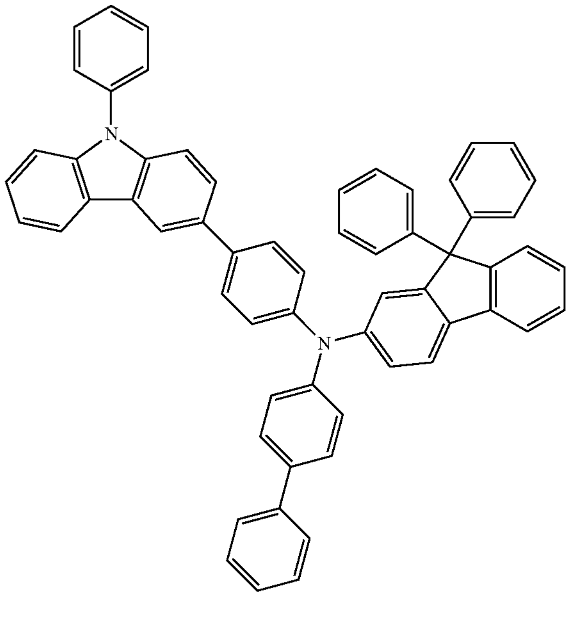
HT8
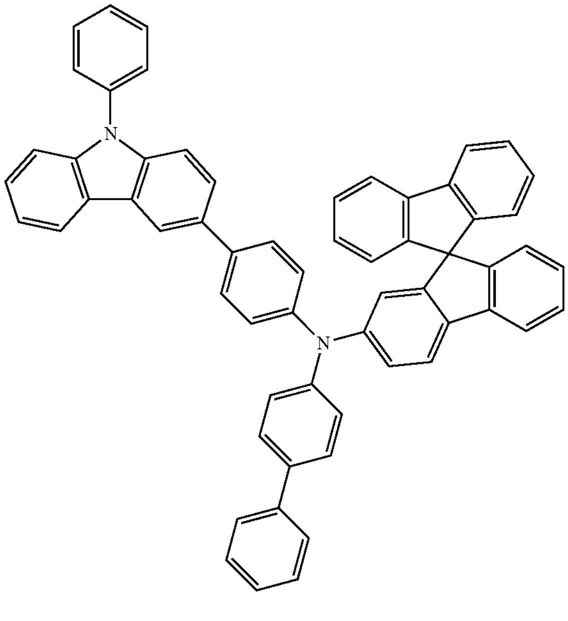

-continued
HT9
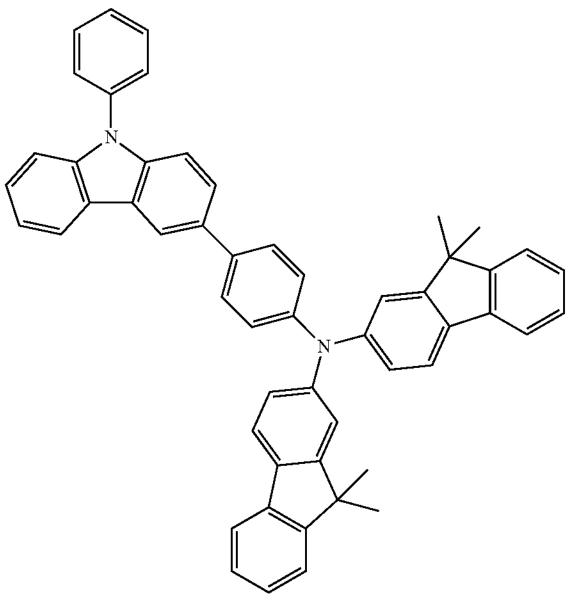
HT10
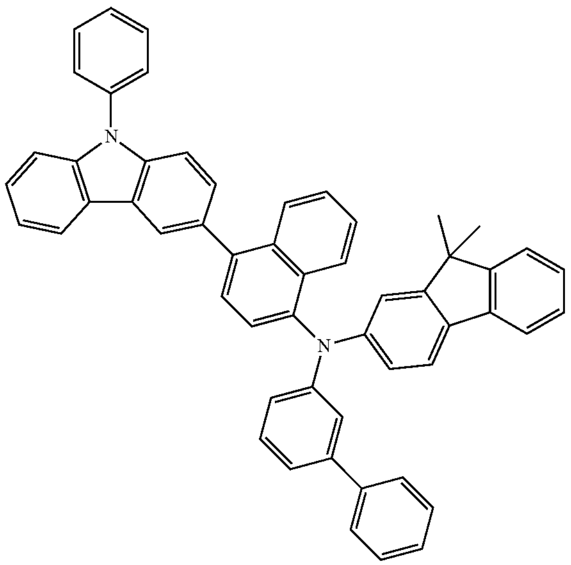
-continued
HT11
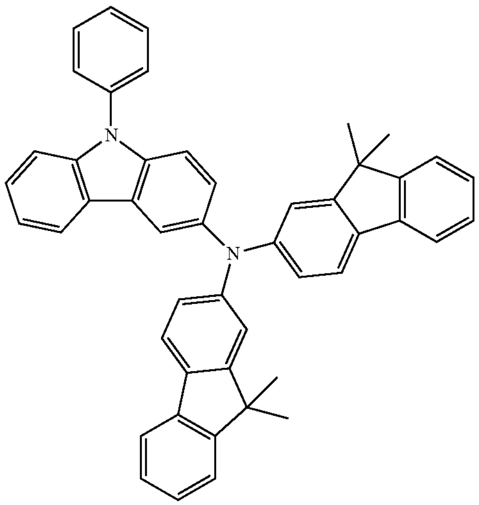
HT12
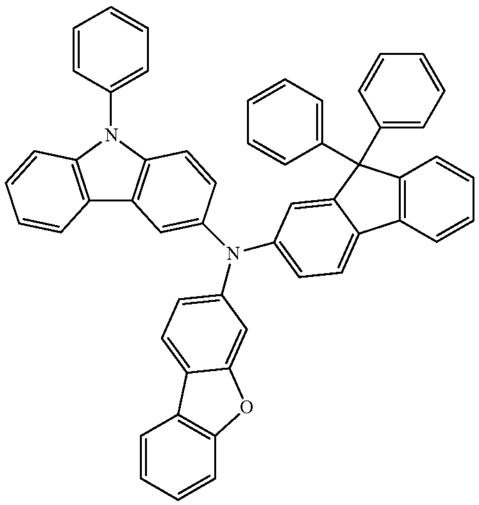
HT13
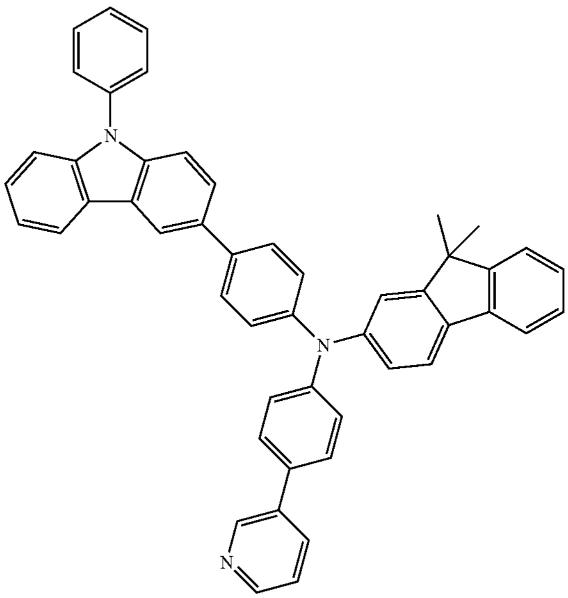

-continued
HT14
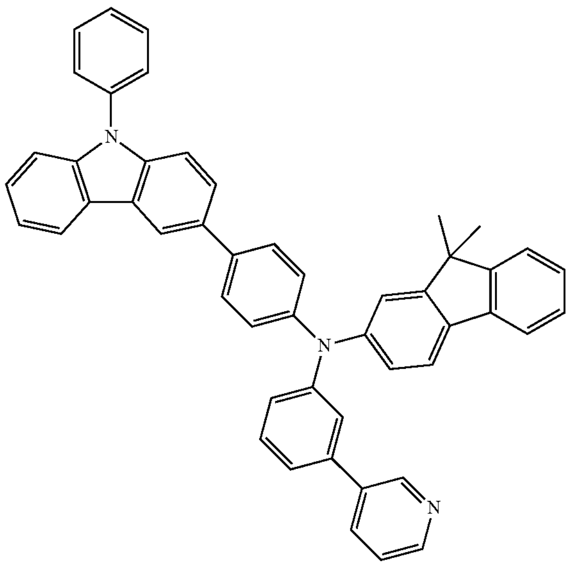
HT15
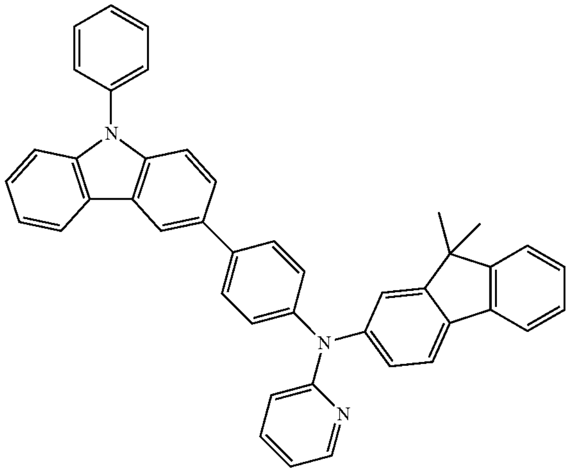
HT16
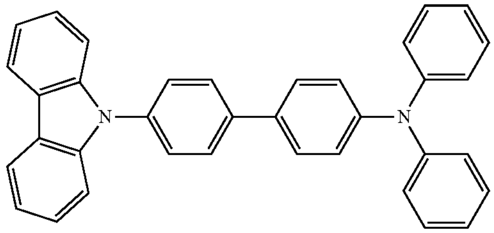
-continued
HT17
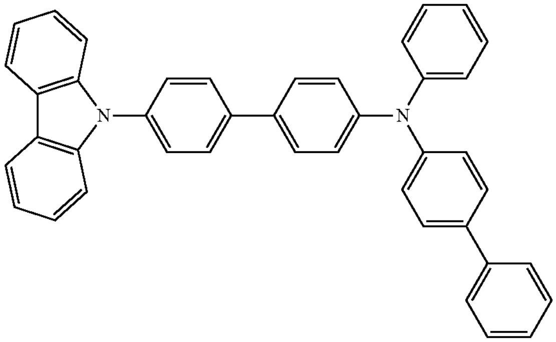
HT18
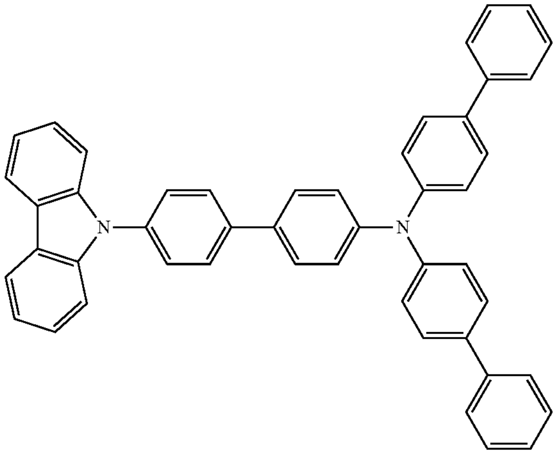
HT19
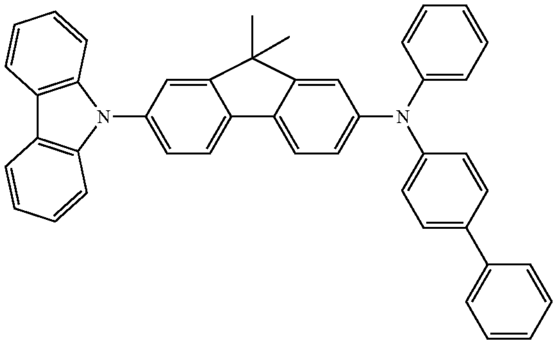

-continued
HT20
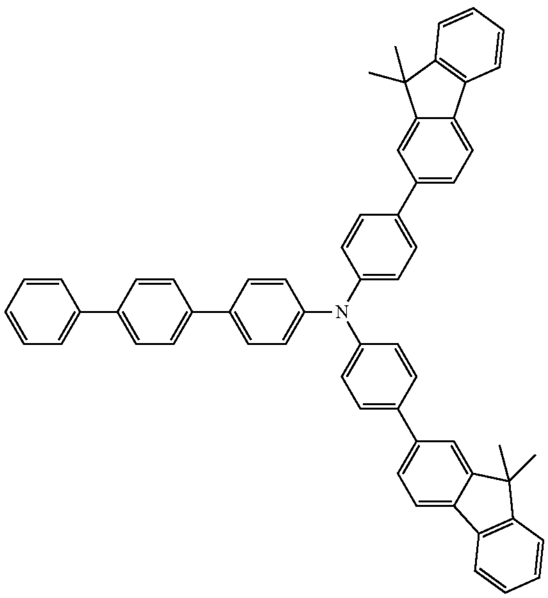
HT21
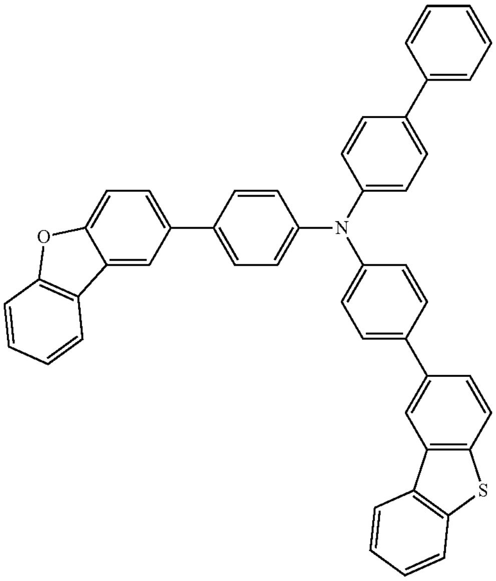
HT22
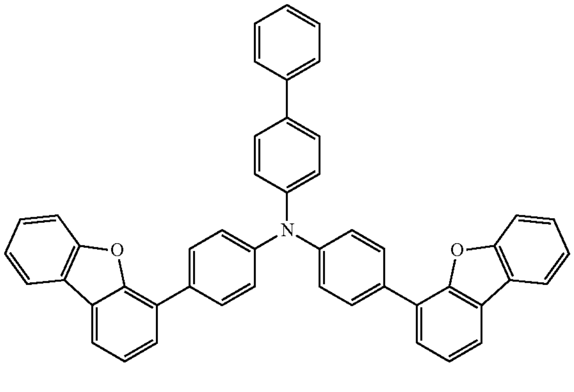
-continued
HT23
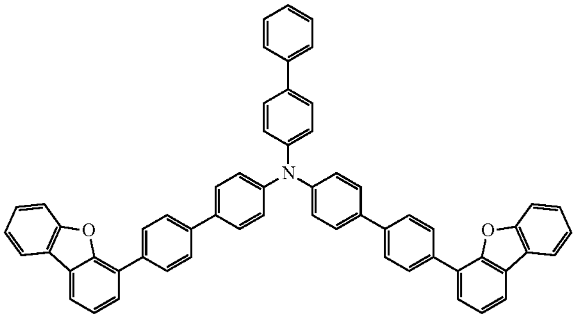
HT24
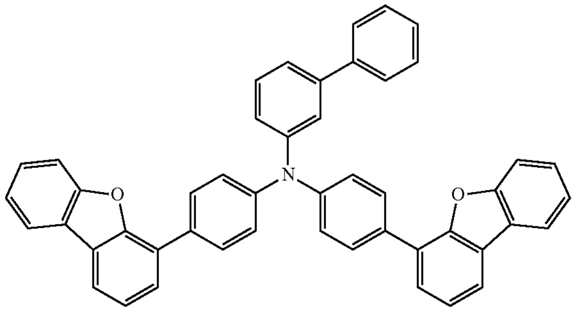
HT25
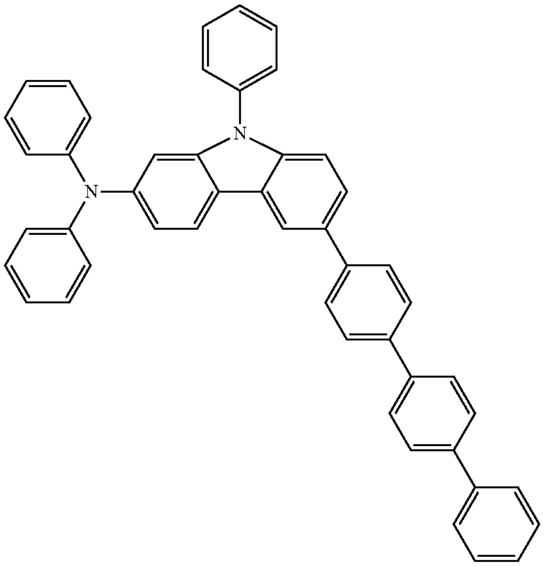

-continued
HT26
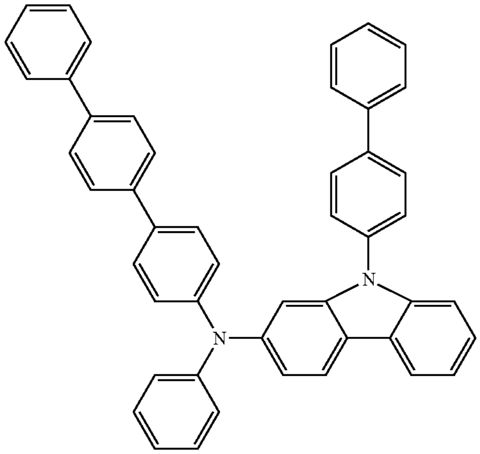
HT27
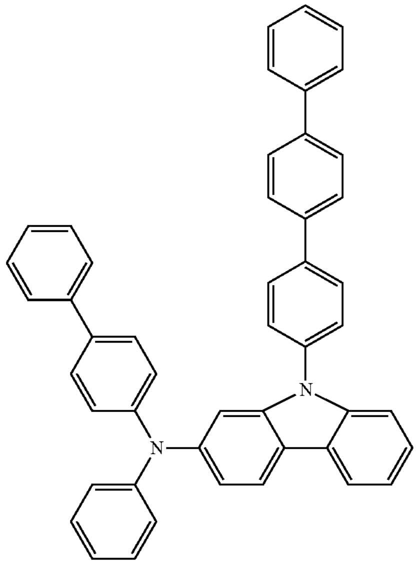
HT28
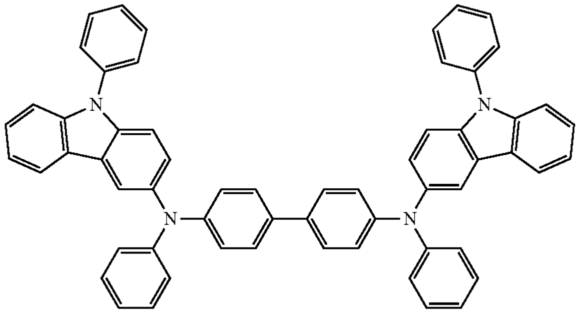
-continued
HT29
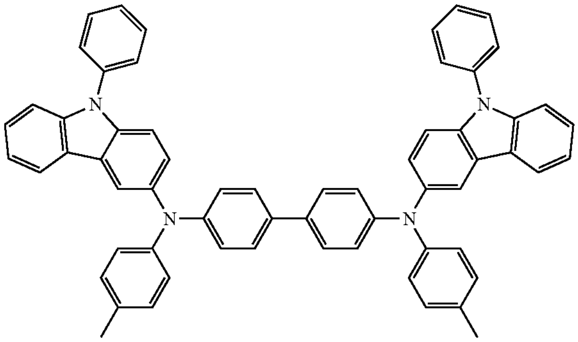
HT30
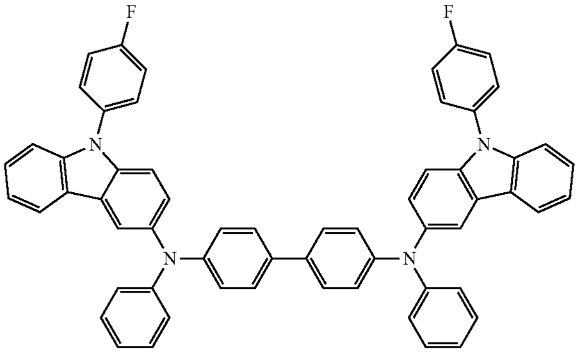
HT31
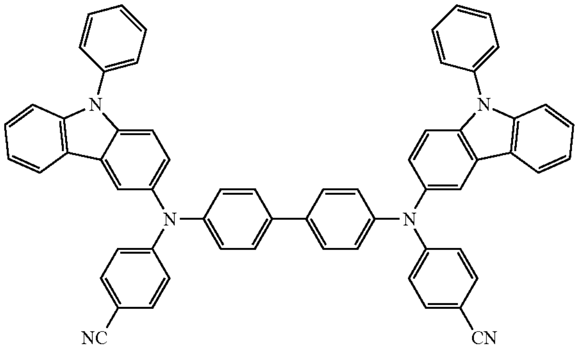
HT32
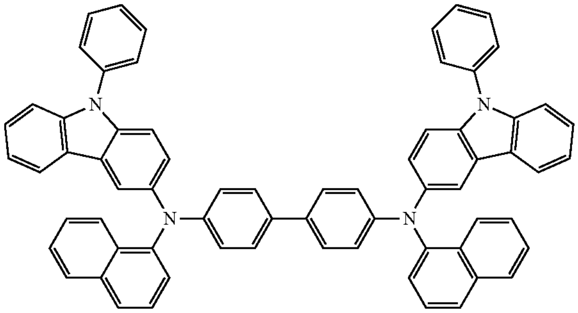

-continued
HT33
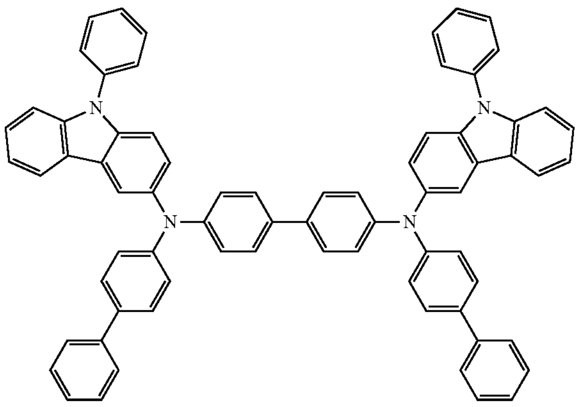
HT34
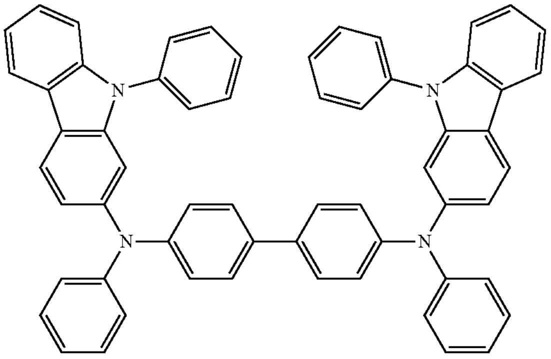
HT35
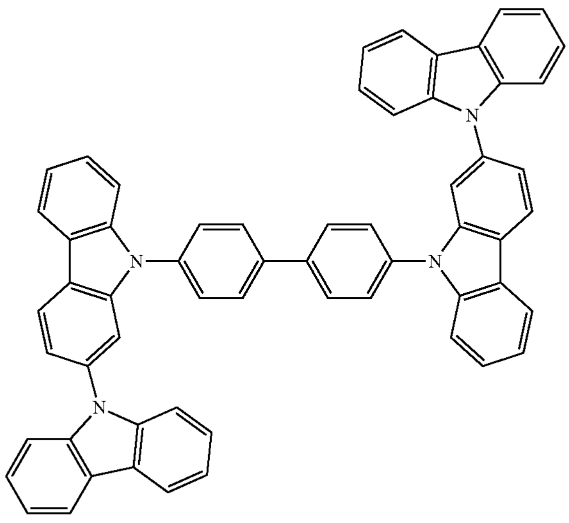
-continued
HT36
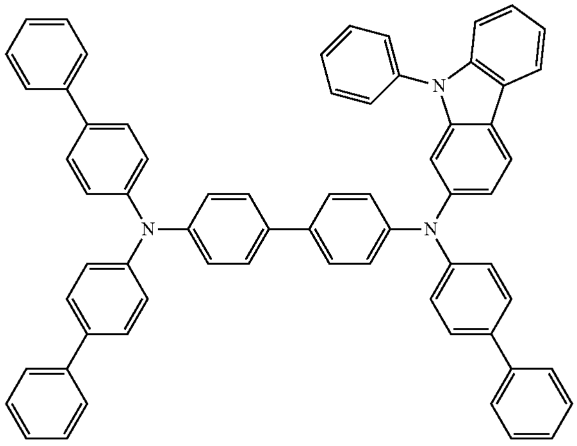
HT37
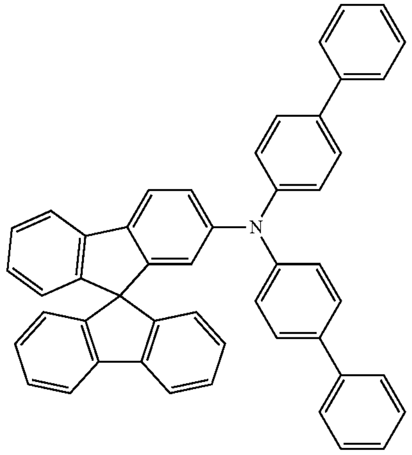
HT38
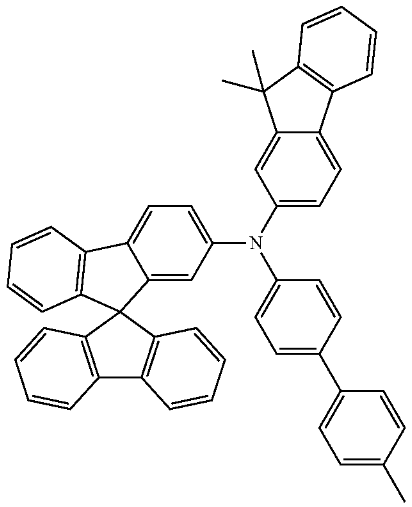

-continued

HT39

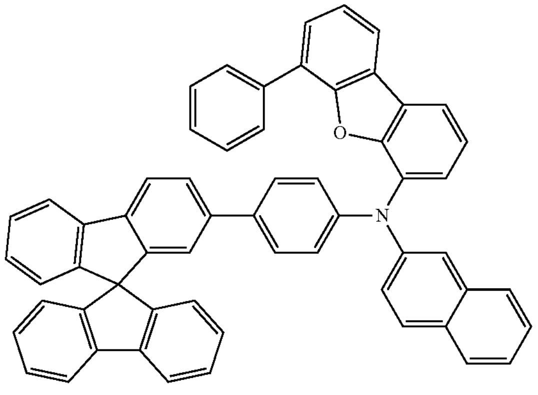

A thickness of the hole transport region may be in a range of about 100 Å to about 10,000 Å, for example, about 100 Å to about 1,000 Å. When the hole transport region includes at least one selected from a hole injection layer and a hole transport layer, the thickness of the hole injection layer may be in a range of about 100 Å to about 9,000 Å, and for example, about 100 Å to about 1,000 Å, and the thickness of the hole transport layer may be in a range of about 50 Å to about 2,000 Å, and for example, about 100 Å to about 1500 Å. When the thicknesses of the hole transport region, the hole injection layer, and the hole transport layer are within these ranges, satisfactory hole transporting characteristics may be obtained without a substantial increase in driving voltage.

The hole transport region may further include, in addition to these materials, a charge-generation material for the improvement of conductive properties. The charge-generation material may be homogeneously or non-homogeneously dispersed in the hole transport region.

The charge-generation material may be, for example, a p-dopant.

In one exemplary embodiment, the p-dopant may have a lowest unoccupied molecular orbital (LUMO) energy level of −3.5 eV or less.

The p-dopant may include at least one selected from a quinone derivative, a metal oxide, and a cyano group-containing compound, but exemplary embodiments of the inventive concepts are not limited thereto.

For example, the p-dopant may include at least one selected from:

a quinone derivative, such as tetracyanoquinodimethane (TCNQ) or 2,3,5,6-tetrafluoro-7,7,8,8-tetracyanoquinodimethane (F4-TCNQ);

a metal oxide, such as tungsten oxide or molybdenum oxide;

1,4,5,8,9,12-hexaazatriphenylene-hexacarbonitrile (HAT-CN); and a compound represented by Formula 221, but exemplary embodiments of the inventive concepts are not limited thereto:

<HAT-CN>

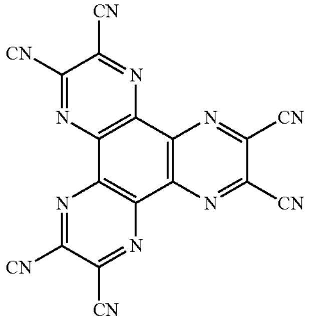

<F4-TCNQ>

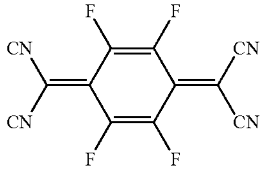

<Formula 221>

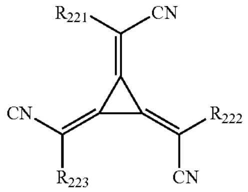

In Formula 221, $R_{221}$ to $R_{223}$ may each independently be selected from a substituted or unsubstituted $C_3$-$C_{10}$ cycloalkyl group, a substituted or unsubstituted $C_1$-$C_{10}$ heterocycloalkyl group, a substituted or unsubstituted $C_3$-$C_{10}$ cycloalkenyl group, a substituted or unsubstituted $C_1$-$C_{10}$ heterocycloalkenyl group, a substituted or unsubstituted $C_6$-$C_{60}$ aryl group, a substituted or unsubstituted $C_1$-$C_{60}$ heteroaryl group, a substituted or unsubstituted monovalent non-aromatic condensed polycyclic group, and a substituted or unsubstituted monovalent non-aromatic condensed heteropolycyclic group, wherein at least one selected from $R_{221}$ to $R_{223}$ may have at least one substituent selected from a cyano group, —F, —Cl, —Br, —I, a $C_1$-$C_{20}$ alkyl group substituted with —F, a $C_1$-$C_{20}$ alkyl group substituted with —Cl, a $C_1$-$C_{20}$ alkyl group substituted with —Br, and a $C_1$-$C_{20}$ alkyl group substituted with —I.

[First Emission Layer 131, Second Emission Layer 132, and First Exciton Quenching Layer 133 in Organic Layer 150]

When the organic light-emitting device 10 is a full-color organic light-emitting device, the first emission layer 131 and the second emission layer 132 may each be patterned into a red emission layer, a green emission layer, or a blue emission layer, according to a sub-pixel. In one or more exemplary embodiments, the first emission layer 131 and the second emission layer 132 may each have a stacked structure of two or more layers selected from a red emission layer, a green emission layer, and a blue emission layer, in which the two or more layers contact each other or are separated from each other. In one or more exemplary embodiments, the emission layer may include two or more materials selected from a red light-emitting material, a green light-emitting material, and a blue light-emitting material, in which the two or more materials are mixed with each other in a single layer to emit white light.

The first emission layer 131 may include a first host and a first dopant, and the second emission layer 132 may include a second host and a second dopant.

An amount of the first dopant in the first emission layer may be in a range of about 0.01 parts by weight to about 50 parts by weight, for example about 0.1 parts by weight to about 30 parts by weight, based on 100 parts by weight of the first host, but exemplary embodiments of the inventive concepts are not limited thereto. In addition, an amount of the second dopant in the second emission layer may be in a range of about 0.01 parts by weight to about 50 parts by weight, for example about 0.1 parts by weight to about 30 parts by weight, based on 100 parts by weight of the second host, but exemplary embodiments of the inventive concepts are not limited thereto.

Thicknesses of the first emission layer 131 and the second emission layer 132 may each be in a range of about 5 nm to about 100 nm, for example, about 10 nm to about 60 nm. When the thicknesses of the first emission layer 131 and the second emission layer 132 are within this range, excellent light-emission characteristics may be obtained without a substantial increase in driving voltage.

The first host and the second host may each independently include a compound represented by Formula 301.

$$[Ar_{301}]_{xb11}-[(L_{301})_{xb1}-R_{301}]_{xb21} \quad \langle\text{Formula 301}\rangle$$

In Formula 301, $Ar_{301}$ may be a substituted or unsubstituted $C_5$-$C_{60}$ carbocyclic group or a substituted or unsubstituted $C_1$-$C_{60}$ heterocyclic group, xb11 may be 1, 2, or 3, $L_{301}$ may be selected from a substituted or unsubstituted $C_3$-$C_{10}$ cycloalkylene group, a substituted or unsubstituted $C_1$-$C_{10}$ heterocycloalkylene group, a substituted or unsubstituted $C_3$-$C_{10}$ cycloalkenylene group, a substituted or unsubstituted $C_1$-$C_{10}$ heterocycloalkenylene group, a substituted or unsubstituted $C_6$-$C_{60}$ arylene group, a substituted or unsubstituted $C_1$-$C_{60}$ heteroarylene group, a substituted or unsubstituted divalent non-aromatic condensed polycyclic group, and a substituted or unsubstituted divalent non-aromatic condensed heteropolycyclic group, xb1 may be an integer from 0 to 5, $R_{301}$ may be selected from deuterium, —F, —Cl, —Br, —I, a hydroxyl group, a cyano group, a nitro group, an amidino group, a hydrazino group, a hydrazono group, a substituted or unsubstituted $C_1$-$C_{60}$ alkyl group, a substituted or unsubstituted $C_2$-$C_{60}$ alkenyl group, a substituted or unsubstituted $C_2$-$C_{60}$ alkynyl group, a substituted or unsubstituted $C_1$-$C_{60}$ alkoxy group, a substituted or unsubstituted $C_3$-$C_{10}$ cycloalkyl group, a substituted or unsubstituted $C_1$-$C_{10}$ heterocycloalkyl group, a substituted or unsubstituted $C_3$-$C_{10}$ cycloalkenyl group, a substituted or unsubstituted $C_1$-$C_{10}$ heterocycloalkenyl group, a substituted or unsubstituted $C_6$-$C_{60}$ aryl group, a substituted or unsubstituted $C_6$-$C_{60}$ aryloxy group, a substituted or unsubstituted $C_6$-$C_{60}$ arylthio group, a substituted or unsubstituted $C_1$-$C_{60}$ heteroaryl group, a substituted or unsubstituted monovalent non-aromatic condensed polycyclic group, a substituted or unsubstituted monovalent non-aromatic condensed heteropolycyclic group, $—Si(Q_{301})(Q_{302})(Q_{303})$, $—N(Q_{301})(Q_{302})$, $—B(Q_{301})(Q_{302})$, $—C(=O)(Q_{301})$, $—S(=O)_2(Q_{301})$, and $—P(=O)(Q_{301})(Q_{302})$, xb21 may be an integer from 1 to 5, and $Q_{301}$ to $Q_{303}$ may each independently be selected from a $C_1$-$C_{10}$ alkyl group, a $C_1$-$C_{10}$ alkoxy group, a phenyl group, a biphenyl group, a terphenyl group, a pentalenyl group, an indenyl group, a naphthyl group, an azulenyl group, a heptalenyl group, an indacenyl group, an acenaphthenyl group, a fluorenyl group, a spiro-bifluorenyl group, a benzofluorenyl group, a dibenzofluorenyl group, a phenalenyl group, a phenanthrenyl group, an anthracenyl group, a fluoranthenyl group, a triphenylenyl group, a pyrenyl group, a chrysenyl group, a naphthacenyl group, a picenyl group, a perylenyl group, a pentaphenyl group, a hexacenyl group, a pentacenyl group, a rubicenyl group, a coronenyl group, an ovalenyl group, a thiophenyl group, a furanyl group, a carbazolyl group, an indolyl group, an isoindolyl group, a benzofuranyl group, a benzothiophenyl group, a dibenzofuranyl group, a dibenzothiophenyl group, a benzocarbazolyl group, a dibenzocarbazolyl group, a dibenzosilolyl group, and a pyridinyl group.

In one exemplary embodiment, $Ar_{301}$ in Formula 301 may be selected from:

a naphthalene group, a fluorene group, a spiro-bifluorene group, a benzofluorene group, a dibenzofluorene group, a phenalene group, a phenanthrene group, an anthracene group, a fluoranthene group, a triphenylene group, a pyrene group, a chrysene group, a naphthacene group, a picene group, a perylene group, a pentaphene group, an indenoanthracene group, a dibenzofuran group, and a dibenzothiophene group; and a naphthalene group, a fluorene group, a spiro-bifluorene group, a benzofluorene group, a dibenzofluorene group, a phenalene group, a phenanthrene group, an anthracene group, a fluoranthene group, a triphenylene group, a pyrene group, a chrysene group, a naphthacene group, a picene group, a perylene group, a pentaphene group, an indenoanthracene group, a dibenzofuran group, and a dibenzothiophene group, each substituted with at least one selected from deuterium, —F, —Cl, —Br, —I, a hydroxyl group, a cyano group, a nitro group, an amidino group, a hydrazino group, a hydrazono group, a $C_1$-$C_{20}$ alkyl group, a $C_1$-$C_{20}$ alkoxy group, a phenyl group, a biphenyl group, a terphenyl group, a naphthyl group, $—Si(Q_{31})(Q_{32})(Q_{33})$, $—N(Q_{31})(Q_{32})$, $—B(Q_{31})(Q_{32})$, $—C(=O)(Q_{31})$, $—S(=O)_2(Q_{31})$, and $—P(=O)(Q_{31})(Q_{32})$, and $Q_{31}$ to $Q_{33}$ may each independently be selected from a $C_1$-$C_{10}$ alkyl group, a $C_1$-$C_{10}$ alkoxy group, a phenyl group, a biphenyl group, a terphenyl group, and a naphthyl group, but exemplary embodiments of the inventive concepts are not limited thereto.

In Formula 301, when xb11 is two or more, two or more $Ar_{301}$(s) may be linked via a single bond.

In one exemplary embodiment, $Ar_{301}$ in Formula 301 may be a carbazolyl group. For example, the compound represented by Formula 301 may be represented by any one of Formulae 301-1 to 301-3:

<Formula 301-1>

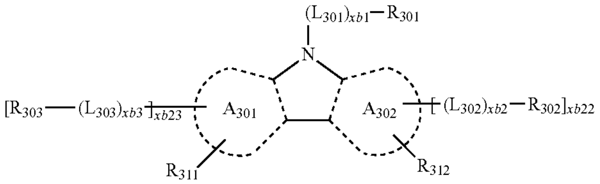

<Formula 301-2>

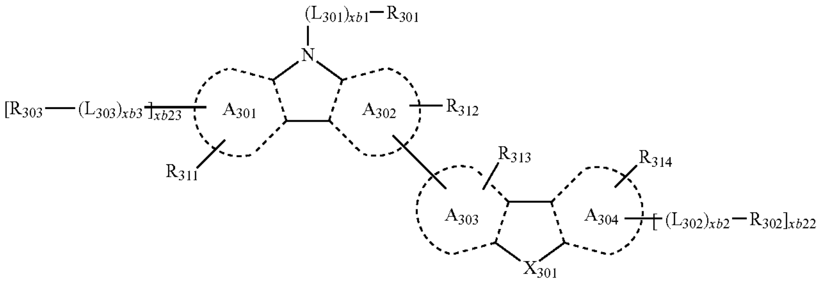

<Formula 301-3>

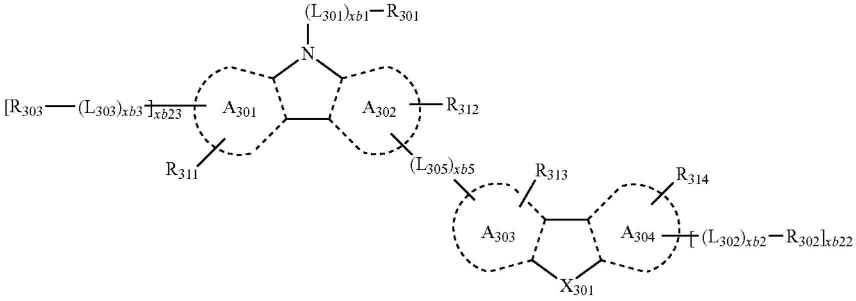

In Formulae 301-1 to 301-3, $A_{301}$ to $A_{304}$ may each independently be selected from a benzene group, a naphthalene group, a phenanthrene group, a fluoranthene group, a triphenylene group, a pyrene group, a chrysene group, a pyridine group, a pyrimidine group, an indene group, a fluorene group, a spiro-bifluorene group, a benzofluorene group, a dibenzofluorene group, an indole group, a carbazole group, a benzocarbazole group, a dibenzocarbazole group, a furan group, a benzofuran group, a dibenzofuran group, a naphthofuran group, a benzonaphthofuran group, a dinaphthofuran group, a thiophene group, a benzothiophene group, a dibenzothiophene group, a naphthothiophene group, a benzonaphthothiophene group, and a dinaphthothiophene group, $X_{301}$ may be O, S, or N-[$(L_{304})_{xb4}$-$R_{304}$], $R_{311}$ to $R_{314}$ may each independently be selected from hydrogen, deuterium, —F, —Cl, —Br, —I, a hydroxyl group, a cyano group, a nitro group, an amidino group, a hydrazino group, a hydrazono group, a $C_1$-$C_{20}$ alkyl group, a $C_1$-$C_{20}$ alkoxy group, a phenyl group, a biphenyl group, a terphenyl group, a naphthyl group, a dibenzofuranyl group, a dibenzothiophenyl group, —SH, —S($Q_{301}$), —Si($Q_{301}$)($Q_{302}$)($Q_{303}$), —N($Q_{301}$)($Q_{302}$), —B($Q_{301}$)($Q_{302}$), —C(═O)($Q_{301}$), —S(═O)$_2$($Q_{301}$), and —P(═O)($Q_{301}$)($Q_{302}$), xb21 to xb24 may each independently be 0, 1, or 2, $L_{301}$ to $L_{305}$ may each independently be selected from a substituted or unsubstituted $C_3$-$C_{10}$ cycloalkylene group, a substituted or unsubstituted $C_1$-$C_{10}$ heterocycloalkylene group, a substituted or unsubstituted $C_3$-$C_{10}$ cycloalkenylene group, a substituted or unsubstituted $C_1$-$C_{10}$ heterocycloalkenylene group, a substituted or unsubstituted $C_6$-$C_{60}$ arylene group, a substituted or unsubstituted $C_1$-$C_{60}$ heteroarylene group, a substituted or unsubstituted divalent non-aromatic condensed polycyclic group, and a substituted or unsubstituted divalent non-aromatic condensed heteropolycyclic group, xb1 to xb4 may each independently be an integer from 0 to 5, xb5 may be an integer from 1 to 5, $R_{301}$ to $R_{304}$ may each independently be selected from deuterium, —F, —Cl, —Br, —I, a hydroxyl group, a cyano group, a nitro group, an amidino group, a hydrazino group, a hydrazono group, a substituted or unsubstituted $C_1$-$C_{60}$ alkyl group, a substituted or unsubstituted $C_2$-$C_{60}$ alkenyl group, a substituted or unsubstituted $C_2$-$C_{60}$ alkynyl group, a substituted or unsubstituted $C_1$-$C_{60}$ alkoxy group, a substituted or unsubstituted $C_3$-$C_{10}$ cycloalkyl group, a substituted or unsubstituted $C_1$-$C_{10}$ heterocycloalkyl group, a substituted or unsubstituted $C_3$-$C_{10}$ cycloalkenyl group, a substituted or unsubstituted $C_1$-$C_{10}$ heterocycloalkenyl group, a substituted or unsubstituted $C_6$-$C_{60}$ aryl group, a substituted or unsubstituted $C_6$-$C_{60}$ aryloxy group, a substituted or unsubstituted $C_6$-$C_{60}$ arylthio group, a substituted or unsubstituted $C_1$-$C_{60}$ heteroaryl group, a substituted or unsubstituted monovalent non-aromatic condensed polycyclic group, a substituted or unsubstituted monovalent non-aromatic condensed heteropolycyclic group, —Si($Q_{301}$)($Q_{302}$)($Q_{303}$), —N($Q_{301}$)($Q_{302}$), —B($Q_{301}$)($Q_{302}$), —C(═O)($Q_{301}$), —S(═O)$_2$($Q_{301}$), and —P(═O)($Q_{301}$)($Q_{302}$), and $Q_{301}$ to $Q_{303}$ may each independently be selected from a $C_1$-$C_{10}$ alkyl group, a $C_1$-$C_{10}$ alkoxy group, a phenyl group, a biphenyl group, a terphenyl group, a pentalenyl group, an indenyl group, a naphthyl group, an azulenyl group, a heptalenyl group, an indacenyl group, an acenaphthenyl group, a fluorenyl group, a spiro-bifluorenyl group, a benzofluorenyl group, a dibenzofluorenyl group, a phenalenyl group, a phenanthrenyl group, an anthracenyl group, a fluoranthenyl group, a triphenylenyl group, a pyrenyl group, a chrysenyl group, a naphthacenyl group, a picenyl group, a perylenyl group, a pentaphenyl group, a hexacenyl group, a pentacenyl group, a rubicenyl group, a coronenyl group, an ovalenyl group, a thiophenyl group, a furanyl group, a carbazolyl group, an indolyl group, an isoindolyl group, a benzofuranyl group, a benzothiophenyl group, a dibenzofuranyl group, a dibenzothiophenyl group, a benzocarbazolyl group, a dibenzocarbazolyl group, a dibenzosilolyl group, and a pyridinyl group.

In one exemplary embodiment, $Ar_{301}$ in Formula 301 may be a fluorene or a spiro-bifluorene. For example, the compound represented by Formula 301 may be represented by Formula 301-4 or 301-5:

<Formula 301-4>

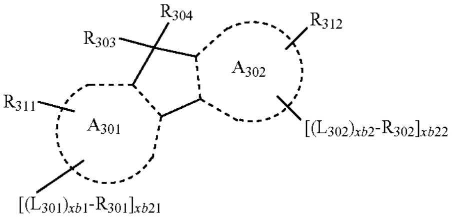

<Formula 301-5>

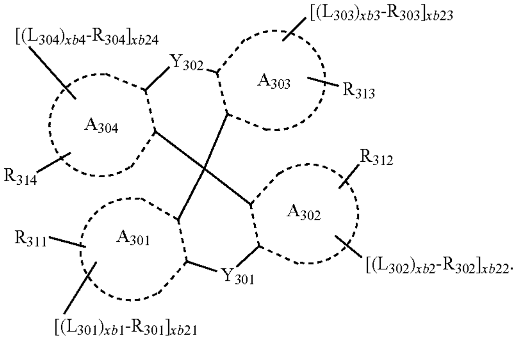

In Formulae 301-4 and 301-5, $Y_{301}$ and $Y_{302}$ may each independently be selected from a single bond, O, S, N-[$(L_{305})_{xb5}$-$R_{305}$], or S(=O)$_2$, and xb5 may be an integer from 1 to 5, $A_{301}$ to $A_{304}$, $R_{311}$ to $R_{314}$, xb21 to xb24, $L_{301}$ to $L_{304}$, xb1 to xb4, and $R_{301}$ to $R_{304}$ may each independently be the same as described herein, $L_{305}$ may be the same as defined in connection with $L_{301}$ to $L_{304}$, and $R_{305}$ may be the same as defined in connection with $R_{301}$ to $R_{304}$.

In one exemplary embodiment, $R_{301}$ in Formula 301 may be amine, for example, —N($Q_{301}$)($Q_{302}$). For example, the compound represented by Formula 301 may be represented by Formula 301-6:

<Formula 301-6>

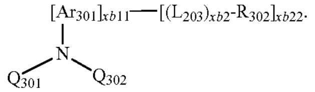

In Formula 301-6, $Ar_{301}$, xb11, $L_{302}$, xb2, $R_{302}$, xb22, $Q_{301}$, and $Q_{302}$ may each independently be the same as described herein.

In one exemplary embodiment, $Ar_{301}$ in Formula 301 may be a pyridine, a pyrimidine, or a triazine. For example, the compound represented by Formula 301 may be represented by Formula 301-7:

<Formula 301-7>

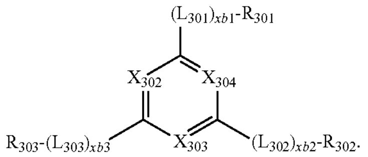

In Formula 301-7, $X_{302}$ may be N or C($R_{311}$), $X_{303}$ may be N or C($R_{312}$), $X_{304}$ may be N or C($R_{313}$), and at least one selected from $X_{302}$ to $X_{304}$ may be N, $R_{311}$ to $R_{313}$ may each independently be selected from hydrogen, deuterium, —F, —Cl, —Br, —I, a hydroxyl group, a cyano group, a nitro group, an amidino group, a hydrazino group, a hydrazono group, a $C_1$-$C_{20}$ alkyl group, a $C_1$-$C_{20}$ alkoxy group, a phenyl group, a biphenyl group, a terphenyl group, a naphthyl group, a dibenzofuranyl group, a dibenzothiophenyl group, —SH, —S($Q_{301}$), —Si($Q_{301}$)($Q_{302}$)($Q_{303}$), —N($Q_{301}$)($Q_{302}$), —B($Q_{301}$)($Q_{302}$), —C(=O)($Q_{301}$), —S(=O)$_2$($Q_{301}$), and —P(=O)($Q_{301}$)($Q_{302}$), two or more neighboring substituents selected from $R_{301}$ to $R_{303}$ and $R_{311}$ to $R_{313}$ may optionally be linked to form a substituted or unsubstituted $C_5$-$C_{60}$ carbocyclic group or a substituted or unsubstituted $C_1$-$C_{60}$ heterocyclic group, and $L_{301}$ to $L_{303}$, xb1 to xb3, and $R_{301}$ to $R_{303}$ may each independently be the same as described herein.

In one exemplary embodiment, $Ar_{301}$ in Formula 301 may be a phenanthroline. For example, the compound represented by Formula 301 may be represented by Formula 301-8:

<Formula 301-8>

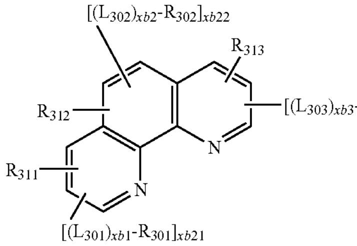

In Formula 301-8, $R_{311}$ to $R_{313}$, xb21 to xb23, $L_{301}$ to $L_{303}$, xb1 to xb3, and $R_{301}$ to $R_{303}$ may each independently be the same as described herein.

In one exemplary embodiment, $Ar_{301}$ in Formula 301 may be a diazole or a triazole. For example, the compound represented by Formula 301 may be represented by Formula 301-9:

<Formula 301-9>

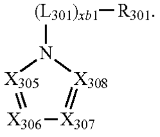

In Formula 301-9, $X_{305}$ may be N or $C(R_{311})$, $X_{306}$ may be N or $C(R_{312})$, $X_{307}$ may be N or $C(R_{313})$, and $X_{308}$ may be N or $C(R_{314})$, wherein at least one selected from $X_{305}$ to $X_{308}$ may be N, $R_{311}$ to $R_{314}$ may each independently be selected from hydrogen, deuterium, —F, —Cl, —Br, —I, a hydroxyl group, a cyano group, a nitro group, an amidino group, a hydrazino group, a hydrazono group, a $C_1$-$C_{20}$ alkyl group, a $C_1$-$C_{20}$ alkoxy group, a phenyl group, a biphenyl group, a terphenyl group, a naphthyl group, a dibenzofuranyl group, a dibenzothiophenyl group, —SH, —$S(Q_{301})$, —$Si(Q_{301})(Q_{302})(Q_{303})$, —$N(Q_{301})(Q_{302})$, —$B(Q_{301})(Q_{302})$, —$C(=O)(Q_{301})$, —$S(=O)_2(Q_{301})$, and —$P(=O)(Q_{301})(Q_{302})$; or two or more neighboring substituents selected from $R_{311}$ to $R_{314}$ may optionally be linked to form a substituted or unsubstituted $C_5$-$C_{60}$ carbocyclic group or a substituted or unsubstituted $C_1$-$C_{60}$ heterocyclic group, and $L_{301}$, xb1, and $R_{301}$ are the same as described above.

For example, $L_{301}$ to $L_{305}$ may each independently be selected from:

a phenylene group, a naphthylene group, a fluorenylene group, a spiro-bifluorenylene group, a benzofluorenylene group, a dibenzofluorenylene group, a phenanthrenylene group, an anthracenylene group, a fluoranthenylene group, a triphenylenylene group, a pyrenylene group, a chrysenylene group, a perylenylene group, a pentaphenylene group, a hexacenylene group, a pentacenylene group, a thiophenylene group, a furanylene group, a carbazolylene group, an indolylene group, an isoindolylene group, a benzofuranylene group, a benzothiophenylene group, a dibenzofuranylene group, a dibenzothiophenylene group, a benzocarbazolylene group, a dibenzocarbazolylene group, a dibenzosilolylene group, a pyridinylene group, an imidazolylene group, a pyrazolylene group, a thiazolylene group, an isothiazolylene group, an oxazolylene group, an isoxazolylene group, a thiadiazolylene group, an oxadiazolylene group, a pyrazinylene group, a pyrimidinylene group, a pyridazinylene group, a triazinylene group, a quinolinylene group, an isoquinolinylene group, a benzoquinolinylene group, a phthalazinylene group, a naphthyridinylene group, a quinoxalinylene group, a quinazolinylene group, a cinnolinylene group, a phenanthridinylene group, an acridinylene group, a phenanthrolinylene group, a phenazinylene group, a benzimidazolylene group, an isobenzothiazolylene group, a benzoxazolylene group, an isobenzoxazolylene group, a triazolylene group, a tetrazolylene group, an imidazopyridinylene group, an imidazopyrimidinylene group, and an azacarbazolylene group; and a phenylene group, a naphthylene group, a fluorenylene group, a spiro-bifluorenylene group, a benzofluorenylene group, a dibenzofluorenylene group, a phenanthrenylene group, an anthracenylene group, a fluoranthenylene group, a triphenylenylene group, a pyrenylene group, a chrysenylene group, a perylenylene group, a pentaphenylene group, a hexacenylene group, a pentacenylene group, a thiophenylene group, a furanylene group, a carbazolylene group, an indolylene group, an isoindolylene group, a benzofuranylene group, a benzothiophenylene group, a dibenzofuranylene group, a dibenzothiophenylene group, a benzocarbazolylene group, a dibenzocarbazolylene group, a dibenzosilolylene group, a pyridinylene group, an imidazolylene group, a pyrazolylene group, a thiazolylene group, an isothiazolylene group, an oxazolylene group, an isoxazolylene group, a thiadiazolylene group, an oxadiazolylene group, a pyrazinylene group, a pyrimidinylene group, a pyridazinylene group, a triazinylene group, a quinolinylene group, an isoquinolinylene group, a benzoquinolinylene group, a phthalazinylene group, a naphthyridinylene group, a quinoxalinylene group, a quinazolinylene group, a cinnolinylene group, a phenanthridinylene group, an acridinylene group, a phenanthrolinylene group, a phenazinylene group, a benzimidazolylene group, an isobenzothiazolylene group, a benzoxazolylene group, an isobenzoxazolylene group, a triazolylene group, a tetrazolylene group, an imidazopyridinylene group, an imidazopyrimidinylene group, and an azacarbazolylene group, each substituted with at least one selected from deuterium, —F, —Cl, —Br, —I, a hydroxyl group, a cyano group, a nitro group, an amidino group, a hydrazino group, a hydrazono group, a $C_1$-$C_{20}$ alkyl group, a $C_1$-$C_{20}$ alkoxy group, a phenyl group, a biphenyl group, a terphenyl group, a naphthyl group, a fluorenyl group, a spiro-bifluorenyl group, a benzofluorenyl group, a dibenzofluorenyl group, a phenanthrenyl group, an anthracenyl group, a fluoranthenyl group, a triphenylenyl group, a pyrenyl group, a chrysenyl group, a perylenyl group, a pentaphenyl group, a hexacenyl group, a pentacenyl group, a thiophenyl group, a furanyl group, a carbazolyl group, an indolyl group, an isoindolyl group, a benzofuranyl group, a benzothiophenyl group, a dibenzofuranyl group, a dibenzothiophenyl group, a benzocarbazolyl group, a dibenzocarbazolyl group, a dibenzosilolyl group, a pyridinyl group, an imidazolyl group, a pyrazolyl group, a thiazolyl group, an isothiazolyl group, an oxazolyl group, an isoxazolyl group, a thiadiazolyl group, an oxadiazolyl group, a pyrazinyl group, a pyrimidinyl group, a pyridazinyl group, a triazinyl group, a quinolinyl group, an isoquinolinyl group, a benzoquinolinyl group, a phthalazinyl group, a naphthyridinyl group, a quinoxalinyl group, a quinazolinyl group, a cinnolinyl group, a phenanthridinyl group, an acridinyl group, a phenanthrolinyl group, a phenazinyl group, a benzimidazolyl group, an isobenzothiazolyl group, a benzoxazolyl group, an isobenzoxazolyl group, a triazolyl group, a tetrazolyl group, an imidazopyridinyl group, an imidazopyrimidinyl group, an azacarbazolyl group, —$Si(Q_{31})(Q_{32})(Q_{33})$, —$N(Q_{31})(Q_{32})$, —$B(Q_{31})(Q_{32})$, —$C(=O)(Q_{31})$, —$S(=O)_2(Q_{31})$, and —$P(=O)(Q_{31})(Q_{32})$, and $Q_{31}$ to $Q_{33}$ are the same as described above.

In one exemplary embodiment, $R_{301}$ to $R_{304}$ may each independently be selected from:

a phenyl group, a biphenyl group, a terphenyl group, a naphthyl group, a fluorenyl group, a spiro-bifluorenyl group, a benzofluorenyl group, a dibenzofluorenyl group, a phenanthrenyl group, an anthracenyl group, a fluoranthenyl group, a triphenylenyl group, a pyrenyl group, a chrysenyl group, a perylenyl group, a pentaphenyl group, a hexacenyl group, a pentacenyl group, a thiophenyl group, a furanyl group, a carbazolyl group, an indolyl group, an isoindolyl group, a benzofuranyl group, a benzothiophenyl group, a dibenzofuranyl group, a dibenzothiophenyl group, a benzocarbazolyl group, a dibenzocarbazolyl group, a dibenzosilolyl group, a pyridinyl group, an imidazolyl group, a pyrazolyl group, a thiazolyl group, an isothiazolyl group, an oxazolyl group, an isoxazolyl group, a thiadiazolyl group, an oxadiazolyl group, a pyrazinyl group, a pyrimidinyl group, a pyridazinyl group, a triazinyl group, a quinolinyl group, an isoquinolinyl group, a benzoquinolinyl group, a phthalazinyl group, a naphthyridinyl group, a quinoxalinyl group, a quinazolinyl group, a cinnolinyl group, a phenanthridinyl group, an acridinyl group, a phenanthrolinyl group, a phenazinyl group, a benzimidazolyl group, an isobenzothiazolyl group, a benzoxazolyl group, an isobenzoxazolyl group, a triazolyl group, a tetrazolyl group, an imidazopyridinyl group, an imidazopyrimidinyl group, and an azacarbazolyl group; and a phenyl group, a biphenyl group, a terphenyl group, a naphthyl group, a fluorenyl group, a spiro-bifluorenyl group, a benzofluorenyl group, a dibenzofluorenyl group, a phenanthrenyl group, an anthracenyl group, a fluoranthenyl group, a triphenylenyl group, a pyrenyl group, a chrysenyl group, a perylenyl group, a pentaphenyl group, a hexacenyl group, a pentacenyl group, a thiophenyl group, a furanyl group, a carbazolyl group, an indolyl group, an isoindolyl group, a benzofuranyl group, a benzothiophenyl group, a dibenzofuranyl group, a dibenzothiophenyl group, a benzocarbazolyl group, a dibenzocarbazolyl group, a dibenzosilolyl group, a pyridinyl group, an imidazolyl group, a pyrazolyl group, a thiazolyl group, an isothiazolyl group, an oxazolyl group, an isoxazolyl group, a thiadiazolyl group, an oxadiazolyl group, a pyrazinyl group, a pyrimidinyl group, a pyridazinyl group, a triazinyl group, a quinolinyl group, an isoquinolinyl group, a benzoquinolinyl group, a phthalazinyl group, a naphthyridinyl group, a quinoxalinyl group, a quinazolinyl group, a cinnolinyl group, a phenanthridinyl group, an acridinyl group, a phenanthrolinyl group, a phenazinyl group, a benzimidazolyl group, an isobenzothiazolyl group, a benzoxazolyl group, an isobenzoxazolyl group, a triazolyl group, a tetrazolyl group, an imidazopyridinyl group, an imidazopyrimidinyl group, and an azacarbazolyl group, each substituted with at least one selected from deuterium, —F, —Cl, —Br, —I, a hydroxyl group, a cyano group, a nitro group, an amidino group, a hydrazino group, a hydrazono group, a $C_1$-$C_{20}$ alkyl group, a $C_1$-$C_{20}$ alkoxy group, a phenyl group, a biphenyl group, a terphenyl group, a naphthyl group, a fluorenyl group, a spiro-bifluorenyl group, a benzofluorenyl group, a dibenzofluorenyl group, a phenanthrenyl group, an anthracenyl group, a fluoranthenyl group, a triphenylenyl group, a pyrenyl group, a chrysenyl group, a perylenyl group, a pentaphenyl group, a hexacenyl group, a pentacenyl group, a thiophenyl group, a furanyl group, a carbazolyl group, an indolyl group, an isoindolyl group, a benzofuranyl group, a benzothiophenyl group, a dibenzofuranyl group, a dibenzothiophenyl group, a benzocarbazolyl group, a dibenzocarbazolyl group, a dibenzosilolyl group, a pyridinyl group, an imidazolyl group, a pyrazolyl group, a thiazolyl group, an isothiazolyl group, an oxazolyl group, an isoxazolyl group, a thiadiazolyl group, an oxadiazolyl group, a pyrazinyl group, a pyrimidinyl group, a pyridazinyl group, a triazinyl group, a quinolinyl group, an isoquinolinyl group, a benzoquinolinyl group, a phthalazinyl group, a naphthyridinyl group, a quinoxalinyl group, a quinazolinyl group, a cinnolinyl group, a phenanthridinyl group, an acridinyl group, a phenanthrolinyl group, a phenazinyl group, a benzimidazolyl group, an isobenzothiazolyl group, a benzoxazolyl group, an isobenzoxazolyl group, a triazolyl group, a tetrazolyl group, an imidazopyridinyl group, an imidazopyrimidinyl group, an azacarbazolyl group, $—Si(Q_{31})(Q_{32})(Q_{33})$, $—N(Q_{31})(Q_{32})$, $—B(Q_{31})(Q_{32})$, $—C(=O)(Q_{31})$, $—S(=O)_2(Q_{31})$, and $—P(=O)(Q_{31})(Q_{32})$, and $Q_{31}$ to $Q_{33}$ are the same as described above.

For example, the first host and the second host may each independently include at least one selected from Compounds H101 to H119:

H101

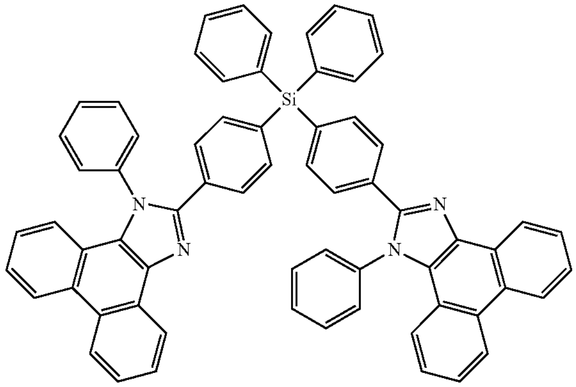

H102

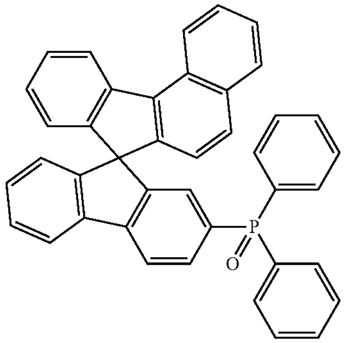

-continued
H103
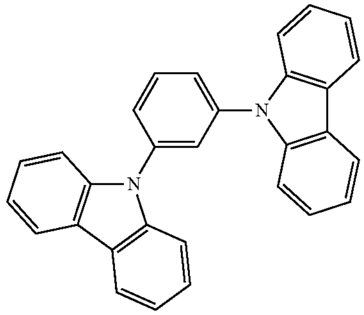
H104
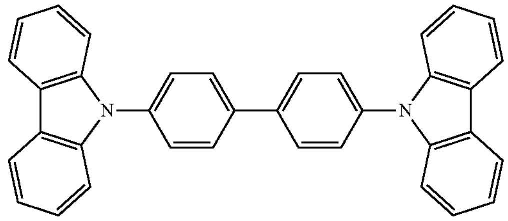
H105
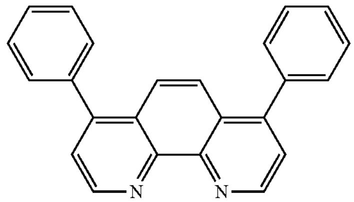
H106
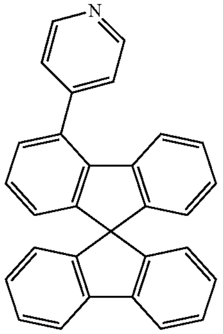
H107
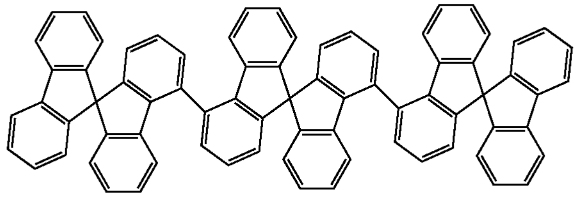
H108
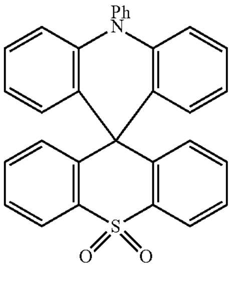
-continued
H109
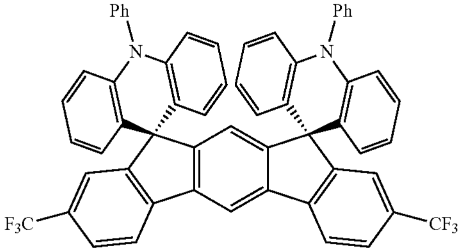
H110
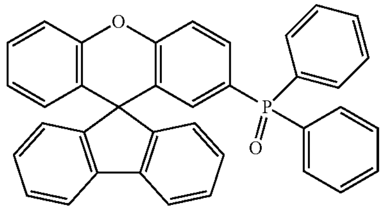
H111
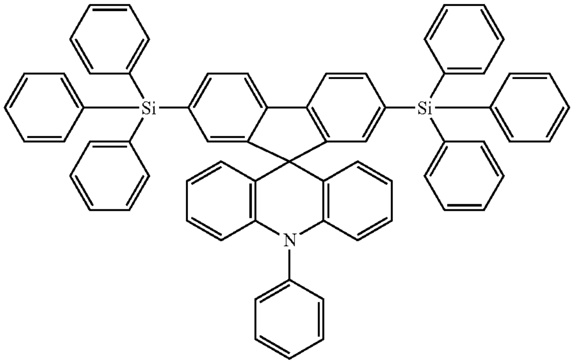
H112
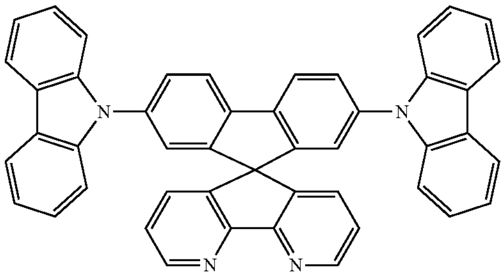
H113
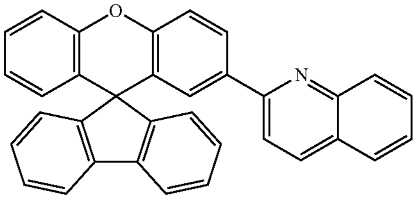
H114
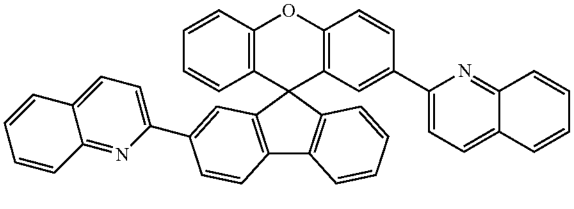

-continued

H115

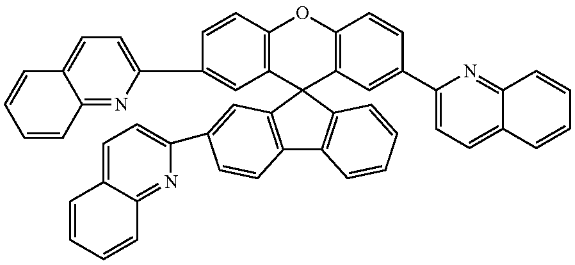

H116

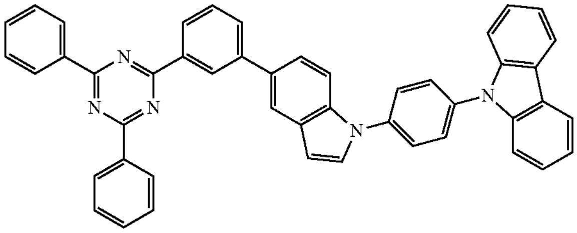

H117

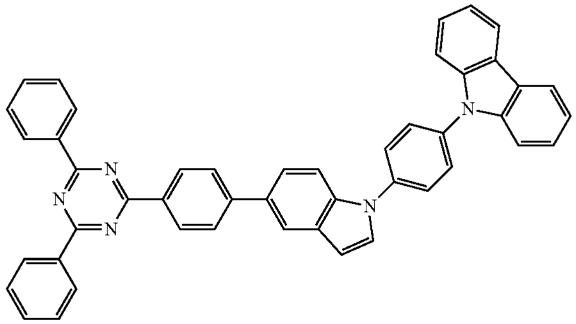

H118

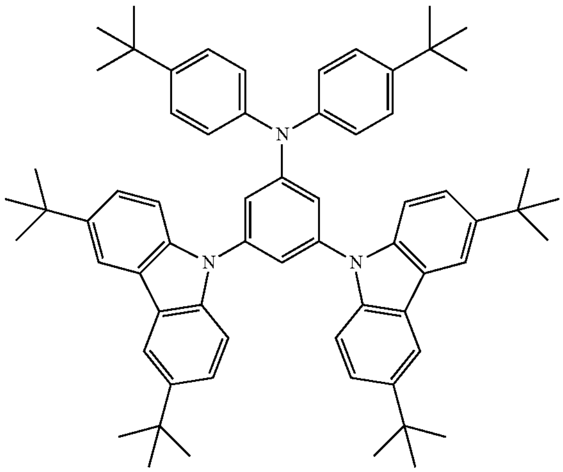

-continued

H119

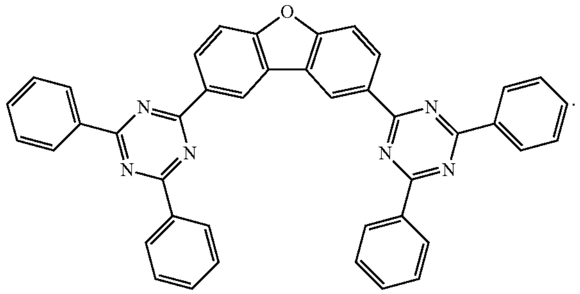

In one exemplary embodiment, the first host and the second host may each independently include at least one selected from a hole transport host including no electron transport moiety and an electron transport host including at least one electron transport moiety.

For example, the first host may include at least one selected from a first hole transport host including no electron transport moiety and a first electron transport host including at least one electron transport moiety, and the second host may include at least one selected from a second hole transport host including no electron transport moiety and a second electron transport host including at least one electron transport moiety.

In one exemplary embodiment, the first host may include a first hole transport host including no electron transport moiety and a first electron transport host including at least one electron transport moiety, and the second host may include a second hole transport host including no electron transport moiety and a second electron transport host including at least one electron transport moiety.

The term "electron transport moiety" as used herein may include a cyano group, a phosphine oxide group, a sulfone oxide group, a sulfonate group, and/or a π electron-depleted nitrogen-containing cyclic group.

The term "π electron-depleted nitrogen-containing cyclic group" as used herein indicates a cyclic group having at least one *—N═*' moiety, and examples thereof include a pyridine group, a pyrimidine group, a triazine group, and the like.

For example, the first hole transport host and the second hole transport host may each independently be a compound represented by one selected from Formulae 301-1 to 301-6.

In one or more exemplary embodiments, the first electron transport host and the second electron transport host may each independently be a compound represented by one selected from Formulae 301-7 to 301-9.

In one or more exemplary embodiments, the first host and the second host may each independently include an alkaline earth-metal complex. For example, the first host and the second host may each be independently be selected from a Be complex (for example, Compound H55), a Mg complex, and a Zn complex.

In one or more exemplary embodiments, the first electron transport host and the second electron transport host may each independently include at least one selected from 9,10-di(2-naphthyl)anthracene (ADN), 2-methyl-9,10-bis(naphthalen-2-yl)anthracene (MADN), 9,10-di-(2-naphthyl)-2-t-butyl-anthracene (TBADN), 4,4'-bis(N-carbazolyl)-1,1'-biphenyl (CBP), 1,3-di-9-carbazolylbenzene (mCP), 1,3,5-tri(carbazol-9-yl)benzene (TCP), and Compounds H1 to H55, but exemplary embodiments of the inventive concepts are not limited thereto:

-continued
H1
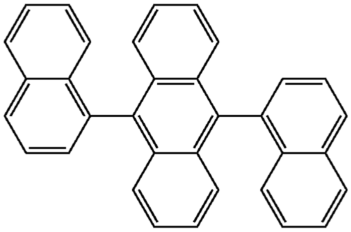
H2
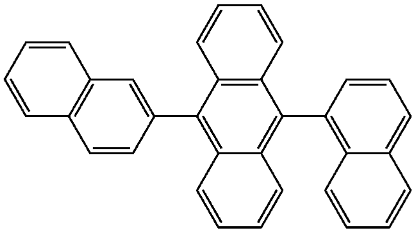
H3
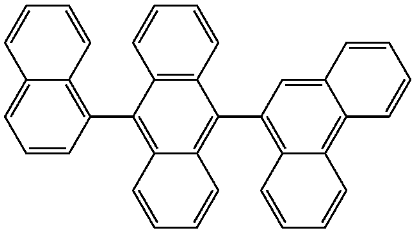
H4
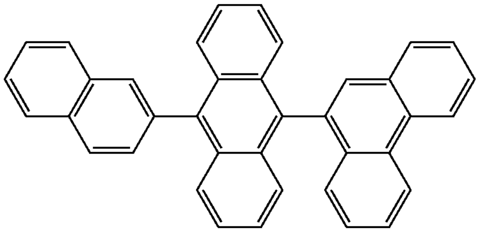
H5
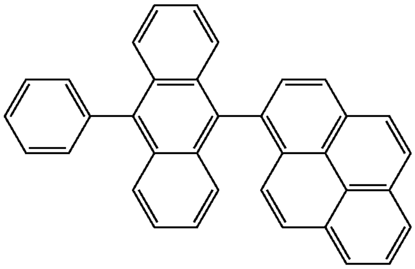
H6
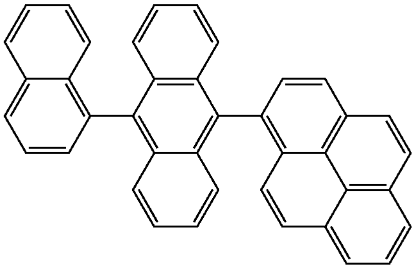
H7
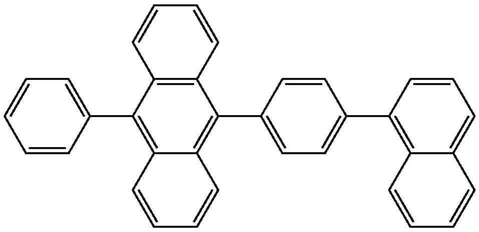
H8
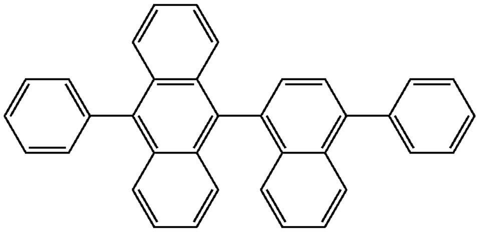
H9
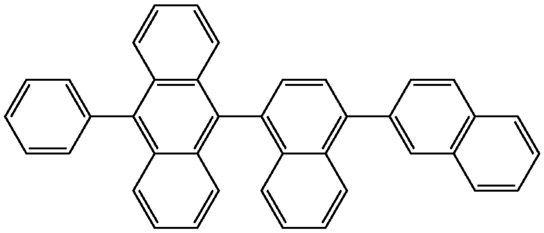
H10
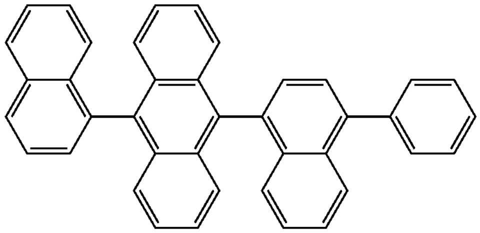
H11
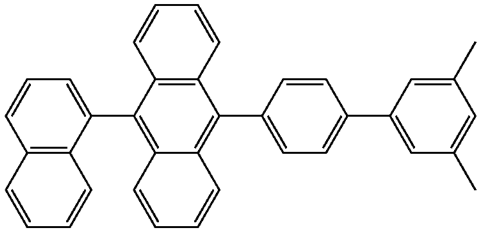
H12
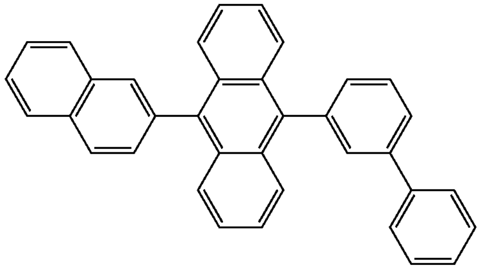

-continued
H13
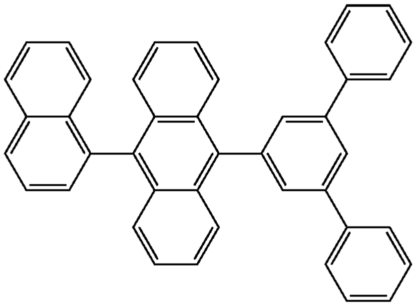
H14
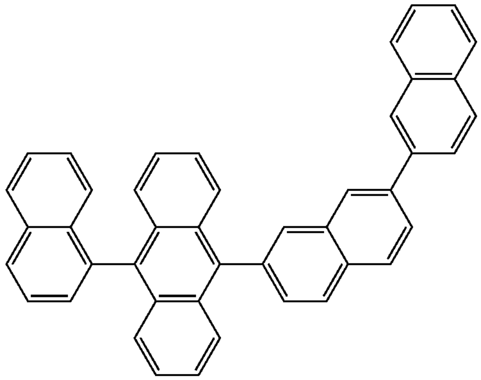
H15
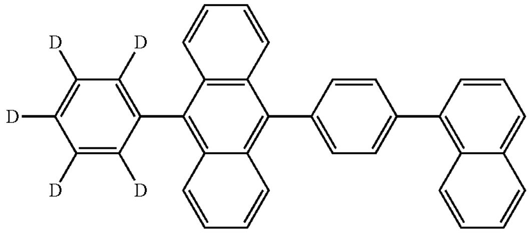
H16
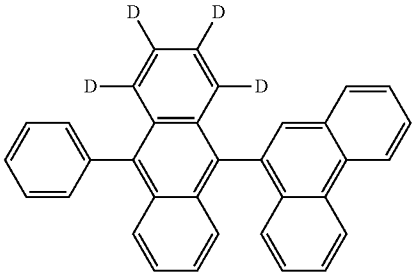
H17
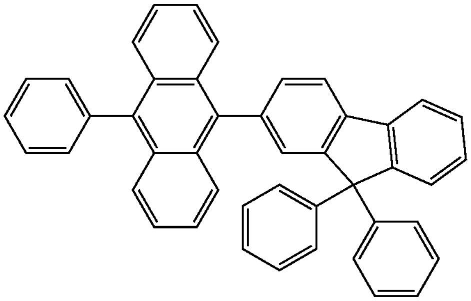
-continued
H18
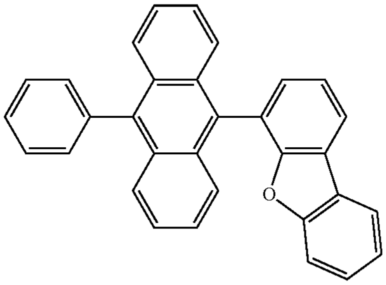
H19
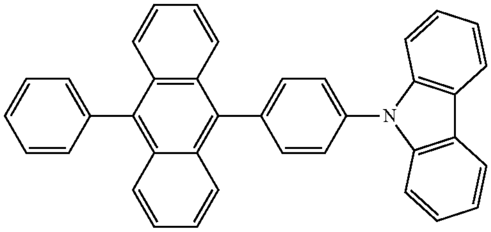
H20
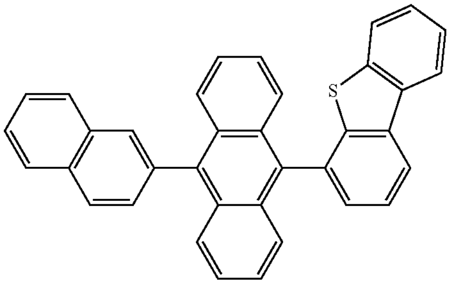
H21
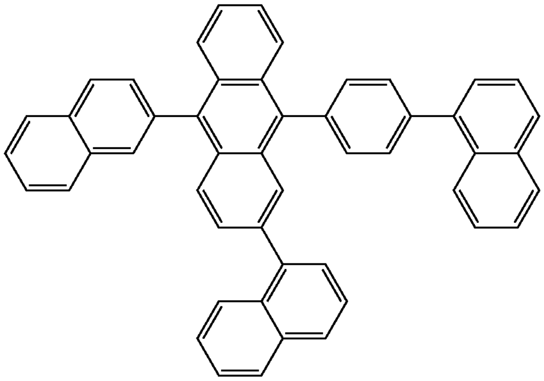
H22
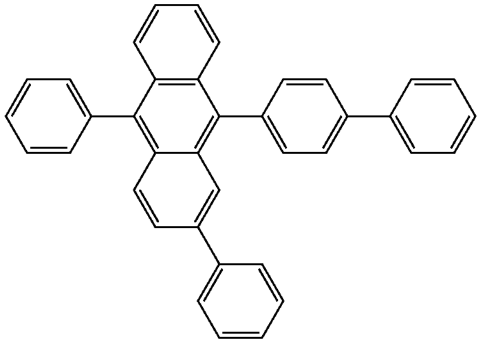

-continued
H23
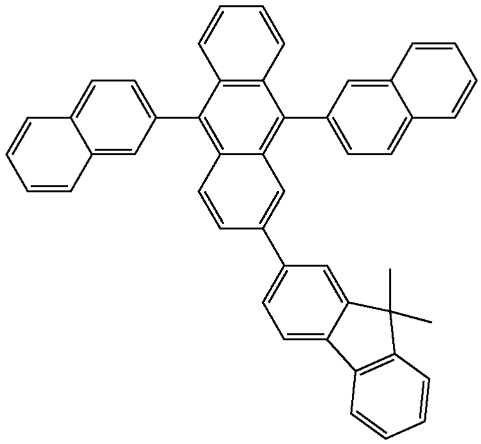
H24
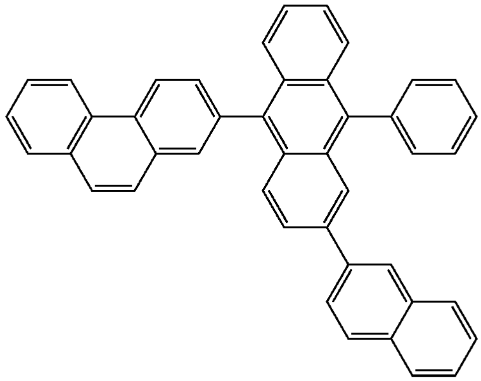
H25
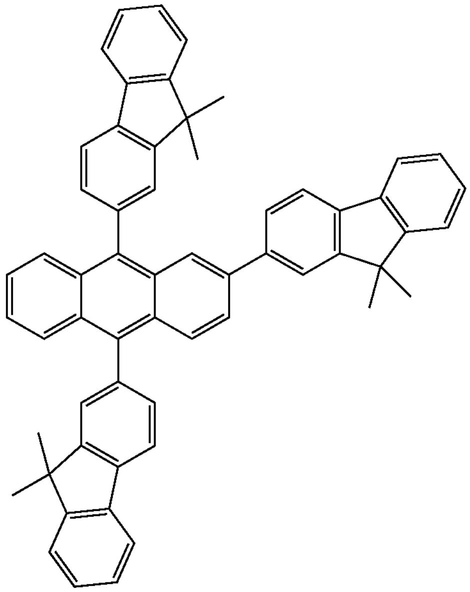
-continued
H26
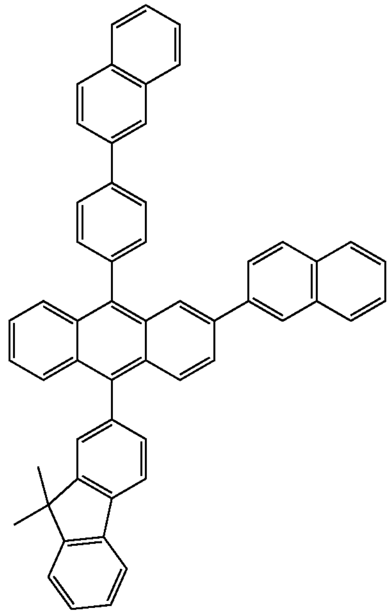
H27
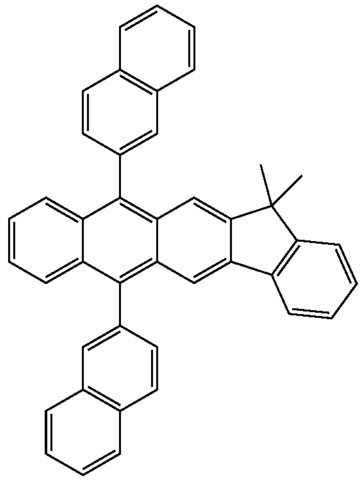
H28
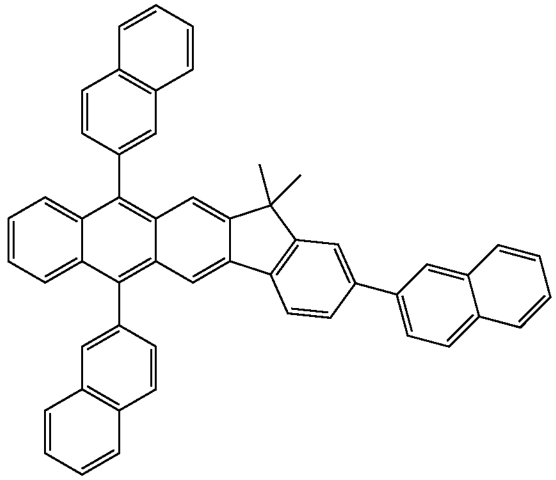

-continued
H29
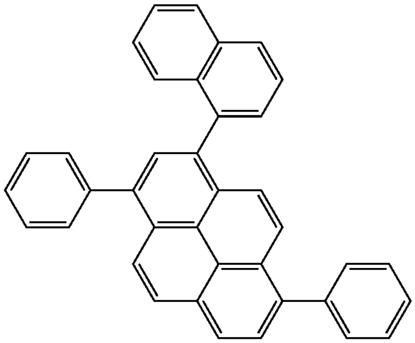
H30
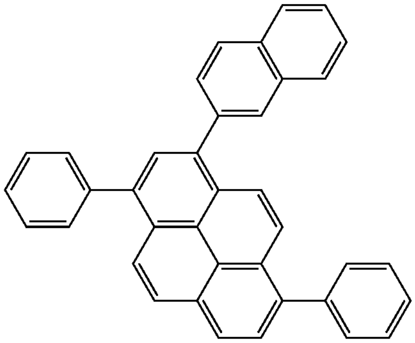
H31
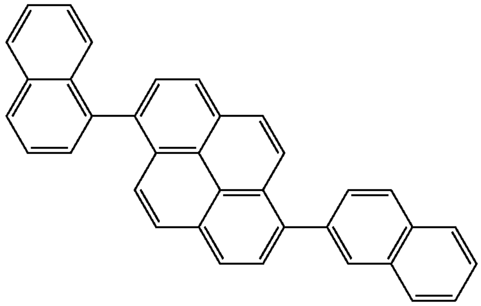
H32
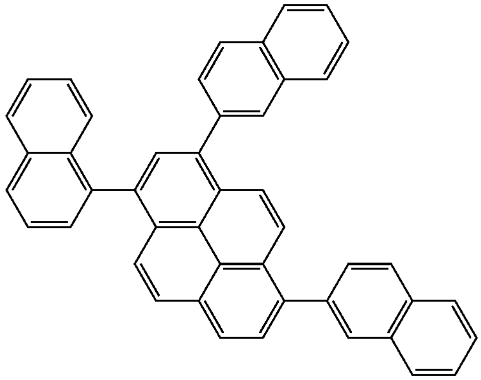
H33
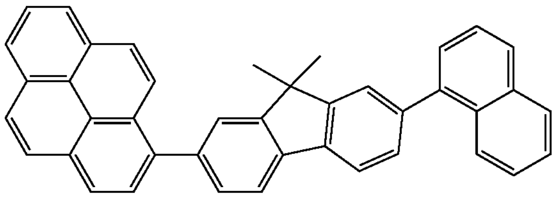
-continued
H34
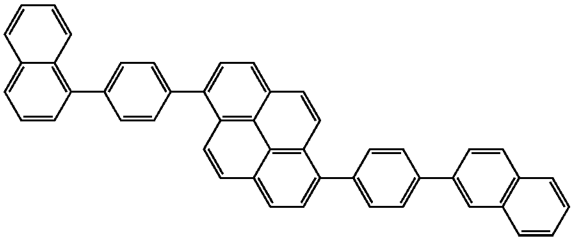
H35
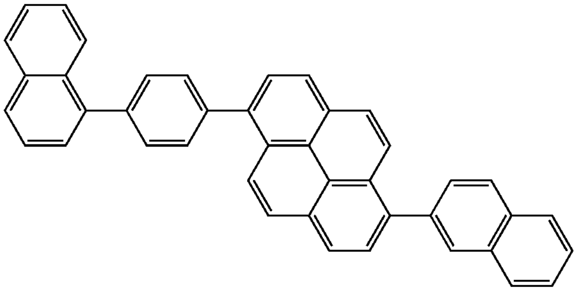
H36
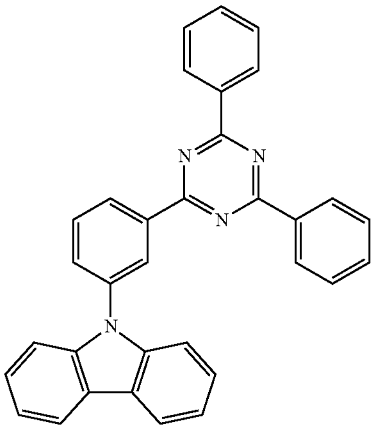
H37
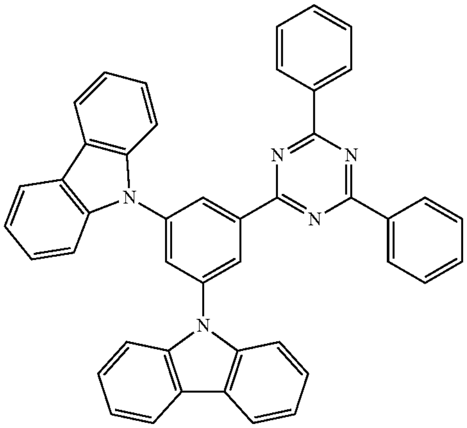

-continued
H38
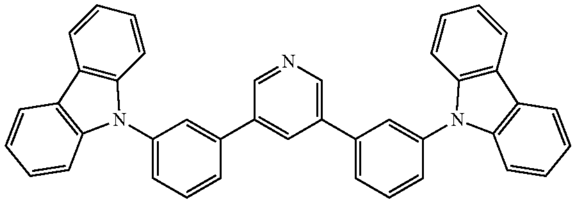
H39
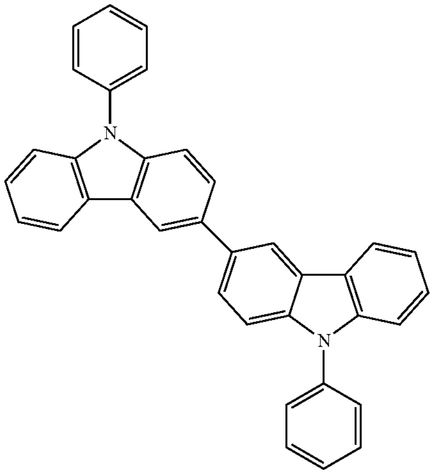
H40
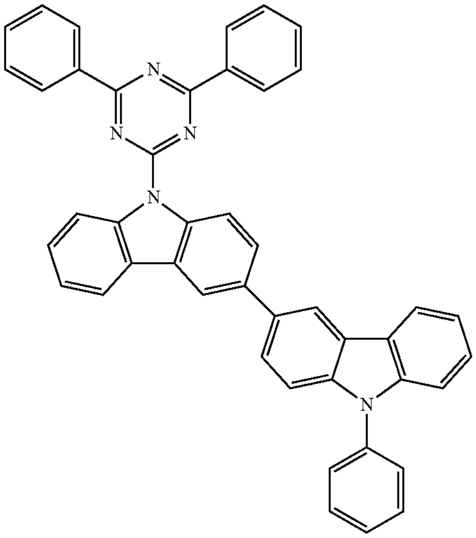
-continued
H41
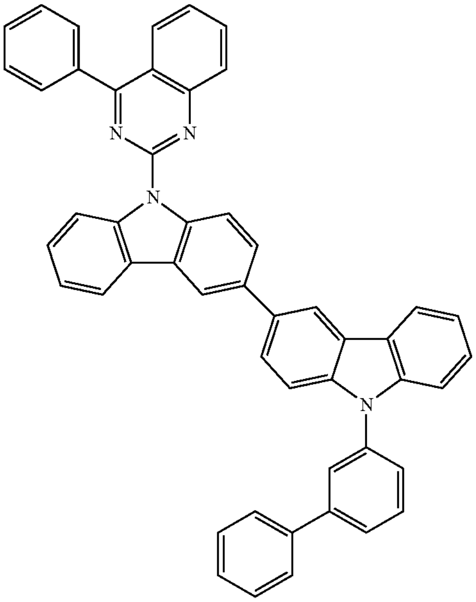
H42
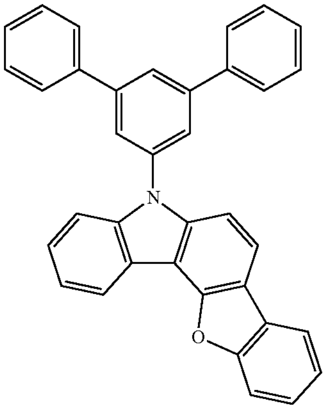
H43
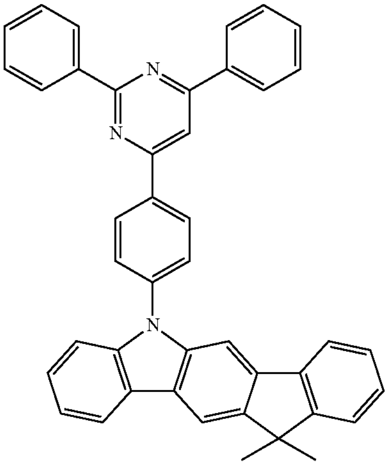

-continued
H44
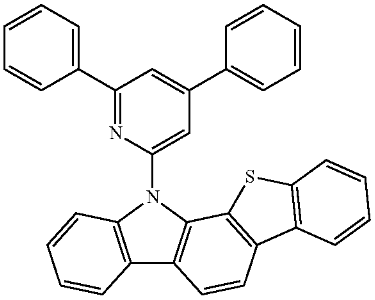
H45
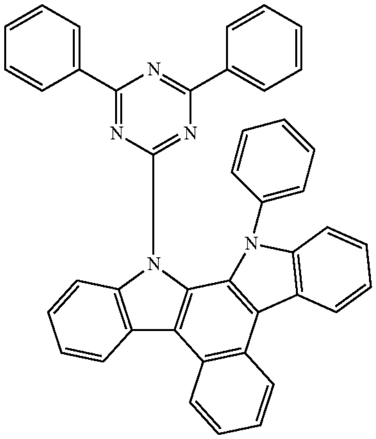
H46
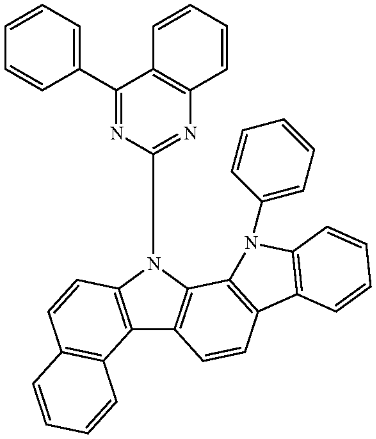
H47
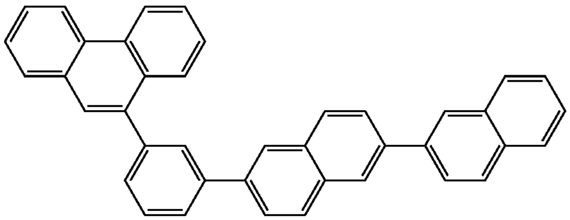
-continued
H48
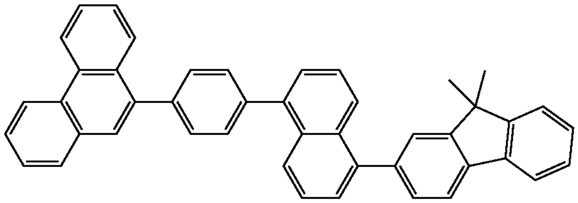
H49
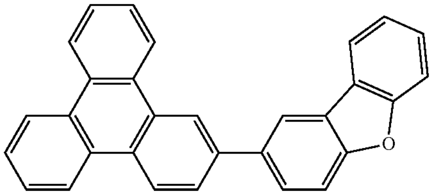
H50
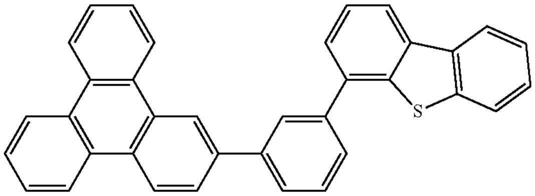
H51
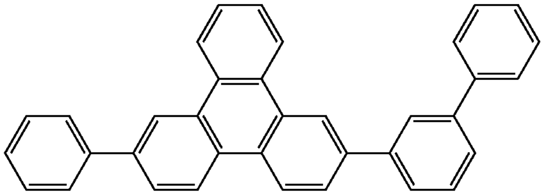
H52
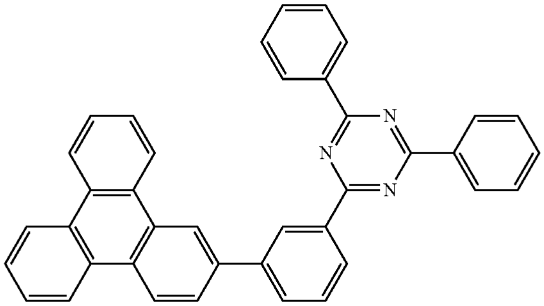
H53
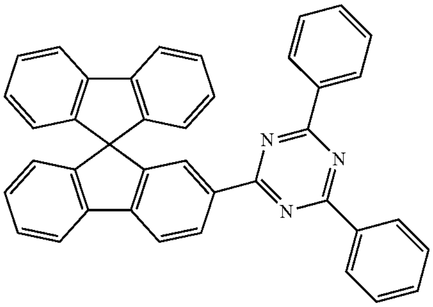

-continued

H54

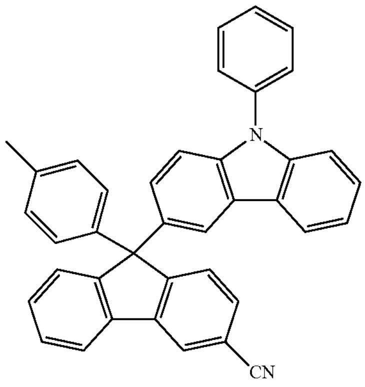

H55

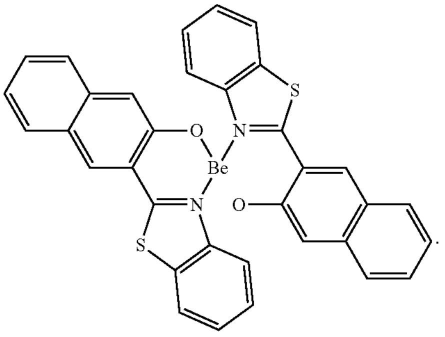

In one exemplary embodiment, the first host and the second host may be the same material.

[First Dopant and Second Dopant]

In one exemplary embodiment, the first dopant and the second dopant may each independently include a phosphorescent dopant or a delayed fluorescence dopant.

The phosphorescent dopant may include an organometallic complex represented by Formula 401:

<Formula 401>

$$M(L_{401})_{xc1}(L_{402})_{xc2}$$

<Formula 402>

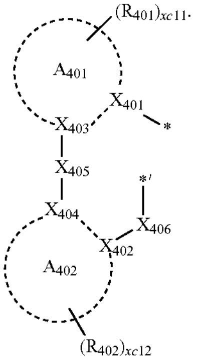

In Formulae 401 and 402,

M may be selected from iridium (Ir), platinum (Pt), palladium (Pd), osmium (Os), titanium (Ti), zirconium (Zr), hafnium (Hf), europium (Eu), terbium (Tb), rhodium (Rh), and thulium (Tm), $L_{401}$ may be selected from ligands represented by Formula 402, and xc1 may be 1, 2, or 3, wherein, when xc1 is two or more, two or more $L_{401}$(s) may be identical to or different from each other, $L_{402}$ may be an organic ligand, and xc2 may be an integer from 0 to 4, wherein, when xc2 is two or more, two or more $L_{402}$(s) may be identical to or different from each other, $X_{401}$ to $X_{404}$ may each independently be nitrogen or carbon, $X_{401}$ and $X_{403}$ may be linked via a single bond or a double bond, and $X_{402}$ and $X_{404}$ may be linked via a single bond or a double bond, $A_{401}$ and $A_{402}$ may each independently be selected from a $C_5$-$C_{60}$ carbocyclic group and a $C_1$-$C_{60}$ heterocyclic group, $X_{405}$ may be a single bond, *—O—*', *—S—*', *—C(=O)—*', *—N($Q_{411}$)-*', *—C($Q_{411}$)($Q_{412}$)-*', *—C($Q_{411}$)=C($Q_{412}$)-*', *—C($Q_{411}$)=*', or *=C($Q_{411}$)=*', wherein $Q_{411}$ and $Q_{412}$ may be hydrogen, deuterium, a $C_1$-$C_{20}$ alkyl group, a $C_1$-$C_{20}$ alkoxy group, a phenyl group, a biphenyl group, a terphenyl group, or a naphthyl group, $X_{406}$ may be a single bond, O, or S, $R_{401}$ and $R_{402}$ may each independently be selected from hydrogen, deuterium, —F, —Cl, —Br, —I, a hydroxyl group, a cyano group, a nitro group, an amidino group, a hydrazino group, a hydrazono group, a substituted or unsubstituted $C_1$-$C_{20}$ alkyl group, a substituted or unsubstituted $C_1$-$C_{20}$ alkoxy group, a substituted or unsubstituted $C_3$-$C_{10}$ cycloalkyl group, a substituted or unsubstituted $C_1$-$C_{10}$ heterocycloalkyl group, a substituted or unsubstituted $C_3$-$C_{10}$ cycloalkenyl group, a substituted or unsubstituted $C_1$-$C_{10}$ heterocycloalkenyl group, a substituted or unsubstituted $C_6$-$C_{60}$ aryl group, a substituted or unsubstituted $C_6$-$C_{60}$ aryloxy group, a substituted or unsubstituted $C_6$-$C_{60}$ arylthio group, a substituted or unsubstituted $C_1$-$C_{60}$ heteroaryl group, a substituted or unsubstituted monovalent non-aromatic condensed polycyclic group, a substituted or unsubstituted monovalent non-aromatic condensed heteropolycyclic group, —Si($Q_{401}$)($Q_{402}$)($Q_{403}$), —N($Q_{401}$)($Q_{402}$), —B($Q_{401}$)($Q_{402}$), —C(=O)($Q_{401}$), —S(=O)$_2$($Q_{401}$), and —P(=O)($Q_{401}$)($Q_{402}$), wherein $Q_{401}$ to $Q_{403}$ may each independently be selected from a $C_1$-$C_{10}$ alkyl group, a $C_1$-$C_{10}$ alkoxy group, a $C_6$-$C_{20}$ aryl group, and a $C_1$-$C_{20}$ heteroaryl group, xc11 and xc12 may each independently be an integer from 0 to 10, and

* and *' in Formula 402 each indicate a binding site to M in Formula 401.

In one exemplary embodiment, $A_{401}$ and $A_{402}$ in Formula 402 may each independently be selected from a benzene group, a naphthalene group, a fluorene group, a spiro-bifluorene group, an indene group, a pyrrole group, a thiophene group, a furan group, an imidazole group, a pyrazole group, a thiazole group, an isothiazole group, an oxazole group, an isoxazole group, a pyridine group, a pyrazine group, a pyrimidine group, a pyridazine group, a quinoline group, an isoquinoline group, a benzoquinoline group, a quinoxaline group, a quinazoline group, a carbazole group, a benzimidazole group, a benzofuran group, a benzothiophene group, an isobenzothiophene group, a benzoxazole group, an isobenzoxazole group, a triazole group, a tetrazole group, an oxadiazole group, a triazine group, a dibenzofuran group, and a dibenzothiophene group.

In one or more exemplary embodiments, in Formula 402, i) $X_{401}$ may be nitrogen, and $X_{402}$ may be carbon, or ii) $X_{401}$ and $X_{402}$ may each be nitrogen at the same time.

In one or more exemplary embodiments, $R_{401}$ and $R_{402}$ in Formula 402 may each independently be selected from:

hydrogen, deuterium, —F, —Cl, —Br, —I, a hydroxyl group, a cyano group, a nitro group, an amidino group, a hydrazino group, a hydrazono group, a $C_1$-$C_{20}$ alkyl group, and a $C_1$-$C_{20}$ alkoxy group;

a $C_1$-$C_{20}$ alkyl group and a $C_1$-$C_{20}$ alkoxy group, each substituted with at least one selected from deuterium, —F, —Cl, —Br, —I, a hydroxyl group, a cyano group, a nitro group, an amidino group, a hydrazino group, a hydrazono group, a phenyl group, a naphthyl group, a cyclopentyl group, a cyclohexyl group, an adamantanyl group, a norbornanyl group, and a norbornenyl group;

a cyclopentyl group, a cyclohexyl group, an adamantanyl group, a norbornanyl group, a norbornenyl group, a phenyl group, a biphenyl group, a terphenyl group, a naphthyl group, a fluorenyl group, a pyridinyl group, a pyrazinyl group, a pyrimidinyl group, a pyridazinyl group, a triazinyl group, a quinolinyl group, an isoquinolinyl group, a quinoxalinyl group, a quinazolinyl group, a carbazolyl group, a dibenzofuranyl group, and a dibenzothiophenyl group;

a cyclopentyl group, a cyclohexyl group, an adamantanyl group, a norbornanyl group, a norbornenyl group a phenyl group, a biphenyl group, a terphenyl group, a naphthyl group, a fluorenyl group, a pyridinyl group, a pyrazinyl group, a pyrimidinyl group, a pyridazinyl group, a triazinyl group, a quinolinyl group, an isoquinolinyl group, a quinoxalinyl group, a quinazolinyl group, a carbazolyl group, a dibenzofuranyl group, and a dibenzothiophenyl group, each substituted with at least one selected from deuterium, —F, —Cl, —Br, —I, a hydroxyl group, a cyano group, a nitro group, an amidino group, a hydrazino group, a hydrazono group, a $C_1$-$C_{20}$ alkyl group, a $C_1$-$C_{20}$ alkoxy group, a cyclopentyl group, a cyclohexyl group, an adamantanyl group, a norbornanyl group, a norbornenyl group, a phenyl group, a biphenyl group, a terphenyl group, a naphthyl group, a fluorenyl group, a pyridinyl group, a pyrazinyl group, a pyrimidinyl group, a pyridazinyl group, a triazinyl group, a quinolinyl group, an isoquinolinyl group, a quinoxalinyl group, a quinazolinyl group, a carbazolyl group, a dibenzofuranyl group, and a dibenzothiophenyl group; and —$Si(Q_{401})(Q_{402})(Q_{403})$, —$N(Q_{401})(Q_{402})$, —$B(Q_{401})(Q_{402})$, —$C(=O)(Q_{401})$, —$S(=O)_2(Q_{401})$, and —$P(=O)(Q_{401})(Q_{402})$, and $Q_{401}$ to $Q_{403}$ may each independently be selected from a $C_1$-$C_{10}$ alkyl group, a $C_1$-$C_{10}$ alkoxy group, a phenyl group, a biphenyl group, and a naphthyl group, but exemplary embodiments of the inventive concepts are not limited thereto.

In one or more exemplary embodiments, when xc1 in Formula 401 is two or more, two $A_{401}$(s) in two or more $L_{401}$(s) may optionally be linked via $X_{407}$, which is a linking group, or two $A_{402}$(*s*) in two or more $L_{401}$(s) may optionally be linked via $X_{408}$, which is a linking group (see Compounds PD1 to PD4 and PD7). $X_{407}$ and $X_{408}$ may each independently be a single bond, *—O—*', *—S—*', *—C(=O)—*', *—$N(Q_{413})$-*', *—$C(Q_{413})(Q_{414})$-*', or *—$C(Q_{413})=C(Q_{414})$-*' (wherein $Q_{413}$ and $Q_{414}$ may each independently be hydrogen, deuterium, a $C_1$-$C_{20}$ alkyl group, a $C_1$-$C_{20}$ alkoxy group, a phenyl group, a biphenyl group, a terphenyl group, or a naphthyl group), but exemplary embodiments of the inventive concepts are not limited thereto.

$L_{402}$ in Formula 401 may be a monovalent, divalent, or trivalent organic ligand. For example, $L_{402}$ may be selected from halogen, diketone (for example, acetylacetonate), carboxylic acid (for example, picolinate), —C(=O), isonitrile, —CN, and phosphorus (for example, phosphine or phosphite, but exemplary embodiments of the inventive concepts are not limited thereto.

In one or more exemplary embodiments, the phosphorescent dopant may be selected from, for example, Compounds PD1 to PD25, but exemplary embodiments of the inventive concepts are not limited thereto:

PD1

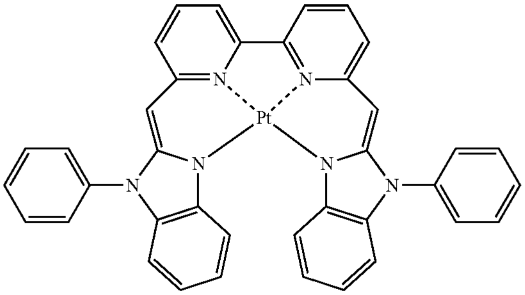

PD2

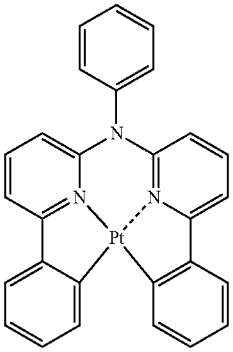

PD3

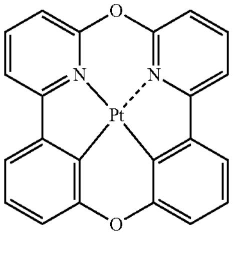

PD4

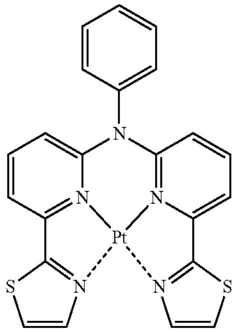

-continued
PD5
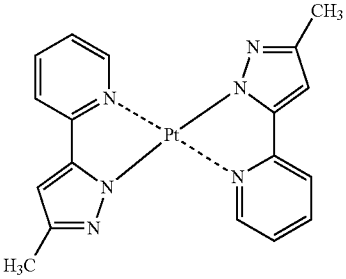
PD6
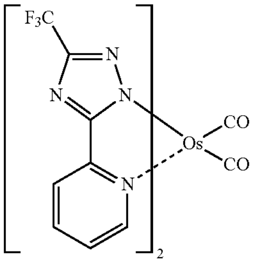
PD7
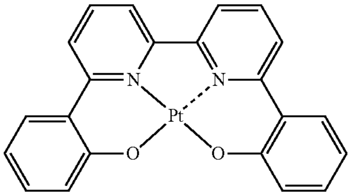
PD8
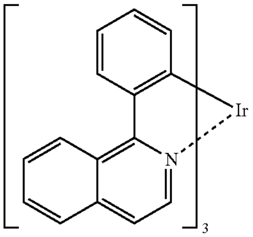
PD9
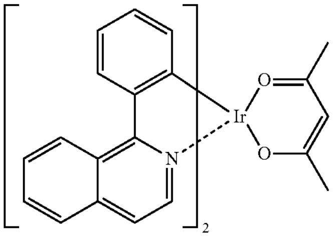
PD10
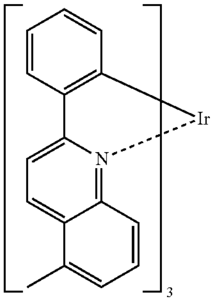
-continued
PD11
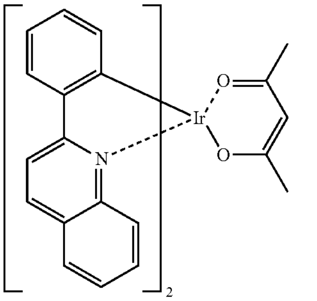
PD12
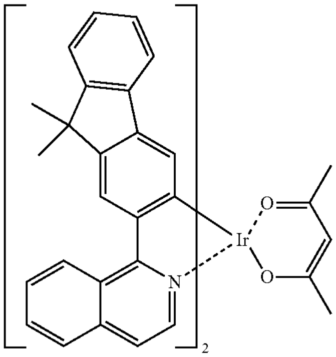
PD13
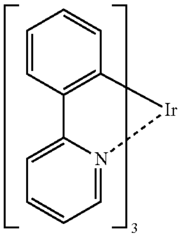
PD14
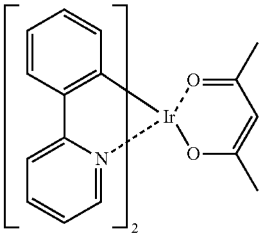
PD15
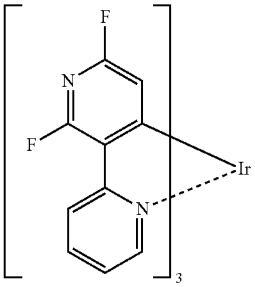

-continued
PD16
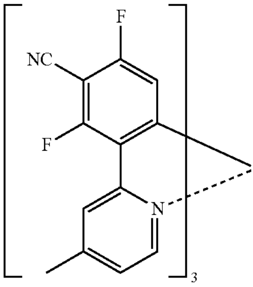
PD17
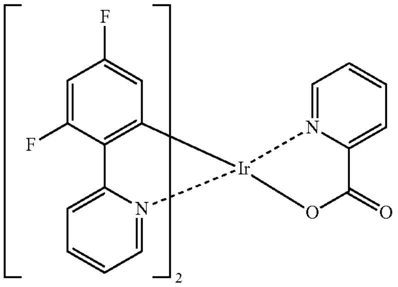
PD18
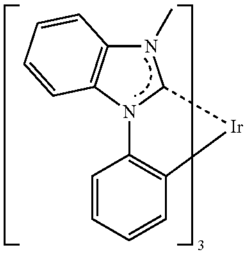
PD19
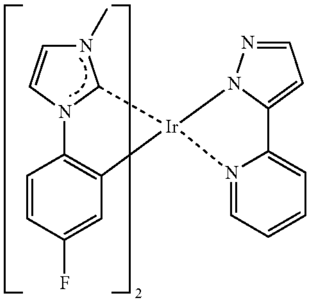
PD20
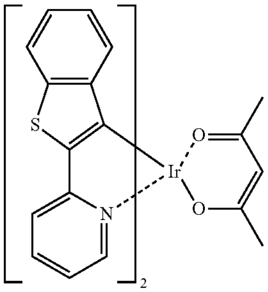
-continued
PD21
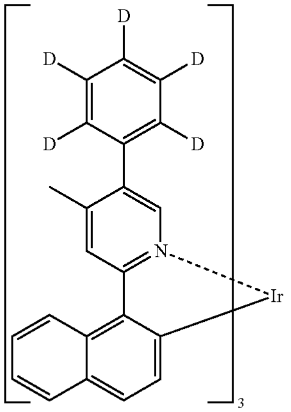
PD22
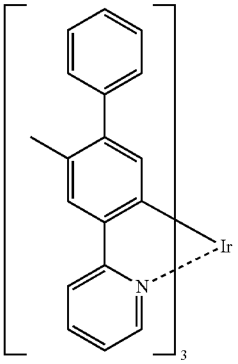
PD23
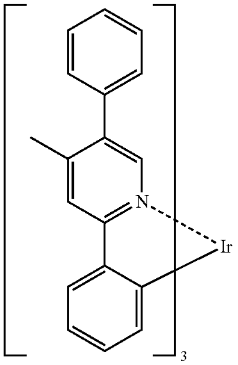
PD24
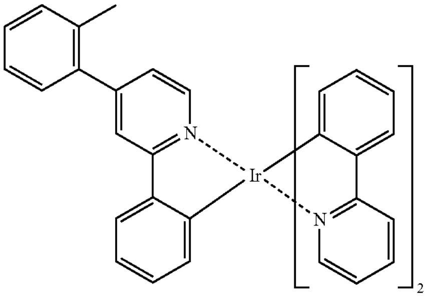

-continued
PD25
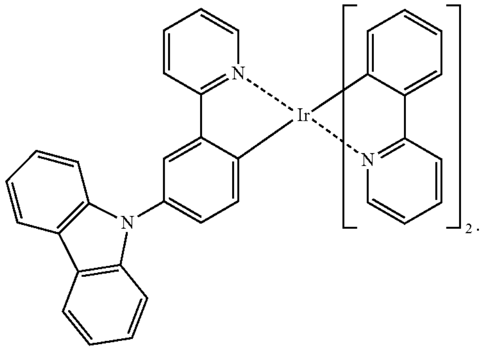
In one exemplary embodiment, the phosphorescent dopant may be used for blue light emission.
For example, the phosphorescent dopant may be selected from Compounds PD101 to PD126:
PD101
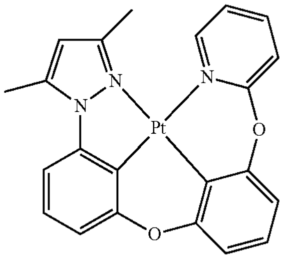
PD102
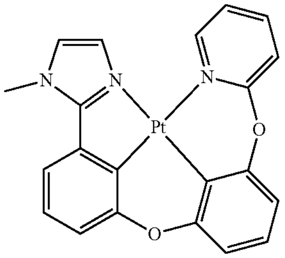
PD103
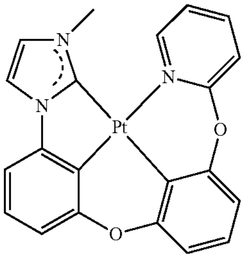
PD104
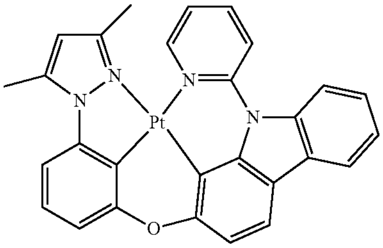
-continued
PD105
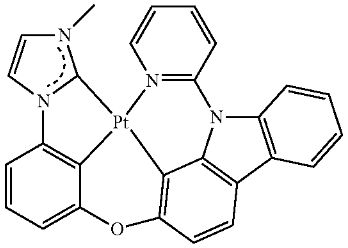
PD106
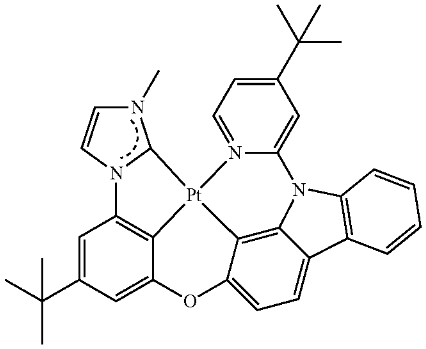
PD107
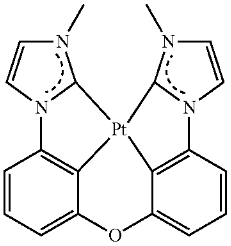
PD108
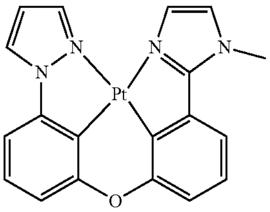
PD109
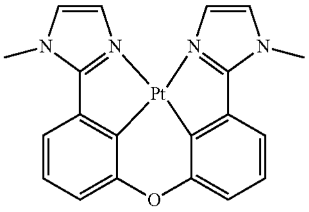
PD110
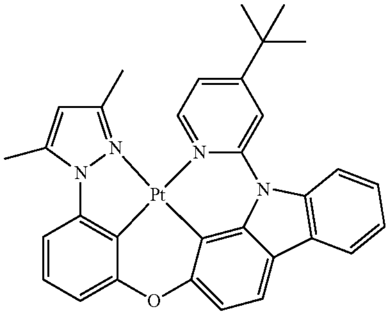

-continued
PD111
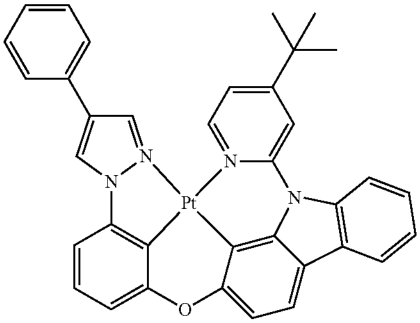
PD112
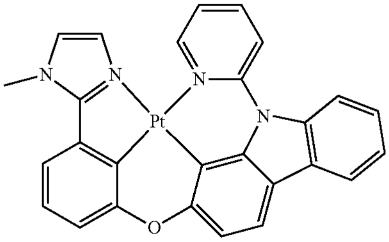
PD113
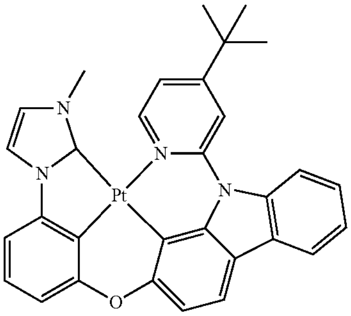
PD114
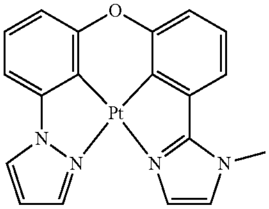
PD115
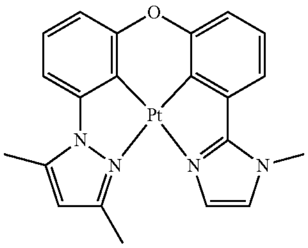
-continued
PD116
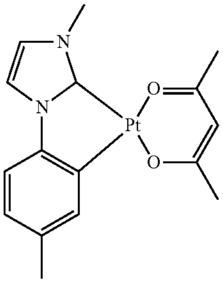
PD117
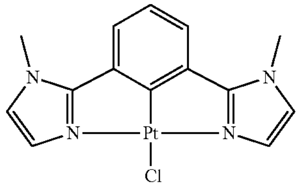
PD118
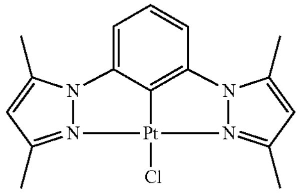
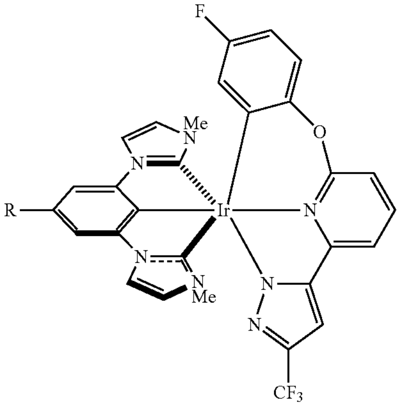
PD119 (R = $CF_3$)
PD120 (R = $Bu^t$)
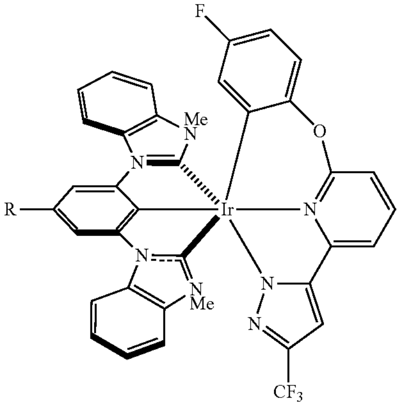
PD121 (R = $CF_3$)
PD122 (R = $Bu^t$)

-continued

PD123

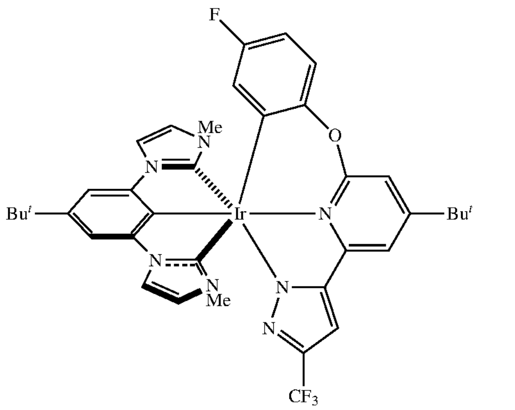

PD124

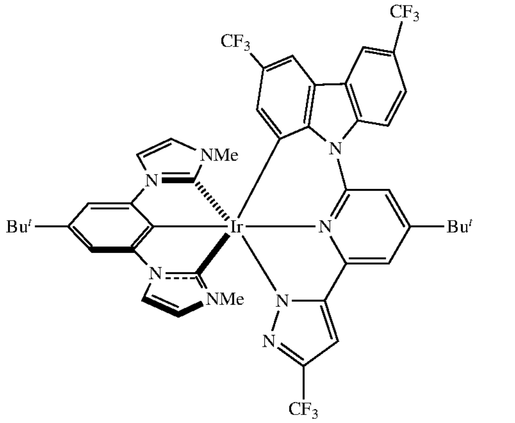

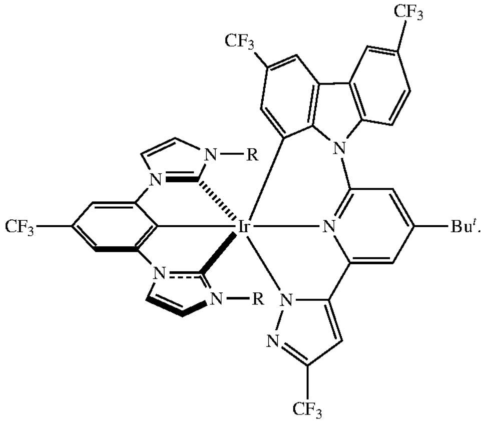

PD125 (R = Me)

PD126 (R = $Pr^i$)

In Compounds PD101 to PD126,

Me indicates a methyl group, $Pr^i$ indicates an isopropyl group, and But indicates a t-butyl group.

The delayed fluorescence dopant may satisfy Equation 3:

$$|S1(D) - T1(D)| \leq 0.5 \text{ eV}. \quad \text{〈Equation 3〉}$$

In Equation 3,

T1(D) is a lowest excitation triplet energy level of the dopant, and

S1(D) is a lowest excitation singlet energy level of the dopant.

The delayed fluorescence dopant satisfying Equation 3 may emit thermally activated delayed fluorescence even at room temperature. For example, the delayed fluorescence dopant may satisfy |S1 (D)−T1(D)|≤0.3 eV, or |S1(D)−T1 (D)|≤0.2 eV, but exemplary embodiments of the inventive concepts are not limited thereto.

In addition, the delayed fluorescence dopant may not include a metal atom. That is, the delayed fluorescence dopant is clearly different from a phosphorescent dopant including a metal atom. In one or more exemplary embodiments, the delayed fluorescence dopant may not include iridium (Ir), platinum (Pt), palladium (Pd), osmium (Os), titanium (Ti), zirconium (Zr), hafnium (Hf), europium (Eu), terbium (Tb), rhodium (Rh), and thulium (Tm), and may distinguish from the phosphorescent dopant.

In one exemplary embodiment, the first host and the first dopant may satisfy T1(H1)≥T1(D1), and the second host and the second dopant may satisfy T1(H2)≥T1(D2), but exemplary embodiments of the inventive concepts are not limited thereto. When the first host, the first dopant, the second host, and the second dopant are within these ranges, excitons may be smoothly transferred from the first host to the first dopant, and excitons may be smoothly transferred from the second host to the second dopant.

For example, the delayed fluorescence dopant may have a D-type structure including an electron donating group (D) and an electron accepting group (A). Specifically, the delayed fluorescence dopant may be compounds disclosed in Japanese Patent Application Laid-Open Nos. 2011-140046, 2013-034967, 2015-530745, 2013-034967, 2014-512416, 2015-525248, 2013-524707, 2013-547225, 2012-274324, and 2015-504322, U.S. Patent Application Publication No. 2012-0217869, International Publication Nos. 2015-118035, 2016-091887, and 2016-096851, Korean Patent Application Publication No. 2017-7005332, Japanese Patent Application Laid-Open No. 2014-518737, U.S. Patent Application Publication Nos. 2016-0197286, 2014-0138627, 2014-0145149, 014-0158992, 2014-0145151, 2015-0021555, and 2014-0332758, Korean Patent Application Publication No. 2014-0154391, and Japanese Patent Application Laid-Open Nos. 2015-148588, 2016-506442, 2015-531748, 2016-538300, 2016-538393, 2015-095814, 2012-538639, 2014-525803, 2012-546858, 2016-538300, and 2014-538540, but exemplary embodiments of the inventive concepts are not limited thereto.

In one exemplary embodiment, the delayed fluorescence dopant may have a D-A-D type or A-D-A type structure. Specifically, the delayed fluorescence dopant may be compounds disclosed in International Publication No. 2015-158692 and Japanese Patent Application Laid-Open Nos. 2016-538435, 2016-538426, 2015-500308, and 2015-527231, but exemplary embodiments of the inventive concepts are not limited thereto.

In one exemplary embodiment, the delayed fluorescence dopant may be a transition metal complex. Specifically, the delayed fluorescence dopant may be a Cu complex or a Pt complex, and may be compounds disclosed in Korean Patent Application Publication Nos. 2012-7017497, 2013-7001396, 2014-0068027, and 2014-7003327, U.S. Patent Application Publication No. 2011-0304262, but exemplary embodiments of the inventive concepts are not limited thereto.

In one exemplary embodiment, the delayed fluorescence dopant may be a compound having a B—N structure, and may be a compound disclosed in U.S. Patent Application Publication No. 2014-0027734, but exemplary embodiments of the inventive concepts are not limited thereto.

In one exemplary embodiment, the delayed fluorescence dopant may be compounds disclosed in Japanese Patent Application Laid-Open Nos. 2015-508569 and 2014-554306, but exemplary embodiments of the inventive concepts are not limited thereto.

The electron donating group (D) may be, for example, a carbazole group, a dibenzothiophene group, a dibenzofuran group, an indolocarbazole group, or a bis-carbazole group, but exemplary embodiments of the inventive concepts are not limited thereto.

The electron accepting group (A) may be CN, F, an aryl group substituted with CN and/or F, or a π electron-depleted nitrogen-containing cyclic group, but exemplary embodiments of the inventive concepts are not limited thereto.

In one exemplary embodiment, the first host, the first dopant, the second host, the second dopant, and the first quenching material may satisfy Equations 1-1 to 1-4:

$$T1(Q1) \leq T1(H1) \quad \langle\text{Equation 1-1}\rangle$$

$$T1(Q1) \leq T1(D1) \quad \langle\text{Equation 1-2}\rangle$$

$$T1(Q1) \leq T1(H2) \quad \langle\text{Equation 1-3}\rangle$$

$$T1(Q1) \leq T1(D2). \quad \langle\text{Equation 1-4}\rangle$$

In Equations 1-1 to 1-4, $T1(Q_1)$ is a lowest excitation triplet energy level of the first quenching material, T1(H1) is a lowest excitation triplet energy level of the first host, T1 (D1) is a lowest excitation triplet energy level of the first dopant, T1 (H2) is a lowest excitation triplet energy level of the second host, and T1 (D2) is a lowest excitation triplet energy level of the second dopant.

In the organic light-emitting device satisfying Equations 1-1 and 1-3, some of the triplets generated in the first host of the first emission layer and the second host of the second emission layer may be transferred to the first exciton quenching layer. Therefore, the triplet concentrations in the first emission layer and the second emission layer may be appropriately adjusted. The triplets in the first emission layer and the second emission layer do not participate in light emission, and the triplets may react with each other to disappear or may deteriorate the host and the dopant through various mechanisms such as reaction with charges or charged organic molecules. Therefore, since the organic light-emitting device includes the first exciton quenching layer, some of triplets existing in the first emission layer and the second emission layer may be quenched and maintained at an appropriate concentration, thereby improving the lifespan of the organic light-emitting device.

In the organic light-emitting device satisfying Equations 1-2 and 1-4, all the triplets generated in the first host of the first emission layer and the second host of the second emission layer are not transferred to the first exciton quenching layer, and may also be transferred to the first dopant of the first emission layer and the second dopant of the second emission layer. Therefore, the triplet concentrations in the first emission layer and the second emission layer may be maintained to such an extent that a desired luminescent efficiency is obtained.

The first exciton quenching layer 133 including the first quenching material may be disposed between the first emission layer 131 and the second emission layer 132.

In one exemplary embodiment, the first quenching material may have a lowest excitation triplet energy level T1(Q1) in a rang of about 1 eV to about 3.5 eV. For example, T1(Q1) may be in a range of about 1.7 eV to about 3.3 eV. When T1(Q1) of the first quenching material is within these ranges, the first quenching material may have a low lowest excitation triplet energy level, as compared with the phosphorescent dopants commonly used for the emission layer of the organic light-emitting device, and the concentration of triplets not participating in light emission in the emission layer may be lowered.

In one exemplary embodiment, the first quenching material may include at least one selected from a fluorescence emitting material and a phosphorescence emitting material.

In one exemplary embodiment, the fluorescence emitting material may be an organometallic low-molecular-weight host or an organic low-molecular-weight host used for light emission.

The organometallic low-molecular-weight host may be, for example, an alkaline earth metal complex such as a Be complex, a Mg complex, and a Zn complex.

The organic low-molecular-weight host may be, for example, a styryl-based compound, an oxadiazole-based compound, and a spiro-bifluorene-based compound.

In one exemplary embodiment, the fluorescence emitting material may be selected from Compounds MH1 to MH13 and LH1 to LH11:

MH1

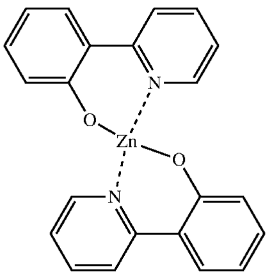

$(Zn(PhPy)_2)$

MH2

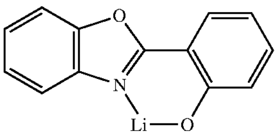

(LIPBO)

-continued
MH3
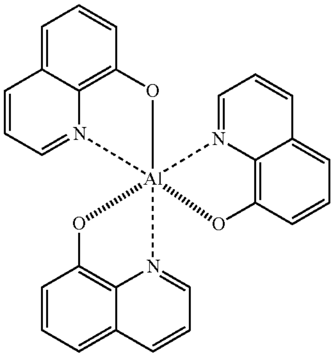
(Alq3)
MH4
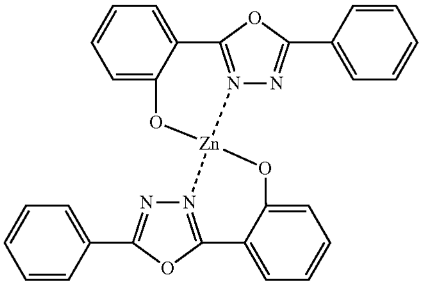
(Zn(ODZ)$_2$)
MH5
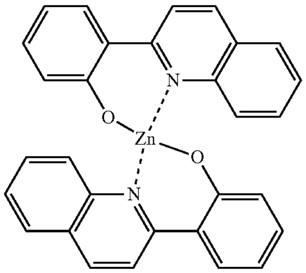
(Zn(Phq)$_2$)
MH6
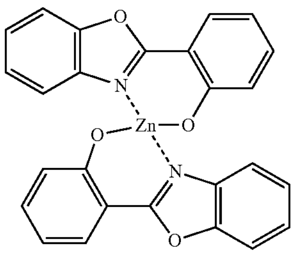
(Zn(BOX)$_2$)
-continued
MH7
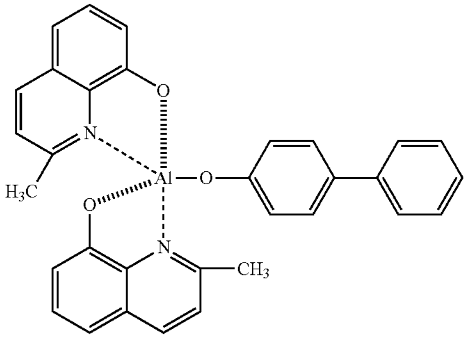
(BAlq)
MH8
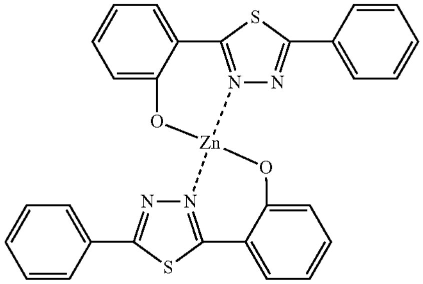
(Zn(TDZ)$_2$)
MH9
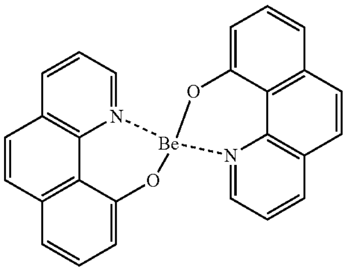
(Be(bq)$_2$)
MH10
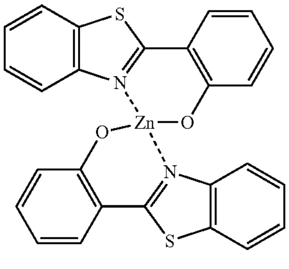
(Zn(BTZ)$_2$)

-continued
MH11
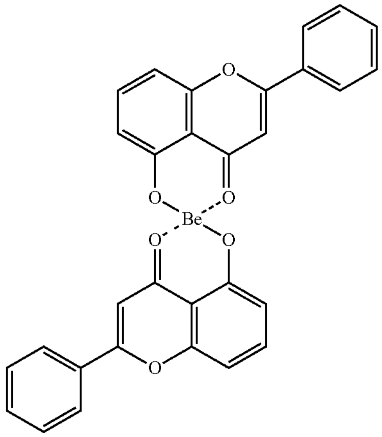
(Be(SFla)$_2$)
MH12
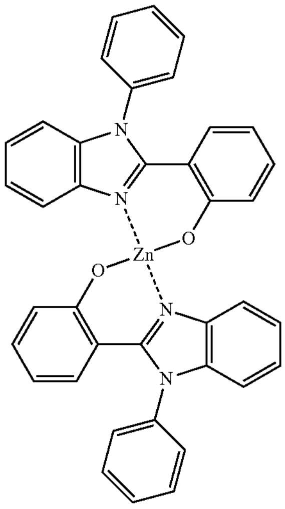
(Zn(BIZ)$_2$)
MH13
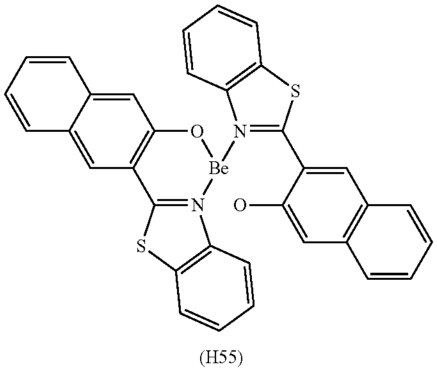
(H55)
-continued
LH1
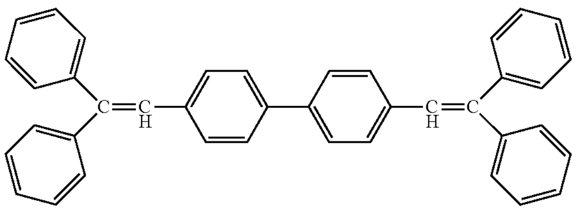
(DPVBI)
LH2
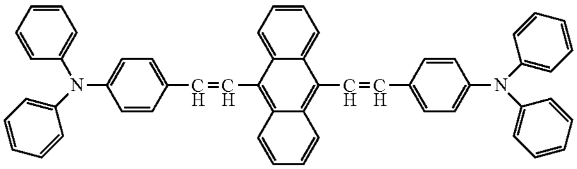
(DSA)
LH3
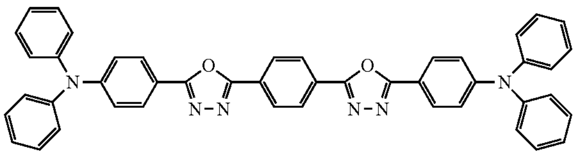
(Bis-DAPOXP(EM2))
LH4
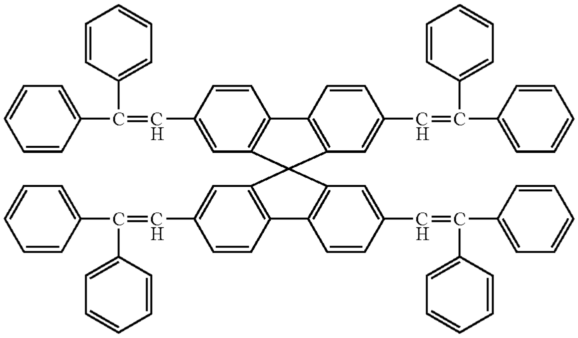
(Spiro-DPVBI)
LH5
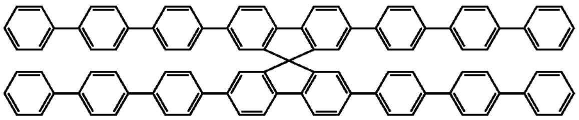
(Spiro-6P)
LH6
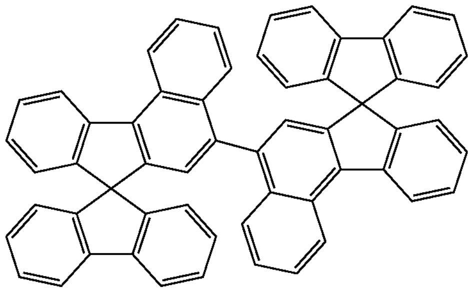

-continued

LH7

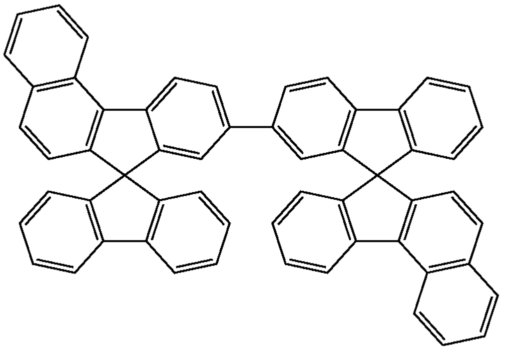

LH8

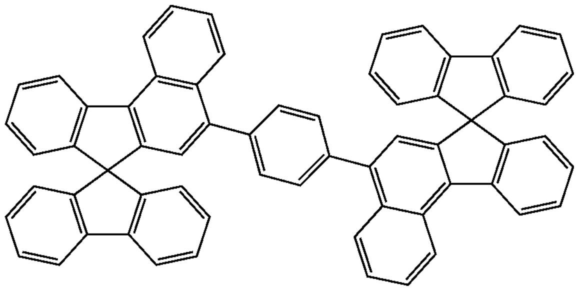

LH9

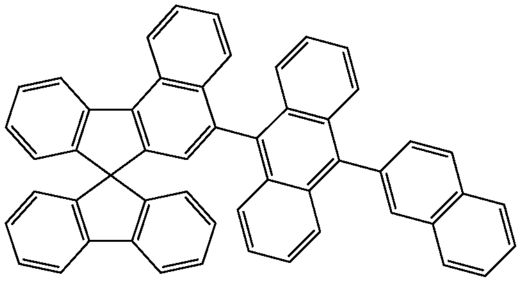

LH10

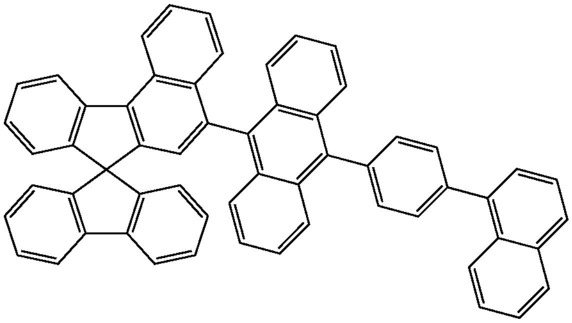

-continued

LH11

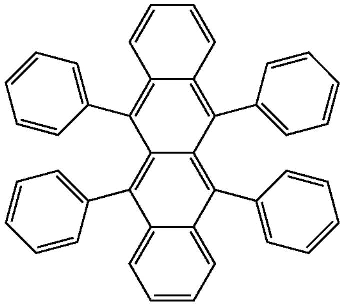

In one exemplary embodiment, the fluorescence emitting material may be a fluorescence dopant.

The fluorescence emitting material may include at least one selected from, for example, a diamine-based compound, a styryl-based compound, a perylene-based compound, and a coumarin-based compound.

In one exemplary embodiment, the fluorescence emitting material may include a compound represented by Formula 501:

<Formula 501>

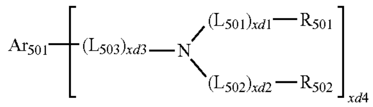

In Formula 501, $Ar_{501}$ may be a substituted or unsubstituted $C_5$-$C_{60}$ carbocyclic group or a substituted or unsubstituted $C_1$-$C_{60}$ heterocyclic group, $L_{501}$ to $L_{503}$ may each independently be selected from a substituted or unsubstituted $C_3$-$C_{10}$ cycloalkylene group, a substituted or unsubstituted $C_1$-$C_{10}$ heterocycloalkylene group, a substituted or unsubstituted $C_3$-$C_{10}$ cycloalkenylene group, a substituted or unsubstituted $C_1$-$C_{10}$ heterocycloalkenylene group, a substituted or unsubstituted $C_6$-$C_{60}$ arylene group, a substituted or unsubstituted $C_1$-$C_{60}$ heteroarylene group, a substituted or unsubstituted divalent non-aromatic condensed polycyclic group, and a substituted or unsubstituted divalent non-aromatic condensed heteropolycyclic group, xd1 to xd3 may each independently be an integer from 0 to 3, $R_{501}$ and $R_{502}$ may each independently be selected from a substituted or unsubstituted $C_3$-$C_{10}$ cycloalkyl group, a substituted or unsubstituted $C_1$-$C_{10}$ heterocycloalkyl group, a substituted or unsubstituted $C_3$-$C_{10}$ cycloalkenyl group, a substituted or unsubstituted $C_1$-$C_{10}$ heterocycloalkenyl group, a substituted or unsubstituted $C_6$-$C_{60}$ aryl group, a substituted or unsubstituted $C_6$-$C_{60}$ aryloxy group, a substituted or unsubstituted $C_6$-$C_{60}$ arylthio group, a substituted or unsubstituted $C_1$-$C_{60}$ heteroaryl group, a substituted or unsubstituted monovalent non-aromatic condensed polycyclic group, and a substituted or unsubstituted monovalent non-aromatic condensed heteropolycyclic group, and xd4 may be an integer from 1 to 6.

In one exemplary embodiment, $Ar_{501}$ in Formula 501 may be selected from:

a naphthalene group, a heptalene group, a fluorene group, a spiro-bifluorene group, a benzofluorene group, a dibenzofluorene group, a phenalene group, a phenanthrene group, an anthracene group, a fluoranthene group, a triphenylene group, a pyrene group, a chrysene group, a naphthacene group, a picene group, a perylene group, a pentaphene group, an indenoanthracene group, and an indenophenanthrene group; and a naphthalene group, a heptalene group, a fluorene group, a spiro-bifluorene group, a benzofluorene group, a dibenzofluorene group, a phenalene group, a phenanthrene group, an anthracene group, a fluoranthene group, a triphenylene group, a pyrene group, a chrysene group, a naphthacene group, a picene group, a perylene group, a pentaphene group, an indenoanthracene group, and an indenophenanthrene group, each substituted with at least one selected from deuterium, —F, —Cl, —Br, —I, a hydroxyl group, a cyano group, a nitro group, an amidino group, a hydrazino group, a hydrazono group, a $C_1$-$C_{20}$ alkyl group, a $C_1$-$C_{20}$ alkoxy group, a phenyl group, a biphenyl group, a terphenyl group, and a naphthyl group.

In one or more exemplary embodiments, $L_{501}$ to $L_{503}$ in Formula 501 may each independently be selected from:

a phenylene group, a naphthylene group, a fluorenylene group, a spiro-bifluorenylene group, a benzofluorenylene group, a dibenzofluorenylene group, a phenanthrenylene group, an anthracenylene group, a fluoranthenylene group, a triphenylenylene group, a pyrenylene group, a chrysenylene group, a perylenylene group, a pentaphenylene group, a hexacenylene group, a pentacenylene group, a thiophenylene group, a furanylene group, a carbazolylene group, an indolylene group, an isoindolylene group, a benzofuranylene group, a benzothiophenylene group, a dibenzofuranylene group, a dibenzothiophenylene group, a benzocarbazolylene group, a dibenzocarbazolylene group, a dibenzosilolylene group, and a pyridinylene group; and a phenylene group, a naphthylene group, a fluorenylene group, a spiro-bifluorenylene group, a benzofluorenylene group, a dibenzofluorenylene group, a phenanthrenylene group, an anthracenylene group, a fluoranthenylene group, a triphenylenylene group, a pyrenylene group, a chrysenylene group, a perylenylene group, a pentaphenylene group, a hexacenylene group, a pentacenylene group, a thiophenylene group, a furanylene group, a carbazolylene group, an indolylene group, an isoindolylene group, a benzofuranylene group, a benzothiophenylene group, a dibenzofuranylene group, a dibenzothiophenylene group, a benzocarbazolylene group, a dibenzocarbazolylene group, a dibenzosilolylene group, and a pyridinylene group, each substituted with at least one selected from deuterium, —F, —Cl, —Br, —I, a hydroxyl group, a cyano group, a nitro group, an amidino group, a hydrazino group, a hydrazono group, a $C_1$-$C_{20}$ alkyl group, a $C_1$-$C_{20}$ alkoxy group, a phenyl group, a biphenyl group, a terphenyl group, a naphthyl group, a fluorenyl group, a spiro-bifluorenyl group, a benzofluorenyl group, a dibenzofluorenyl group, a phenanthrenyl group, an anthracenyl group, a fluoranthenyl group, a triphenylenyl group, a pyrenyl group, a chrysenyl group, a perylenyl group, a pentaphenyl group, a hexacenyl group, a pentacenyl group, a thiophenyl group, a furanyl group, a carbazolyl group, an indolyl group, an isoindolyl group, a benzofuranyl group, a benzothiophenyl group, a dibenzofuranyl group, a dibenzothiophenyl group, a benzocarbazolyl group, a dibenzocarbazolyl group, a dibenzosilolyl group, and a pyridinyl group.

In one or more exemplary embodiments, $R_{501}$ and $R_{502}$ in Formula 501 may each independently be selected from:

a phenyl group, a biphenyl group, a terphenyl group, a naphthyl group, a fluorenyl group, a spiro-bifluorenyl group, a benzofluorenyl group, a dibenzofluorenyl group, a phenanthrenyl group, an anthracenyl group, a fluoranthenyl group, a triphenylenyl group, a pyrenyl group, a chrysenyl group, a perylenyl group, a pentaphenyl group, a hexacenyl group, a pentacenyl group, a thiophenyl group, a furanyl group, a carbazolyl group, an indolyl group, an isoindolyl group, a benzofuranyl group, a benzothiophenyl group, a dibenzofuranyl group, a dibenzothiophenyl group, a benzocarbazolyl group, a dibenzocarbazolyl group, a dibenzosilolyl group, and a pyridinyl group; and a phenyl group, a biphenyl group, a terphenyl group, a naphthyl group, a fluorenyl group, a spiro-bifluorenyl group, a benzofluorenyl group, a dibenzofluorenyl group, a phenanthrenyl group, an anthracenyl group, a fluoranthenyl group, a triphenylenyl group, a pyrenyl group, a chrysenyl group, a perylenyl group, a pentaphenyl group, a hexacenyl group, a pentacenyl group, a thiophenyl group, a furanyl group, a carbazolyl group, an indolyl group, an isoindolyl group, a benzofuranyl group, a benzothiophenyl group, a dibenzofuranyl group, a dibenzothiophenyl group, a benzocarbazolyl group, a dibenzocarbazolyl group, a dibenzosilolyl group, and a pyridinyl group, each substituted with at least one selected from deuterium, —F, —Cl, —Br, —I, a hydroxyl group, a cyano group, a nitro group, an amidino group, a hydrazino group, a hydrazono group, a $C_1$-$C_{20}$ alkyl group, a $C_1$-$C_{20}$ alkoxy group, a phenyl group, a biphenyl group, a terphenyl group, a naphthyl group, a fluorenyl group, a spiro-bifluorenyl group, a benzofluorenyl group, a dibenzofluorenyl group, a phenanthrenyl group, an anthracenyl group, a fluoranthenyl group, a triphenylenyl group, a pyrenyl group, a chrysenyl group, a perylenyl group, a pentaphenyl group, a hexacenyl group, a pentacenyl group, a thiophenyl group, a furanyl group, a carbazolyl group, an indolyl group, an isoindolyl group, a benzofuranyl group, a benzothiophenyl group, a dibenzofuranyl group, a dibenzothiophenyl group, a benzocarbazolyl group, a dibenzocarbazolyl group, a dibenzosilolyl group, a pyridinyl group, and —Si($Q_{31}$)($Q_{32}$)($Q_{33}$), and $Q_{31}$ to $Q_{33}$ may each independently be selected from a $C_1$-$C_{10}$ alkyl group, a $C_1$-$C_{10}$ alkoxy group, a phenyl group, a biphenyl group, a terphenyl group, and a naphthyl group.

In one or more exemplary embodiments, xd4 in Formula 501 may be 2, but exemplary embodiments of the inventive concepts are not limited thereto.

For example, the fluorescence emitting material may be selected from Compounds FD1 to FD22:

-continued
FD1
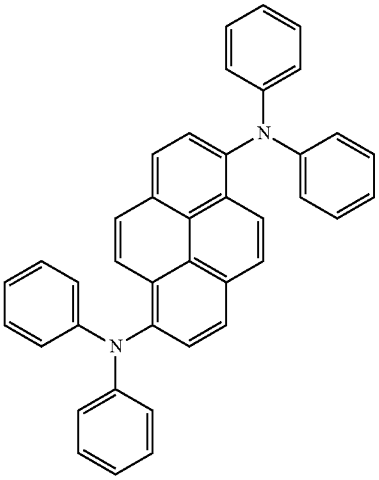
FD2
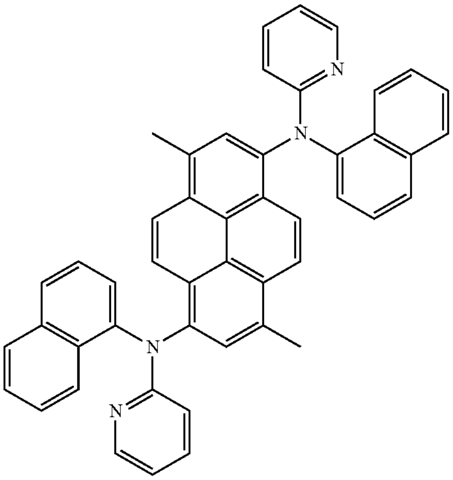
FD3
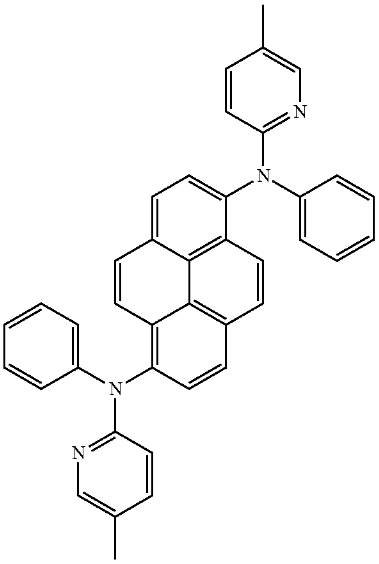
FD4
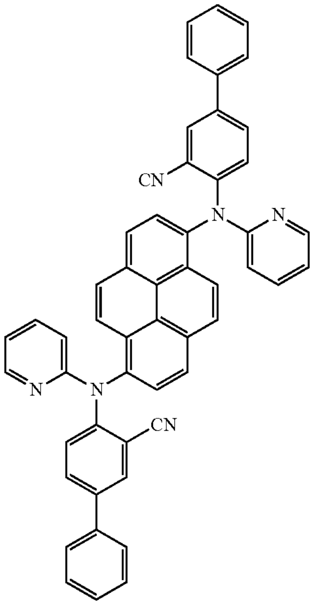
FD5
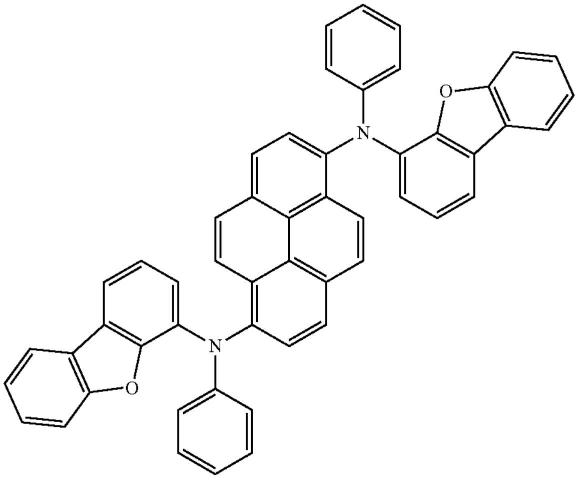
FD6
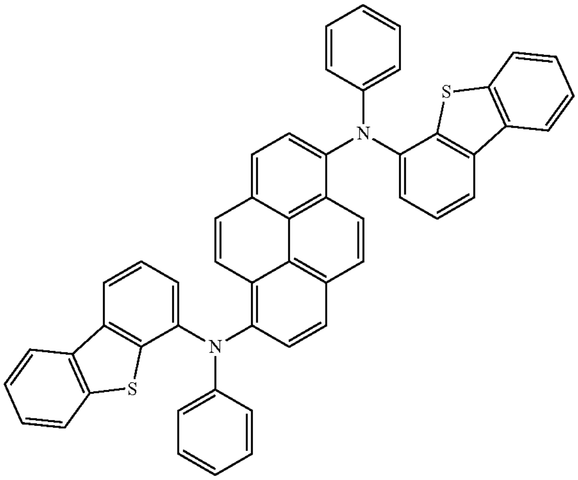

-continued
FD7
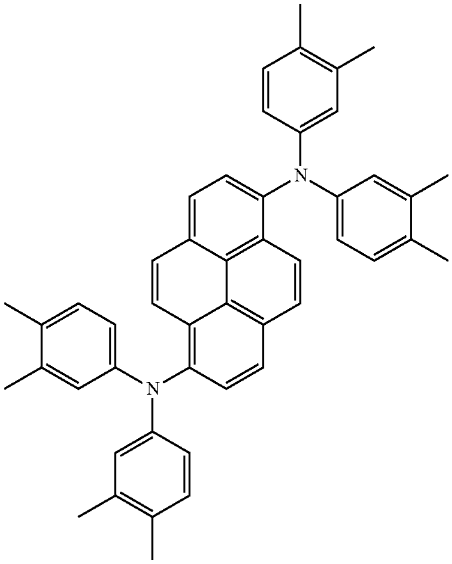
FD8
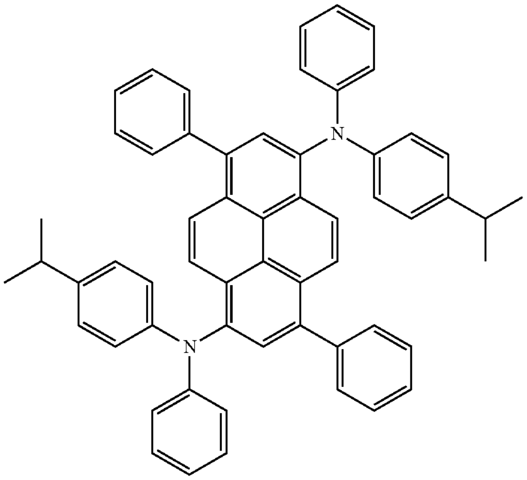
FD9
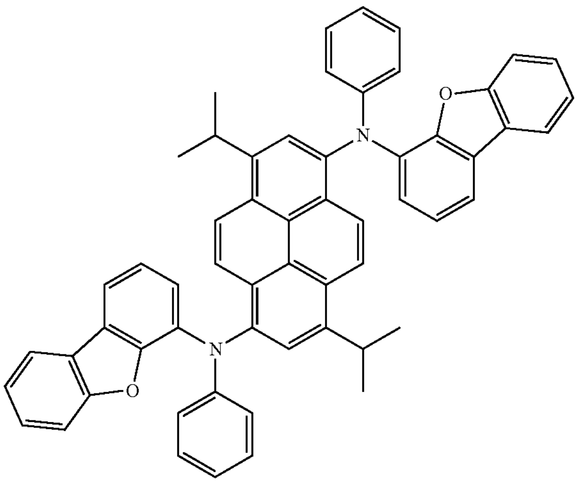
-continued
FD10
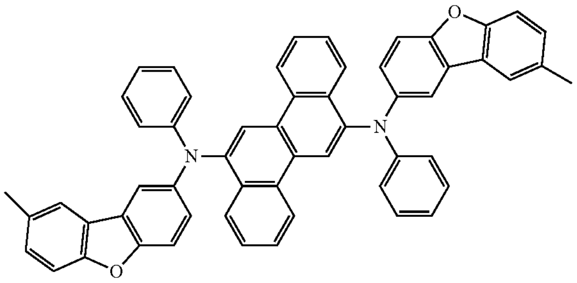
FD11
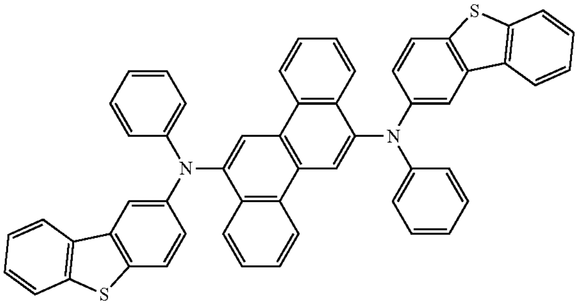
FD12
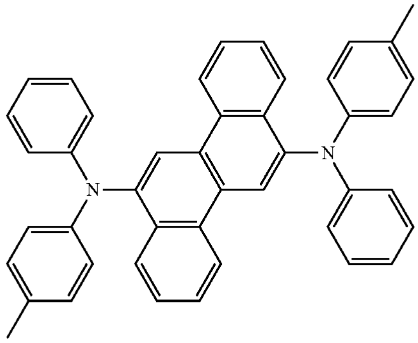
FD13
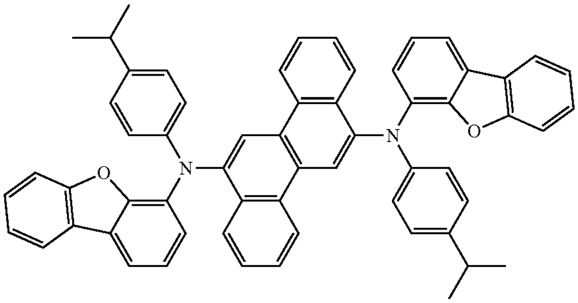
FD14
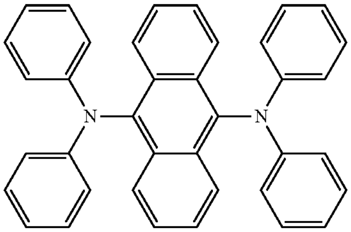

-continued
FD15
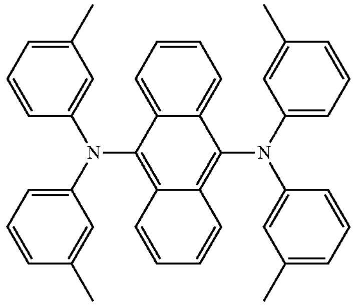
FD16
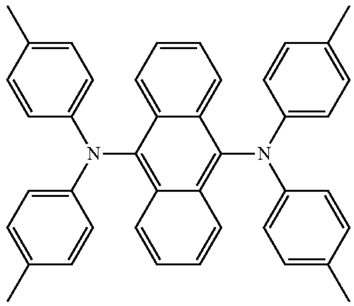
FD17
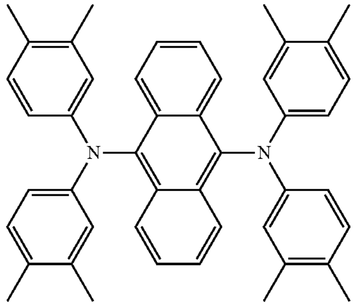
FD18
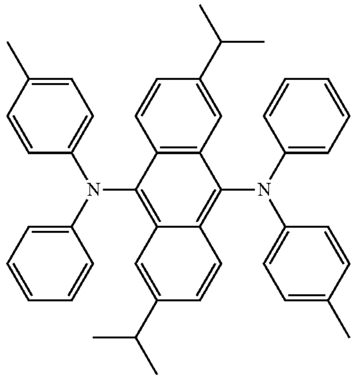
-continued
FD19
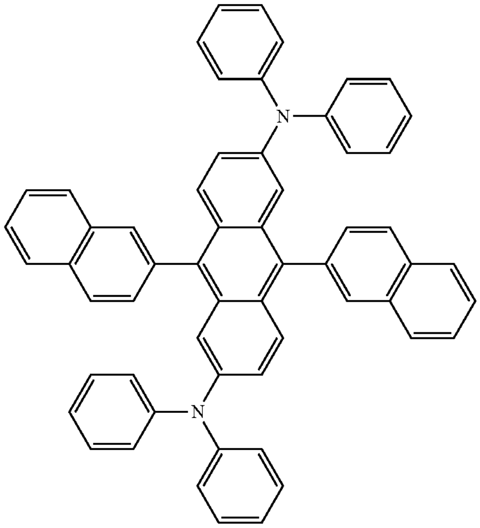
FD20
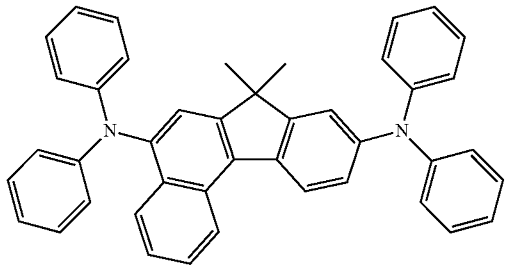
FD21
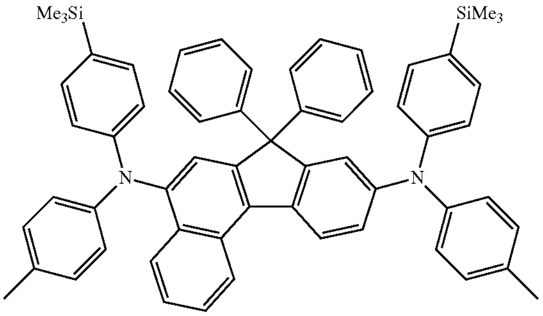
FD22
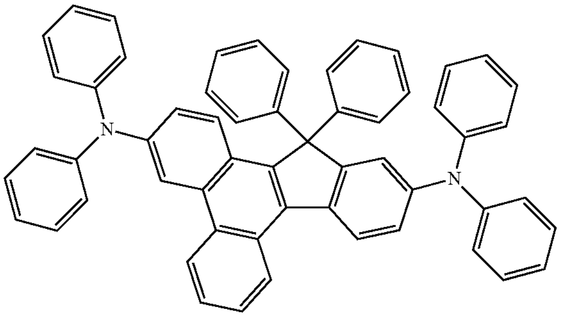
In one exemplary embodiment, the fluorescence emitting material may be selected from the following compounds, but exemplary embodiments of the inventive concepts are not limited thereto:

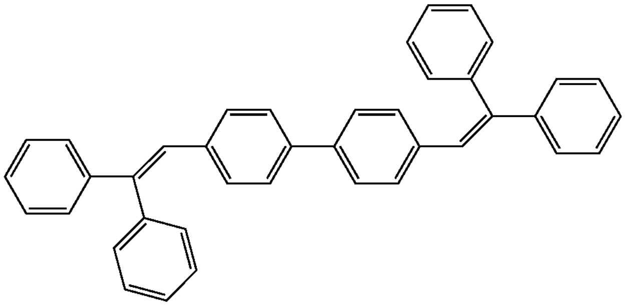
DPVBi
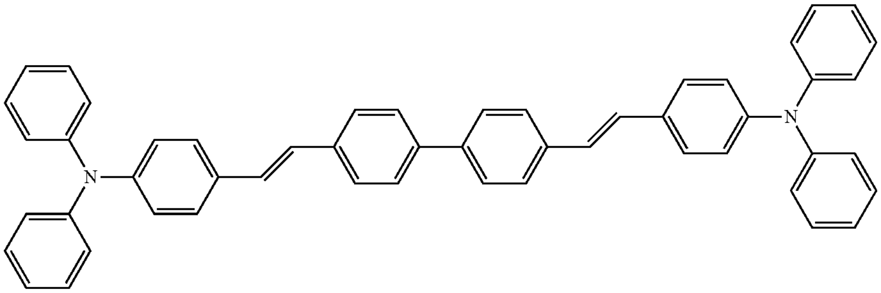
DPAVBi
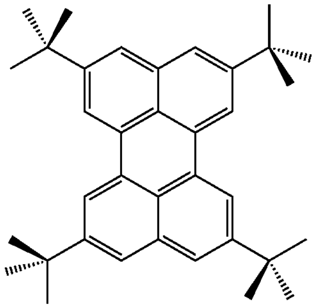
TBPe
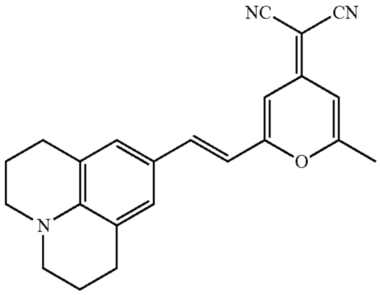
DCM
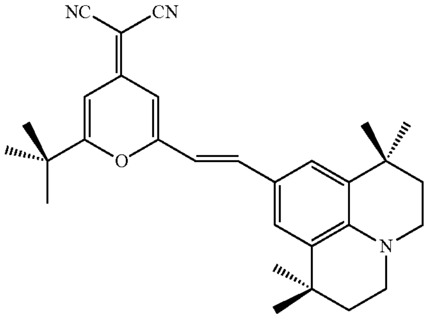
DCJTB
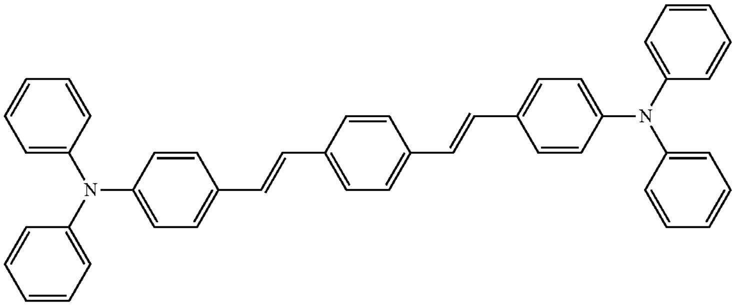
DSA-Ph -continued

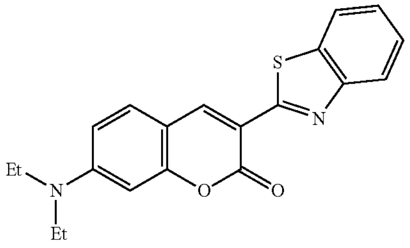

Coumarin 6

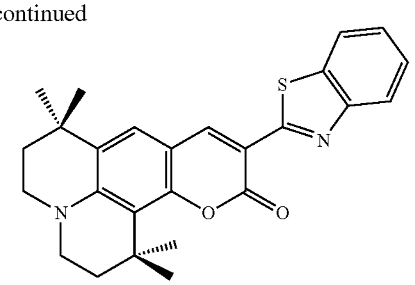

C545T

In one exemplary embodiment, the first quenching material may include a phosphorescence emitting material. In one exemplary embodiment, the phosphorescence emitting material may be used for red or green light emission.

In one exemplary embodiment, the phosphorescence emitting material may be the compound represented by Formula 301.

For example, the phosphorescence emitting material may be selected from Compounds H101 to H119. In one exemplary embodiment, the phosphorescence emitting material may be the organometallic complex represented by Formula 401.

In one exemplary embodiment, the phosphorescence emitting material may be used for red or green light emission. For example, the phosphorescence emitting material may be tris(2-phenylpyridine)iridium(III) ($Ir(ppy)_3$), tris(1-phenylisoquinoline)iridium(III) ($Ir(piq)_3$), bis(2-benzo[b]thiophen-2-yl-pyridine) (acetylacetonate)iridium(III) ($Ir(btp)_2(acac)$), tris(dibenzoylmethane)phenanthroline europium(III) ($Eu(dbm)_3(phen)$), or tris[4,4'-di-tert-butyl-(2,2')-bipyridine]ruthenium(III) ($Ru(dtb\text{-}bpy)_3 \cdot 2(PF_6)$).

In one exemplary embodiment, an amount of the first quenching material may be in a range of about 0.05 parts by weight to about 20 parts by weight based on 100 parts by weight of the first exciton quenching layer. For example, an amount of the first quenching material may be in a range of about 0.1 parts by weight to about 10 parts by weight, for example, about 0.5 parts by weight to about 5 parts by weight, based on 100 parts by weight of the first exciton quenching layer.

In one exemplary embodiment, the first quenching material may be the fluorescence emitting material, and an amount of the first quenching material may be in a range of about 0.1 parts by weight to about 20 parts by weight, for example, about 0.5 parts by weight to about 5 parts by weight, based on 100 parts by weight of the first exciton quenching layer.

In one exemplary embodiment, the first quenching material may be the phosphorescence emitting material, and an amount of the first quenching material may be in a range of about 0.1 parts by weight to about 20 parts by weight, for example, about 0.5 parts by weight to about 2 parts by weight, based on 100 parts by weight of the first exciton quenching layer.

In one exemplary embodiment, a thickness of the first exciton quenching layer may be in a range of about 0.5 nm to about 50 nm. For example, the thickness of the first exciton quenching layer may be in a range of about 1 nm to about 20 nm.

In one exemplary embodiment, a thickness ($D_{Q1}$) of the first exciton quenching layer and a thickness ($D_{E1}$) of the first emission layer may satisfy $D_{E1}$ $D_{Q1}$, and a thickness ($D_{Q1}$) of the first exciton quenching layer and a thickness ($D_{E2}$) of the second emission layer may satisfy $D_{E2} \geq D_{Q1}$.

In one exemplary embodiment, with respect to a length of 100 length % from an interface between the first exciton quenching layer and the first emission layer to an interface between the first exciton quenching layer and the second emission layer, about 50 parts by weight or more among 100 parts by weight of the first quenching material may be included in (i) a region ($M_{0,20}$) in which a length from the interface between the first exciton quenching layer and the first emission layer is in a range of about 0 length % to about 20 length % and (ii) a region ($M_{80,100}$) in which a length from the interface between the first exciton quenching layer and the first emission layer is in a range of about 80 length % to about 100 length %. For example, about 70 parts by weight or more, about 85 parts by weight or more, or about 90 parts by weight or more among 100 parts by weight of the first quenching material may be included in the regions $M_{0,20}$ and $M_{80,100}$.

That is, the concentration gradient may be formed such that the concentration of the first quenching material in the first exciton quenching layer becomes higher as getting closer to the interface between the first exciton quenching layer and the first emission layer and the interface between the first exciton quenching layer and the second emission layer.

In one or more exemplary embodiments, with respect to a length of 100 length % from the interface between the first exciton quenching layer and the first emission layer to the interface between the first exciton quenching layer and the second emission layer, about 70 parts by weight or more among 100 parts by weight of the first quenching material may be included in (i) a region ($M_{0,50}$) in which a length from the interface between the first exciton quenching layer and the first emission layer is in a range of about 0 length % to about 50 length % or (ii) a region ($M_{50,100}$) in which a length from the interface between the first exciton quenching layer and the first emission layer is in a range of about 50 length % to about 100 length %. For example, about 70 parts by weight or more, about 85 parts by weight or more, or about 90 parts by weight or more among 100 parts by weight of the first quenching material may be included in one of the regions $M_{0,50}$ and $M_{50,100}$.

That is, the concentration gradient may be formed such that the concentration of the first quenching material in the first exciton quenching layer becomes higher as getting closer to one of the interface between the first exciton quenching layer and the first emission layer and the interface between the first exciton quenching layer and the second emission layer, and the concentration of the first quenching material in the first exciton quenching layer becomes lower as getting closer to the other thereof.

The organic light-emitting device according to the embodiment may include a first exciton quenching layer between the first emission layer and the second emission layer. In one exemplary embodiment, the first exciton quenching layer may be in direct contact with the first emission layer and the second emission layer.

In one exemplary embodiment, the first exciton quenching layer may further include a third host. In one or more exemplary embodiments, the first exciton quenching layer may further include a third host and a third dopant.

The third host and the third dopant may be a material different from the first quenching material.

The third host may be understood by referring to the description provided with respect to the first host and the second host. In addition, the third dopant may be understood by referring to the description provided with respect to the first dopant and the second dopant.

In one exemplary embodiment, at least one of the first host and the second host may be the same as the third host.

The organic light-emitting device according to the embodiment may include an organic layer including an emission region, and the emission region may include a first emission layer, a second emission layer, and a first exciton quenching layer. The first emission layer may include a first host and a first dopant, and the second emission layer may include a second host and a second dopant.

[Electron Transport Region in Organic Layer]

The electron transport region may have i) a single-layered structure including a single layer including a single material, ii) a single-layered structure including a single layer including a plurality of different materials, or iii) a multi-layered structure having a plurality of layers including a plurality of different materials.

The electron transport region may include at least one layer selected from a buffer layer, an electron control layer, an electron transport layer, and an electron injection layer, but exemplary embodiments of the inventive concepts are not limited thereto.

For example, the electron transport region may have an electron transport layer/electron injection layer structure, an electron transport layer/electron injection layer structure, an electron control layer/electron transport layer/electron injection layer structure, a buffer layer/electron transport layer/electron injection layer structure, a hole blocking layer/electron transport layer/electron injection layer structure, a hole blocking layer/electron control layer/electron transport layer/electron injection layer structure, or a hole blocking layer/buffer layer/electron transport layer/electron injection layer structure, wherein for each structure, constituting layers are sequentially stacked from an emission layer. However, exemplary embodiments of the inventive concepts are not limited thereto.

The electron transport region (for example, a buffer layer, a hole blocking layer, an electron control layer, or an electron transport layer in the electron transport region) may include a metal-free compound containing at least one rr electron-depleted nitrogen-containing ring.

The "π electron-depleted nitrogen-containing ring" indicates a $C_1$-$C_{60}$ heterocyclic group having at least one *—N=*' moiety as a ring-forming moiety.

For example, the "π electron-depleted nitrogen-containing ring" may be i) a 5-membered to 7-membered heteromonocyclic group having at least one *—N=*' moiety, ii) a heteropolycyclic group in which two or more 5-membered to 7-membered heteromonocyclic groups each having at least one *—N=*' moiety are condensed with each other, or iii) a heteropolycyclic group in which at least one of 5-membered to 7-membered heteromonocyclic groups, each having at least one *—N=*' moiety, is condensed with at least one $C_5$-$C_{60}$ carbocyclic group.

Examples of the π electron-depleted nitrogen-containing ring include an imidazole, a pyrazole, a thiazole, an isothiazole, an oxazole, an isoxazole, a pyridine, a pyrazine, a pyrimidine, a pyridazine, an indazole, a purine, a quinoline, an isoquinoline, a benzoquinoline, a phthalazine, a naphthyridine, a quinoxaline, a quinazoline, a cinnoline, a phenanthridine, an acridine, a phenanthroline, a phenazine, a benzimidazole, an isobenzothiazole, a benzoxazole, an isobenzoxazole, a triazole, a tetrazole, an oxadiazole, a triazine, a thiadiazole, an imidazopyridine, an imidazopyrimidine, and an azacarbazole, but are not limited thereto.

For example, the electron transport region may include a compound represented by Formula 601:

$$[Ar_{601}]_{xe11}\text{-}[(L_{601})_{xe1}\text{-}R_{601}]_{xe21}$$ <Formula 601>

In Formula 601, $Ar_{601}$ may be a substituted or unsubstituted $C_5$-$C_{60}$ carbocyclic group or a substituted or unsubstituted $C_1$-$C_{60}$ heterocyclic group, xe11 may be 1, 2, or 3, $L_{601}$ may be selected from a substituted or unsubstituted $C_3$-$C_{10}$ cycloalkylene group, a substituted or unsubstituted $C_1$-$C_{10}$ heterocycloalkylene group, a substituted or unsubstituted $C_3$-$C_{10}$ cycloalkenylene group, a substituted or unsubstituted $C_1$-$C_{10}$ heterocycloalkenylene group, a substituted or unsubstituted $C_6$-$C_{60}$ arylene group, a substituted or unsubstituted $C_1$-$C_{60}$ heteroarylene group, a substituted or unsubstituted divalent non-aromatic condensed polycyclic group, and a substituted or unsubstituted divalent non-aromatic condensed heteropolycyclic group, xe1 may be an integer from 0 to 5, $R_{601}$ may be selected from a substituted or unsubstituted $C_3$-$C_{10}$ cycloalkyl group, a substituted or unsubstituted $C_1$-$C_{10}$ heterocycloalkyl group, a substituted or unsubstituted $C_3$-$C_{10}$ cycloalkenyl group, a substituted or unsubstituted $C_1$-$C_{10}$ heterocycloalkenyl group, a substituted or unsubstituted $C_6$-$C_{60}$ aryl group, a substituted or unsubstituted $C_6$-$C_{60}$ aryloxy group, a substituted or unsubstituted $C_6$-$C_{60}$ arylthio group, a substituted or unsubstituted $C_1$-$C_{60}$ heteroaryl group, a substituted or unsubstituted monovalent non-aromatic condensed polycyclic group, a substituted or unsubstituted monovalent non-aromatic condensed heteropolycyclic group, $—Si(Q_{601})(Q_{602})(Q_{603})$, $—C(=O)(Q_{601})$, $—S(=O)_2(Q_{601})$, and $—P(=O)(Q_{601})(Q_{602})$, $Q_{601}$ to $Q_{603}$ may each independently be a $C_1$-$C_{10}$ alkyl group, a $C_1$-$C_{10}$ alkoxy group, a phenyl group, a biphenyl group, a terphenyl group, or a naphthyl group, and xe21 may be an integer from 1 to 5.

In one exemplary embodiment, at least one of $Ar_{601}$(s) in the number of xe11 and $R_{601}$(s) in the number of xe21 may include the π electron-depleted nitrogen-containing ring.

In one exemplary embodiment, $Ar_{601}$ in Formula 601 may be selected from:

a benzene group, a naphthalene group, a fluorene group, a spiro-bifluorene group, a benzofluorene group, a dibenzofluorene group, a phenalene group, a phenanthrene group, an anthracene group, a fluoranthene group, a triphenylene group, a pyrene group, a chrysene group, a naphthacene group, a picene group, a perylene group, a pentaphene group, an indenoanthracene group, a dibenzofuran group, a dibenzothiophene group, a carbazole group, an imidazole group, a pyrazole group, a thiazole group, an isothiazole group, an oxazole group, an isoxazole group, a pyridine group, a pyrazine group, a pyrimidine group, a pyridazine group, an indazole group, a purine group, a quinoline group, an isoquinoline group, a benzoquinoline group, a phthalazine group, a naphthyridine group, a quinoxaline group, a quinazoline group, a cinnoline group, a phenanthridine group, an acridine group, a phenanthroline group, a phenazine group, a benzimidazole group, an isobenzothiazole group, a benzoxazole group, an isobenzoxazole group, a triazole group, a tetrazole group, an oxadiazole group, a triazine group, a thiadiazole group, an imidazopyridine group, an imidazopyrimidine group, and an azacarbazole group; and a benzene group, a naphthalene group, a fluorene group, a spiro-bifluorene group, a benzofluorene group, a dibenzofluorene group, a phenalene group, a phenanthrene group, an anthracene group, a fluoranthene group, a triphenylene group, a pyrene group, a chrysene group, a naphthacene group, a picene group, a perylene group, a pentaphene group, an indenoanthracene group, a dibenzofuran group, a dibenzothiophene group, a carbazole group, an imidazole group, a pyrazole group, a thiazole group, an isothiazole group, an oxazole group, an isoxazole group, a pyridine group, a pyrazine group, a pyrimidine group, a pyridazine group, an indazole group, a purine group, a quinoline group, an isoquinoline group, a benzoquinoline group, a phthalazine group, a naphthyridine group, a quinoxaline group, a quinazoline group, a cinnoline group, a phenanthridine group, an acridine group, a phenanthroline group, a phenazine group, a benzimidazole group, an isobenzothiazole group, a benzoxazole group, an isobenzoxazole group, a triazole group, a tetrazole group, an oxadiazole group, a triazine group, a thiadiazole group, an imidazopyridine group, an imidazopyrimidine group, and an azacarbazole group, each substituted with at least one selected from deuterium, —F, —Cl, —Br, —I, a hydroxyl group, a cyano group, a nitro group, an amidino group, a hydrazino group, a hydrazono group, a $C_1$-$C_{20}$ alkyl group, a $C_1$-$C_{20}$ alkoxy group, a phenyl group, a biphenyl group, a terphenyl group, a naphthyl group, —$Si(Q_{31})(Q_{32})(Q_{33})$, —$S(=O)_2(Q_{31})$, and —$P(=O)(Q_{31})(Q_{32})$, and $Q_{31}$ to $Q_{33}$ may each independently be selected from a $C_1$-$C_{10}$ alkyl group, a $C_1$-$C_{10}$ alkoxy group, a phenyl group, a biphenyl group, a terphenyl group, and a naphthyl group.

When xe11 in Formula 601 is two or more, two or more $Ar_{601}$(s) may be linked via a single bond.

In one or more exemplary embodiments, $Ar_{601}$ in Formula 601 may be an anthracene group.

In one or more exemplary embodiments, the compound represented by Formula 601 may be represented by Formula 601-1:

<Formula 601-1>

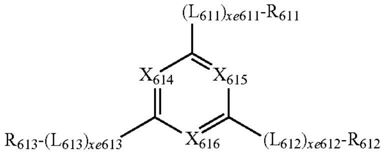

In Formula 601-1, $X_{614}$ may be N or $C(R_{614})$, $X_{615}$ may be N or $C(R_{615})$, and $X_{616}$ may be N or $C(R_{616})$, wherein at least one selected from $X_{614}$ to $X_{616}$ may be N, $L_{611}$ to $L_{613}$ may each independently be the same as defined in connection with $L_{601}$, xe611 to xe613 may each independently be the same as defined in connection with xe1, $R_{611}$ to $R_{613}$ may each independently be the same as defined in connection with $R_{601}$, and $R_{614}$ to $R_{616}$ may each independently be selected from hydrogen, deuterium, —F, —Cl, —Br, —I, a hydroxyl group, a cyano group, a nitro group, an amidino group, a hydrazino group, a hydrazono group, a $C_1$-$C_{20}$ alkyl group, a $C_1$-$C_{20}$ alkoxy group, a phenyl group, a biphenyl group, a terphenyl group, and a naphthyl group.

In one exemplary embodiment, $L_{601}$ and $L_{611}$ to $L_{613}$ in Formulae 601 and 601-1 may each independently be selected from:

a phenylene group, a naphthylene group, a fluorenylene group, a spiro-bifluorenylene group, a benzofluorenylene group, a dibenzofluorenylene group, a phenanthrenylene group, an anthracenylene group, a fluoranthenylene group, a triphenylenylene group, a pyrenylene group, a chrysenylene group, a perylenylene group, a pentaphenylene group, a hexacenylene group, a pentacenylene group, a thiophenylene group, a furanylene group, a carbazolylene group, an indolylene group, an isoindolylene group, a benzofuranylene group, a benzothiophenylene group, a dibenzofuranylene group, a dibenzothiophenylene group, a benzocarbazolylene group, a dibenzocarbazolylene group, a dibenzosilolylene group, a pyridinylene group, an imidazolylene group, a pyrazolylene group, a thiazolylene group, an isothiazolylene group, an oxazolylene group, an isoxazolylene group, a thiadiazolylene group, an oxadiazolylene group, a pyrazinylene group, a pyrimidinylene group, a pyridazinylene group, a triazinylene group, a quinolinylene group, an isoquinolinylene group, a benzoquinolinylene group, a phthalazinylene group, a naphthyridinylene group, a quinoxalinylene group, a quinazolinylene group, a cinnolinylene group, a phenanthridinylene group, an acridinylene group, a phenanthrolinylene group, a phenazinylene group, a benzimidazolylene group, an isobenzothiazolylene group, a benzoxazolylene group, an isobenzoxazolylene group, a triazolylene group, a tetrazolylene group, an imidazopyridinylene group, an imidazopyrimidinylene group, and an azacarbazolylene group; and a phenylene group, a naphthylene group, a fluorenylene group, a spiro-bifluorenylene group, a benzofluorenylene group, a dibenzofluorenylene group, a phenanthrenylene group, an anthracenylene group, a fluoranthenylene group, a triphenylenylene group, a pyrenylene group, a chrysenylene group, a perylenylene group, a pentaphenylene group, a hexacenylene group, a pentacenylene group, a thiophenylene group, a furanylene group, a carbazolylene group, an indolylene group, an isoindolylene group, a benzofuranylene group, a benzothiophenylene group, a dibenzofuranylene group, a dibenzothiophenylene group, a benzocarbazolylene group, a dibenzocarbazolylene group, a dibenzosilolylene group, a pyridinylene group, an imidazolylene group, a pyrazolylene group, a thiazolylene group, an isothiazolylene group, an oxazolylene group, an isoxazolylene group, a thiadiazolylene group, an oxadiazolylene group, a pyrazinylene group, a pyrimidinylene group, a pyridazinylene group, a triazinylene group, a quinolinylene group, an isoquinolinylene group, a benzoquinolinylene group, a phthalazinylene group, a naphthyridinylene group, a quinoxalinylene group, a quinazolinylene group, a cinnolinylene group, a phenanthridinylene group, an acridinylene group, a phenanthrolinylene group, a phenazinylene group, a benzimidazolylene group, an isobenzothiazolylene group, a benzoxazolylene group, an isobenzoxazolylene group, a triazolylene group, a tetrazolylene group, an imidazopyridinylene group, an imidazopyrimidinylene group, and an azacarbazolylene group, each substituted with at least one selected from deuterium, —F, —Cl, —Br, —I, a hydroxyl group, a cyano group, a nitro group, an amidino group, a hydrazino group, a hydrazono group, a $C_1$-$C_{20}$ alkyl group, a $C_1$-$C_{20}$ alkoxy group, a phenyl group, a biphenyl group, a terphenyl group, a naphthyl group, a fluorenyl group, a spiro-bifluorenyl group, a benzofluorenyl group, a dibenzofluorenyl group, a phenanthrenyl group, an anthracenyl group, a fluoranthenyl group, a triphenylenyl group, a pyrenyl group, a chrysenyl group, a perylenyl group, a pentaphenyl group, a hexacenyl group, a pentacenyl group, a thiophenyl group, a furanyl group, a carbazolyl group, an indolyl group, an isoindolyl group, a benzofuranyl group, a benzothiophenyl group, a dibenzofuranyl group, a dibenzothiophenyl group, a benzocarbazolyl group, a dibenzocarbazolyl group, a dibenzosilolyl group, a pyridinyl group, an imidazolyl group, a pyrazolyl group, a thiazolyl group, an isothiazolyl group, an oxazolyl group, an isoxazolyl group, a thiadiazolyl group, an oxadiazolyl group, a pyrazinyl group, a pyrimidinyl group, a pyridazinyl group, a triazinyl group, a quinolinyl group, an isoquinolinyl group, a benzoquinolinyl group, a phthalazinyl group, a naphthyridinyl group, a quinoxalinyl group, a quinazolinyl group, a cinnolinyl group, a phenanthridinyl group, an acridinyl group, a phenanthrolinyl group, a phenazinyl group, a benzimidazolyl group, an isobenzothiazolyl group, a benzoxazolyl group, an isobenzoxazolyl group, a triazolyl group, a tetrazolyl group, an imidazopyridinyl group, an imidazopyrimidinyl group, and an azacarbazolyl group, but exemplary embodiments of the inventive concepts are not limited thereto.

In one or more exemplary embodiments, xe1 and xe611 to xe613 in Formulae 601 and 601-1 may each independently be 0, 1, or 2.

In one or more exemplary embodiments, $R_{601}$ and $R_{611}$ to $R_{613}$ in Formulae 601 and 601-1 may each independently be selected from:

a phenyl group, a biphenyl group, a terphenyl group, a naphthyl group, a fluorenyl group, a spiro-bifluorenyl group, a benzofluorenyl group, a dibenzofluorenyl group, a phenanthrenyl group, an anthracenyl group, a fluoranthenyl group, a triphenylenyl group, a pyrenyl group, a chrysenyl group, a perylenyl group, a pentaphenyl group, a hexacenyl group, a pentacenyl group, a thiophenyl group, a furanyl group, a carbazolyl group, an indolyl group, an isoindolyl group, a benzofuranyl group, a benzothiophenyl group, a dibenzofuranyl group, a dibenzothiophenyl group, a benzocarbazolyl group, a dibenzocarbazolyl group, a dibenzosilolyl group, a pyridinyl group, an imidazolyl group, a pyrazolyl group, a thiazolyl group, an isothiazolyl group, an oxazolyl group, an isoxazolyl group, a thiadiazolyl group, an oxadiazolyl group, a pyrazinyl group, a pyrimidinyl group, a pyridazinyl group, a triazinyl group, a quinolinyl group, an isoquinolinyl group, a benzoquinolinyl group, a phthalazinyl group, a naphthyridinyl group, a quinoxalinyl group, a quinazolinyl group, a cinnolinyl group, a phenanthridinyl group, an acridinyl group, a phenanthrolinyl group, a phenazinyl group, a benzimidazolyl group, an isobenzothiazolyl group, a benzoxazolyl group, an isobenzoxazolyl group, a triazolyl group, a tetrazolyl group, an imidazopyridinyl group, an imidazopyrimidinyl group, and an azacarbazolyl group;

a phenyl group, a biphenyl group, a terphenyl group, a naphthyl group, a fluorenyl group, a spiro-bifluorenyl group, a benzofluorenyl group, a dibenzofluorenyl group, a phenanthrenyl group, an anthracenyl group, a fluoranthenyl group, a triphenylenyl group, a pyrenyl group, a chrysenyl group, a perylenyl group, a pentaphenyl group, a hexacenyl group, a pentacenyl group, a thiophenyl group, a furanyl group, a carbazolyl group, an indolyl group, an isoindolyl group, a benzofuranyl group, a benzothiophenyl group, a dibenzofuranyl group, a dibenzothiophenyl group, a benzocarbazolyl group, a dibenzocarbazolyl group, a dibenzosilolyl group, a pyridinyl group, an imidazolyl group, a pyrazolyl group, a thiazolyl group, an isothiazolyl group, an oxazolyl group, an isoxazolyl group, a thiadiazolyl group, an oxadiazolyl group, a pyrazinyl group, a pyrimidinyl group, a pyridazinyl group, a triazinyl group, a quinolinyl group, an isoquinolinyl group, a benzoquinolinyl group, a phthalazinyl group, a naphthyridinyl group, a quinoxalinyl group, a quinazolinyl group, a cinnolinyl group, a phenanthridinyl group, an acridinyl group, a phenanthrolinyl group, a phenazinyl group, a benzimidazolyl group, an isobenzothiazolyl group, a benzoxazolyl group, an isobenzoxazolyl group, a triazolyl group, a tetrazolyl group, an imidazopyridinyl group, an imidazopyrimidinyl group, and an azacarbazolyl group, each substituted with at least one selected from deuterium, —F, —Cl, —Br, —I, a hydroxyl group, a cyano group, a nitro group, an amidino group, a hydrazino group, a hydrazono group, a $C_1$-$C_{20}$ alkyl group, a $C_1$-$C_{20}$ alkoxy group, a phenyl group, a biphenyl group, a terphenyl group, a naphthyl group, a fluorenyl group, a spiro-bifluorenyl group, a benzofluorenyl group, a dibenzofluorenyl group, a phenanthrenyl group, an anthracenyl group, a fluoranthenyl group, a triphenylenyl group, a pyrenyl group, a chrysenyl group, a perylenyl group, a pentaphenyl group, a hexacenyl group, a pentacenyl group, a thiophenyl group, a furanyl group, a carbazolyl group, an indolyl group, an isoindolyl group, a benzofuranyl group, a benzothiophenyl group, a dibenzofuranyl group, a dibenzothiophenyl group, a benzocarbazolyl group, a dibenzocarbazolyl group, a dibenzosilolyl group, a pyridinyl group, an imidazolyl group, a pyrazolyl group, a thiazolyl group, an isothiazolyl group, an oxazolyl group, an isoxazolyl group, a thiadiazolyl group, an oxadiazolyl group, a pyrazinyl group, a pyrimidinyl group, a pyridazinyl group, a triazinyl group, a quinolinyl group, an isoquinolinyl group, a benzoquinolinyl group, a phthalazinyl group, a naphthyridinyl group, a quinoxalinyl group, a quinazolinyl group, a cinnolinyl group, a phenanthridinyl group, an acridinyl group, a phenanthrolinyl group, a phenazinyl group, a benzimidazolyl group, an isobenzothiazolyl group, a benzoxazolyl group, an isobenzoxazolyl group, a triazolyl group, a tetrazolyl group, an imidazopyridinyl group, an imidazopyrimidinyl group, and an azacarbazolyl group; and —Si($Q_{601}$)($Q_{602}$)(Q603), —S(=O)$_2$(Q601), and —P(=O)($Q_{601}$)($Q_{602}$), and $Q_{601}$ to $Q_{603}$ are the same as described above.

The electron transport region may include at least one compound selected from Compounds ET1 to ET36, but exemplary embodiments of the inventive concepts are not limited thereto:

ET1

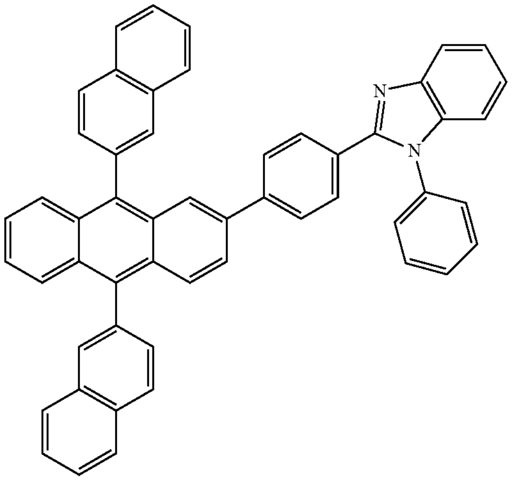

ET2

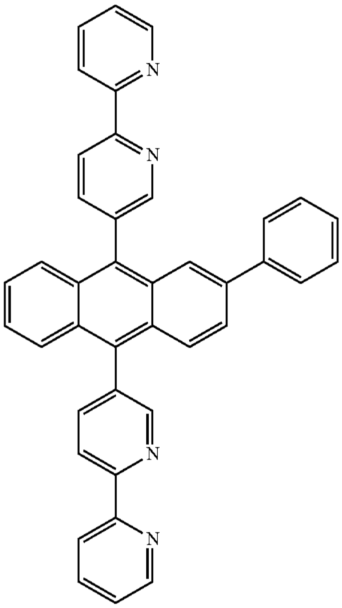

-continued

ET3

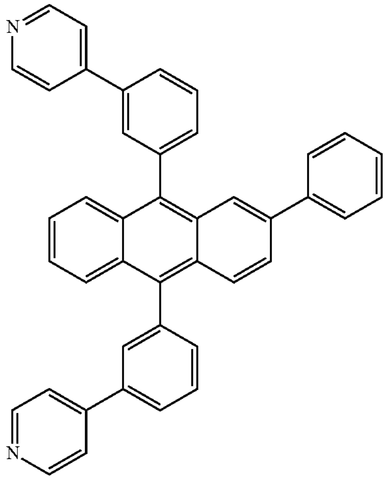

ET4

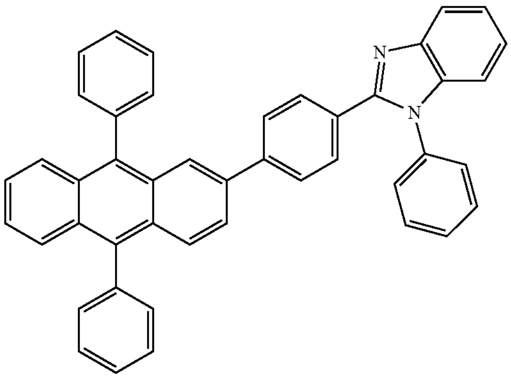

ET5

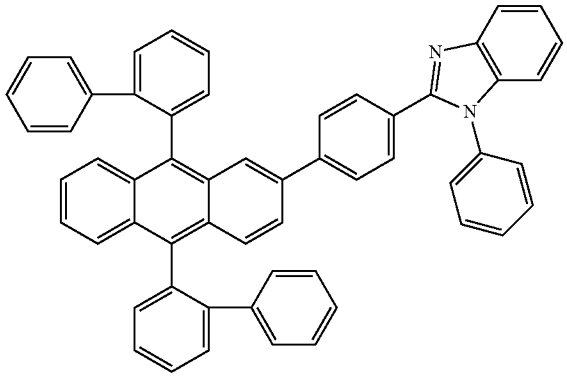

-continued
ET6
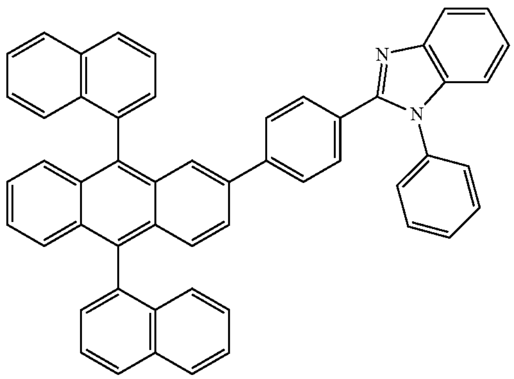
ET7
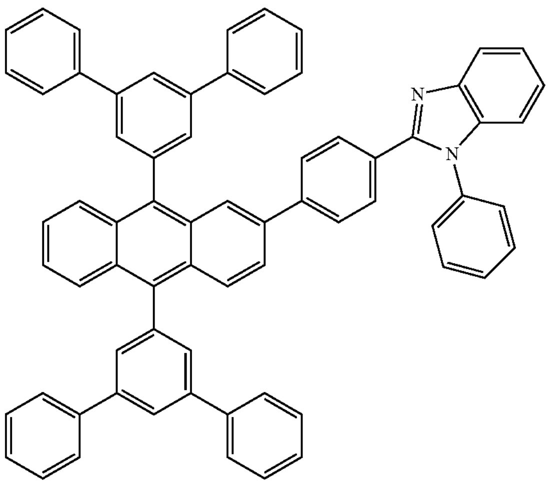
ET8
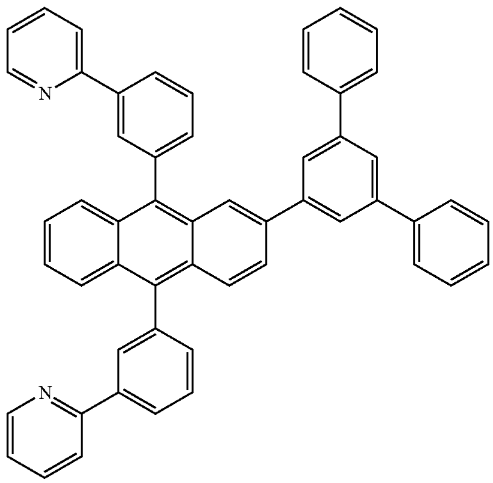
-continued
ET9
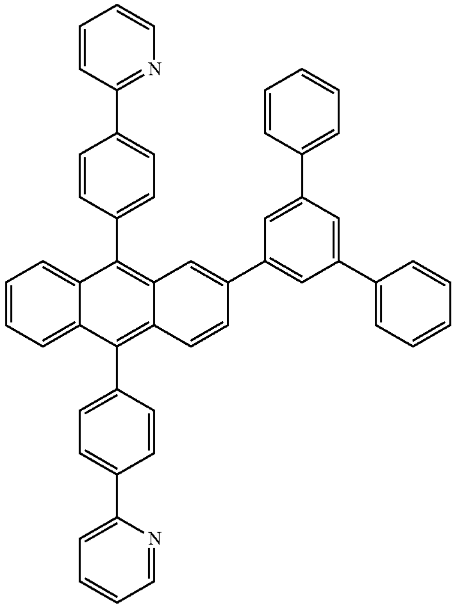
ET10
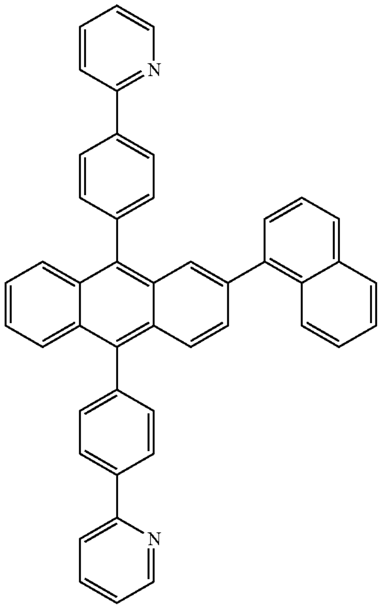

-continued
ET11
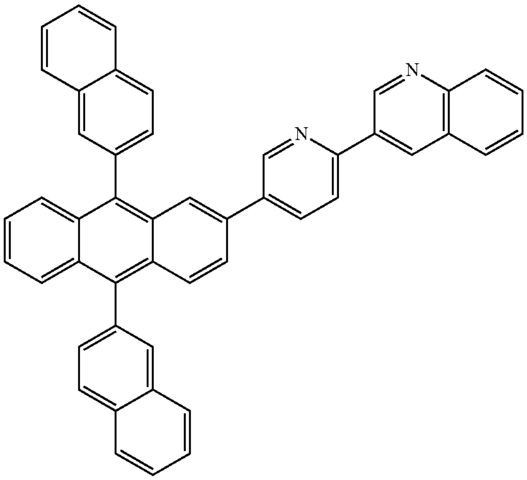
ET12
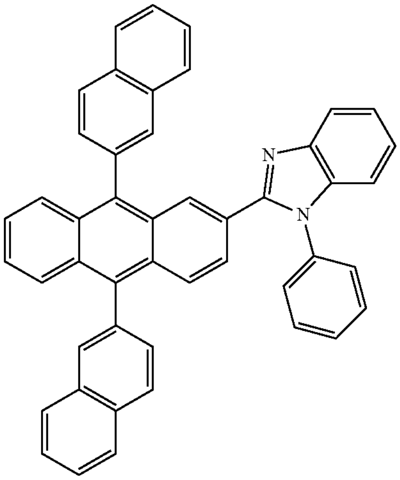
ET13
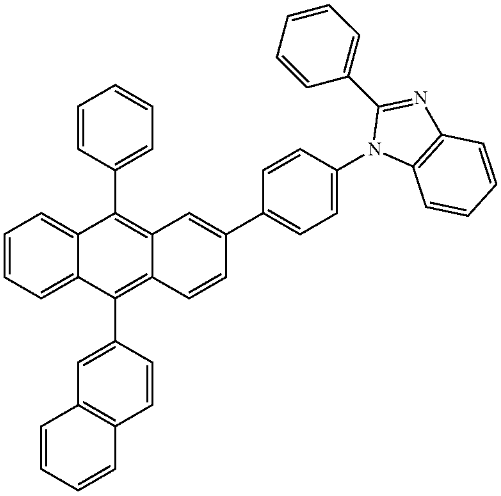
-continued
ET14
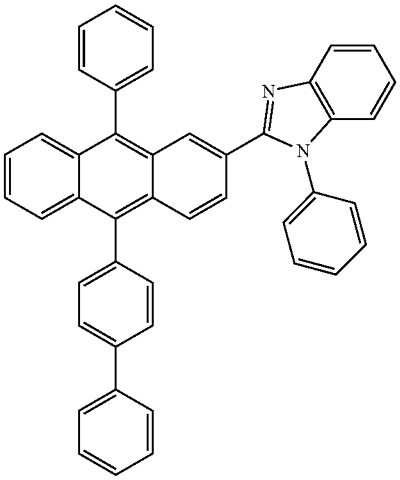
ET15
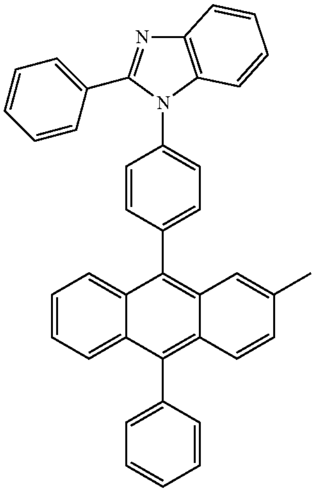
ET16
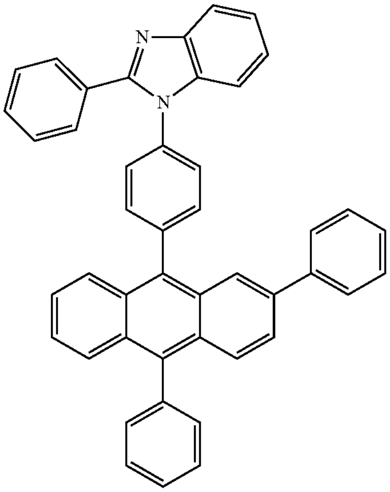

-continued
ET17
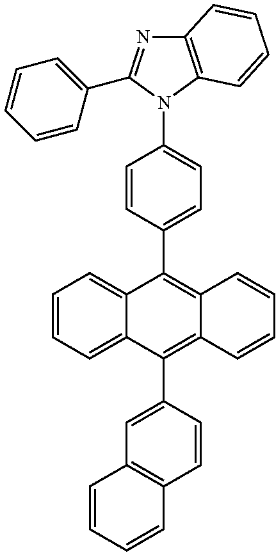
ET18
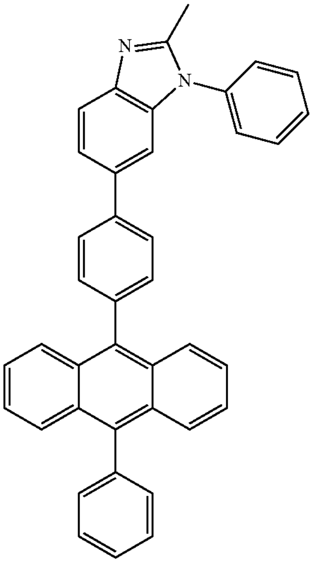
ET19
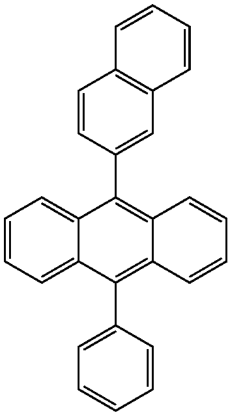
-continued
ET20
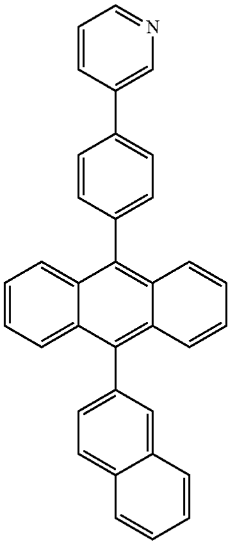
ET21
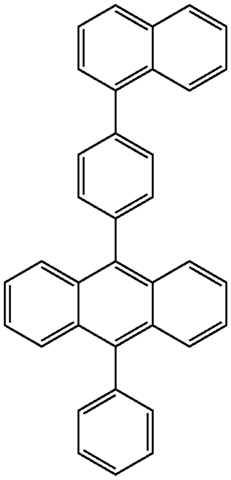
ET22
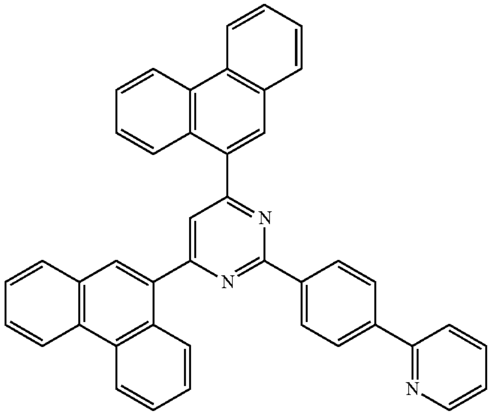

-continued
ET23
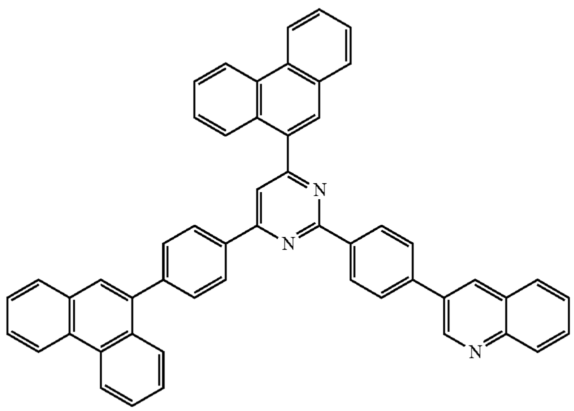
ET24
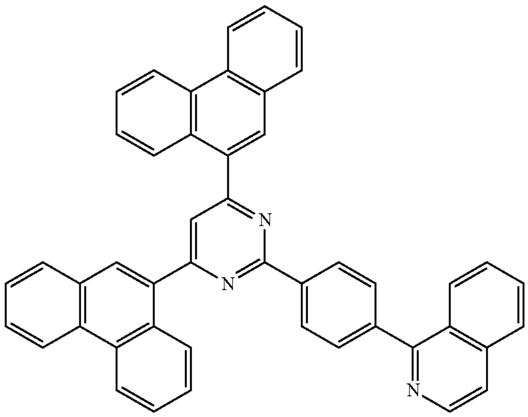
ET25
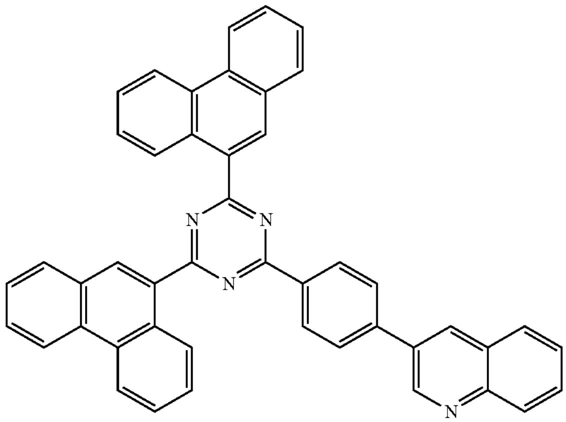
-continued
ET26
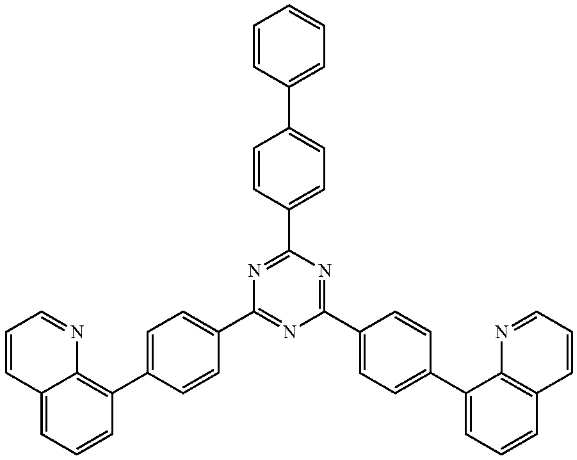
ET27
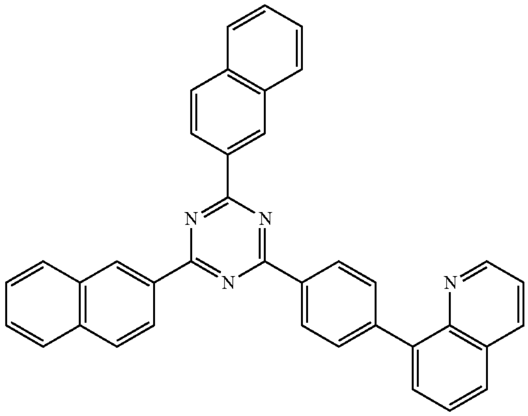
ET28
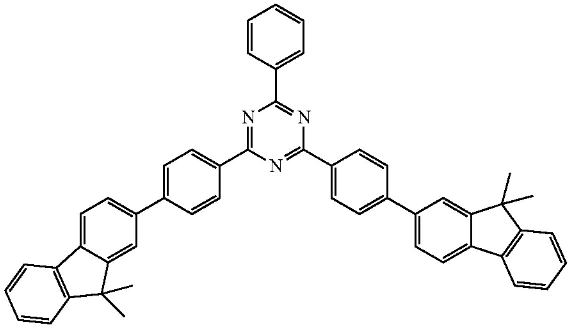

ET29
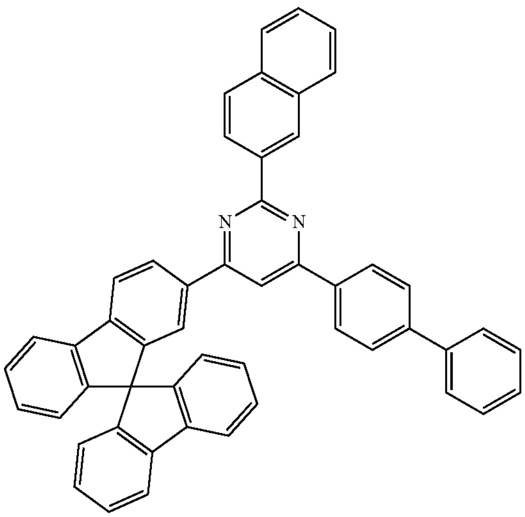
ET30
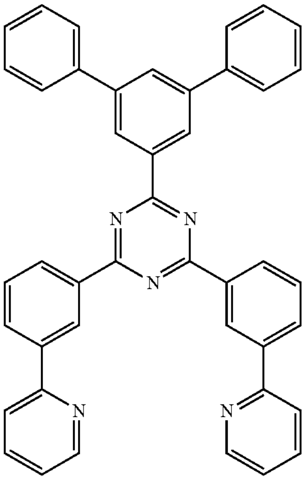
ET31
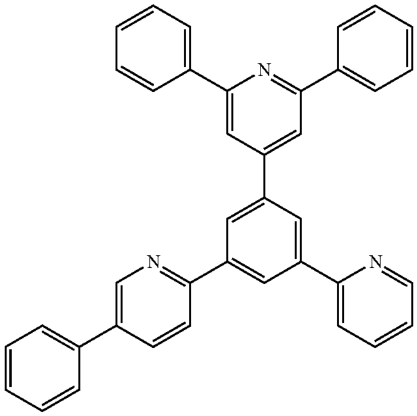
ET32
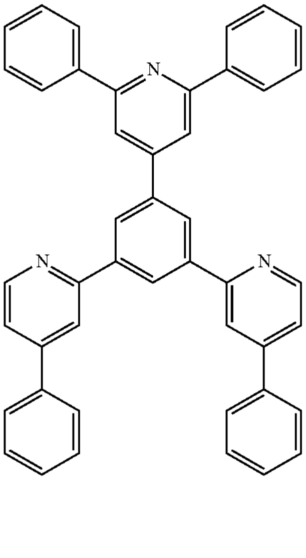
ET33
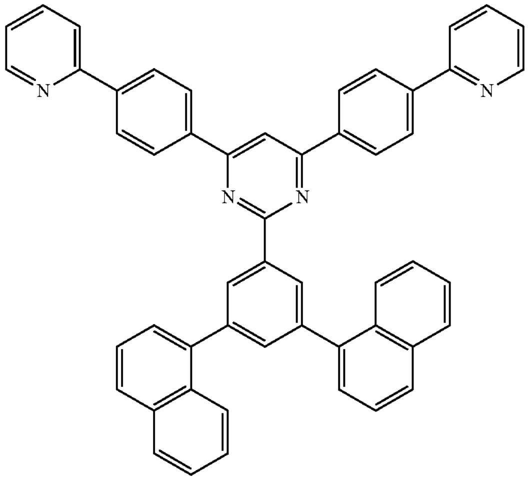
ET34
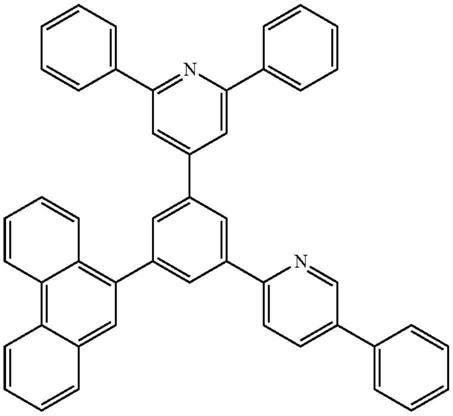

-continued
ET35
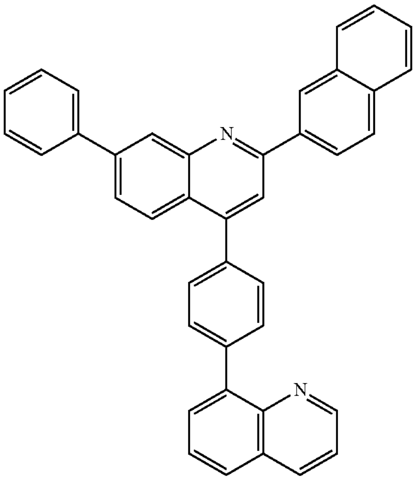
ET36
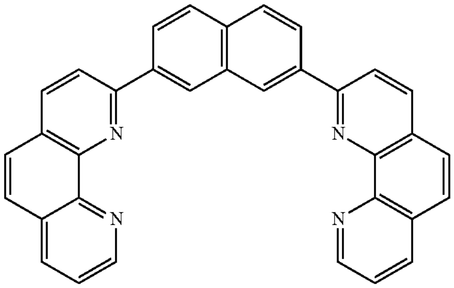
In one or more exemplary embodiments, the electron transport region may include at least one compound selected from 2,9-dimethyl-4,7-diphenyl-1,10-phenanthroline (BCP), 4,7-diphenyl-1,10-phenanthroline (Bphen), $Alq_3$, BAlq, 3-(biphenyl-4-yl)-5-(4-tert-butylphenyl)-4-phenyl-4H-1,2,4-triazole (TAZ), and NTAZ:
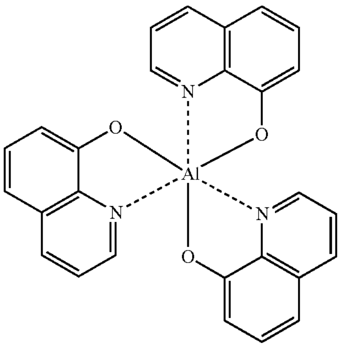
$Alq_3$
-continued
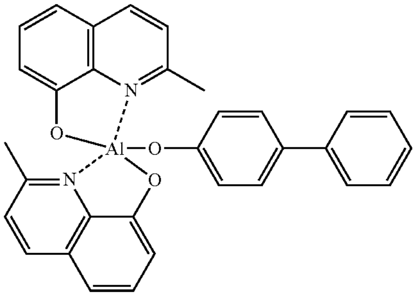
BAlq
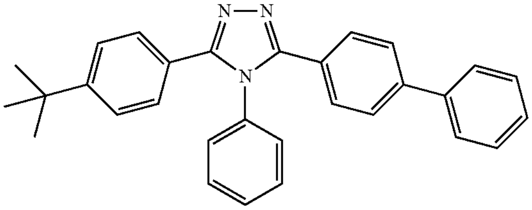
TAZ
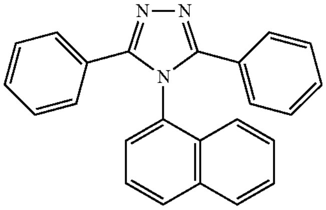
NTAZ
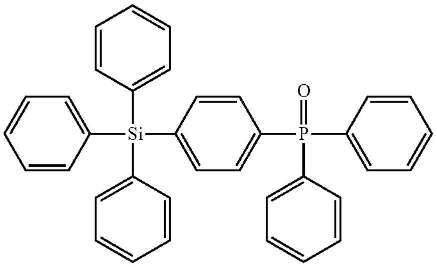
TSPO1
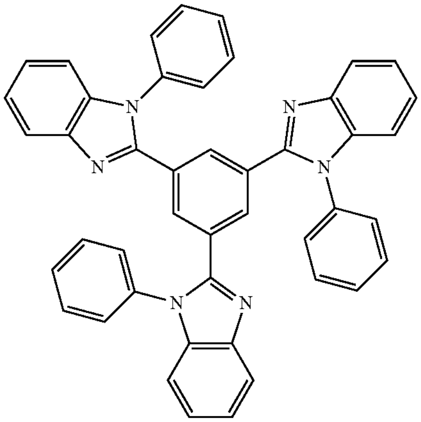
TPBI -continued

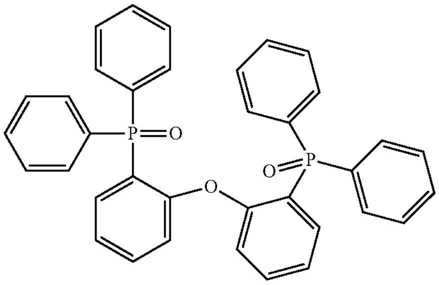

DPEPO

Thicknesses of the buffer layer, the hole blocking layer, and the electron control layer may each be in a range of about 20 Å to about 1,000 Å, for example, about 30 Å to about 300 Å. When the thicknesses of the buffer layer, the hole blocking layer, and the electron control layer are within these ranges, the electron transport region may have excellent hole blocking characteristics or electron control characteristics without a substantial increase in driving voltage.

A thickness of the electron transport layer may be in a range of about 100 Å to about 1,000 Å, for example, about 150 Å to about 500 Å. When the thickness of the electron transport layer is within the range described above, the electron transport layer may have satisfactory electron transport characteristics without a substantial increase in driving voltage.

The electron transport region (for example, the electron transport layer in the electron transport region) may further include, in addition to the materials described above, a metal-containing material.

The metal-containing material may include at least one selected from alkali metal complex and alkaline earth-metal complex. The alkali metal complex may include a metal ion selected from a Li ion, a Na ion, a K ion, a Rb ion, and a Cs ion, and the alkaline earth-metal complex may include a metal ion selected from a Be ion, a Mg ion, a Ca ion, a Sr ion, and a Ba ion. A ligand coordinated with the metal ion of the alkali metal complex or the alkaline earth-metal complex may be selected from a hydroxy quinoline, a hydroxy isoquinoline, a hydroxy benzoquinoline, a hydroxy acridine, a hydroxy phenanthridine, a hydroxy phenyloxazole, a hydroxy phenylthiazole, a hydroxy diphenyloxadiazole, a hydroxy diphenylthiadiazole, a hydroxy phenylpyridine, a hydroxy phenylbenzimidazole, a hydroxy phenylbenzothiazole, a bipyridine, a phenanthroline, and a cyclopentadiene, but exemplary embodiments of the inventive concepts are not limited thereto.

For example, the metal-containing material may include a Li complex. The Li complex may include, for example, Compound ET-D1 (lithium quinolate, LiQ) or ET-D2/;

ET-D1

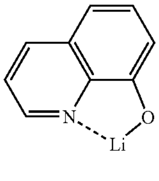

-continued

ET-D2

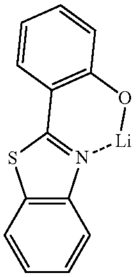

The electron transport region may include an electron injection layer that facilitates injection of electrons from the cathode 190. The electron injection layer may be in direct contact with the cathode 190.

The electron injection layer may have i) a single-layered structure including a single layer including a single material, ii) a single-layered structure including a single layer including a plurality of different materials, or iii) a multi-layered structure having a plurality of layers including a plurality of different materials.

The electron injection layer may include an alkali metal, an alkaline earth metal, a rare earth metal, an alkali metal compound, an alkaline earth-metal compound, a rare earth metal compound, an alkali metal complex, an alkaline earth-metal complex, a rare earth metal complex, or any combinations thereof.

The alkali metal may be selected from Li, Na, K, Rb, and Cs. In one exemplary embodiment, the alkali metal may be Li, Na, or Cs. In one or more exemplary embodiments, the alkali metal may be Li or Cs, but exemplary embodiments of the inventive concepts are not limited thereto.

The alkaline earth metal may be selected from Mg, Ca, Sr, and Ba.

The rare earth metal may be selected from Sc, Y, Ce, Tb, Yb, and Gd.

The alkali metal compound, the alkaline earth-metal compound, and the rare earth metal compound may be selected from oxides and halides (for example, fluorides, chlorides, bromides, or iodides) of the alkali metal, the alkaline earth-metal, and the rare earth metal.

The alkali metal compound may be selected from alkali metal oxides, such as $Li_2O$, $Cs_2O$, or $K_2O$, and alkali metal halides, such as LiF, NaF, CsF, KF, LiI, NaI, CsI, KI, or RbI. In one exemplary embodiment, the alkali metal compound may be selected from LiF, $Li_2O$, NaF, LiI, NaI, CsI, and KI, but exemplary embodiments of the inventive concepts are not limited thereto.

The alkaline earth-metal compound may be selected from alkaline earth-metal oxides, such as BaO, SrO, CaO, $Ba_xSr_{1-x}O$ ($0<x<1$), or BaxCai-xO ($0<x<1$). In one exemplary embodiment, the alkaline earth-metal compound may be selected from BaO, SrO, and CaO, but exemplary embodiments of the inventive concepts are not limited thereto.

The rare earth metal compound may be selected from $YbF_3$, $ScF_3$, $Sc_2O_3$, $Y_2O_3$, $Ce_2O_3$, $GdF_3$, and $TbF_3$. In one exemplary embodiment, the rare earth metal compound may be selected from $YbF_3$, $ScF_3$, $TbF_3$, $YbI_3$, $ScI_3$, and $TbI_3$, but exemplary embodiments of the inventive concepts are not limited thereto.

The alkali metal complex, the alkaline earth-metal complex, and the rare earth metal complex may include an ion of alkali metal, alkaline earth-metal, and rare earth metal as described above, and a ligand coordinated with a metal ion of the alkali metal complex, the alkaline earth-metal complex, or the rare earth metal complex may be selected from hydroxy quinoline, hydroxy isoquinoline, hydroxy benzoquinoline, hydroxy acridine, hydroxy phenanthridine, hydroxy phenyl oxazole, hydroxy phenylthiazole, hydroxy diphenyl oxadiazole, hydroxy diphenylthiadiazole, hydroxy phenylpyridine, hydroxy phenylbenzimidazole, hydroxy phenylbenzothiazole, bipyridine, phenanthroline, and cyclopentadiene, but exemplary embodiments of the inventive concepts are not limited thereto.

The electron injection layer may consist of an alkali metal, an alkaline earth metal, a rare earth metal, an alkali metal compound, an alkaline earth-metal compound, a rare earth metal compound, an alkali metal complex, an alkaline earth-metal complex, a rare earth metal complex, or any combinations thereof, as described above. In one or more exemplary embodiments, the electron injection layer may further include an organic material. When the electron injection layer further includes an organic material, an alkali metal, an alkaline earth metal, a rare earth metal, an alkali metal compound, an alkaline earth-metal compound, a rare earth metal compound, an alkali metal complex, an alkaline earth-metal complex, a rare earth metal complex, or any combinations thereof may be homogeneously or non-homogeneously dispersed in a matrix including the organic material.

A thickness of the electron injection layer may be in a range of about 1 Å to about 100 Å, for example, about 3 Å to about 90 Å. When the thickness of the electron injection layer is within the range described above, the electron injection layer may have satisfactory electron injection characteristics without a substantial increase in driving voltage.

In one exemplary embodiment, the hole transport region may include a hole transport material, the first host may include a hole transport host including no electron transport moiety, and the hole transport material may be the same as the first host.

In one or more exemplary embodiments, the hole transport region may include a hole transport layer including a hole transport material and an electron blocking layer including an electron blocking material, the first emission layer and the electron blocking layer may be in direct contact with each other, and the first host may include a hole transport host including no electron transport moiety and may be the same as the hole transport material and/or the electron blocking material.

In addition, in one exemplary embodiment, the electron transport region may include an electron transport material, the second host may include an electron transport host including at least one electron transport moiety, and the electron transport material may be the same as the second host.

In one or more exemplary embodiments, the electron transport region may include an electron transport layer including an electron transport material and a hole blocking layer including a hole blocking material, the first emission layer and the electron blocking layer may be in direct contact with each other, and the first host may include an electron transport host including at least one electron transport moiety and may be the same as the electron transport material and/or the hole blocking material.

An organic light-emitting device according to another embodiment may further include a second exciton quenching layer between the anode and the first emission layer and directly contacting the first emission layer, the second exciton quenching layer may include a second quenching material, and the host, the dopant, and the second quenching material may satisfy Equations 2-1 and 2-2:

$$T1(Q2) \leq T1(H1) \quad \langle\text{Equation 2-1}\rangle$$

$$T1(Q2) \leq T1(D1). \quad \langle\text{Equation 2-2}\rangle$$

In Equations 2-1 and 2-2,

T1 ($Q_2$) is a lowest excitation triplet energy level of the second quenching material, T1(H1) is a lowest excitation triplet energy level of the first host, and T1(D1) is a lowest excitation triplet energy level of the first dopant.

An organic light-emitting device according to another embodiment may further include a third exciton quenching layer between the cathode and the second emission layer and directly contacting the second emission layer, the third exciton quenching layer may include a third quenching material, and the host, the dopant, and the third quenching material may satisfy Equations 3-1 and 3-2:

$$T1(Q3) \leq T1(H2) \quad \langle\text{Equation 3-1}\rangle$$

$$T1(Q3) \leq T1(D2). \quad \langle\text{Equation 3-2}\rangle$$

In Equations 3-1 and 3-2,

T1 ($Q_3$) is a lowest excitation triplet energy level of the third quenching material, T1 (H2) is a lowest excitation triplet energy level of the second host, and T1 (D2) is a lowest excitation triplet energy level of the second dopant.

The second exciton quenching layer may further include a fourth host, or may further include a fourth host and a fourth dopant.

The third exciton quenching layer may further include a fifth host, or may further include a fifth host and a fifth dopant.

The fourth host and the fifth host may be understood by referring to the description provided with respect to the third host.

The fourth dopant and the fifth dopant may be understood by referring to the description provided with respect to the third dopant.

In addition, in one exemplary embodiment, a thickness (DQs) of the third exciton quenching layer and a thickness (DE) of the second emission layer may satisfy DE DQs.

In one exemplary embodiment, the organic layer may include a hole transport layer or an electron blocking layer between the anode and the second exciton quenching layer, and the second exciton quenching layer and the hole transport layer or the electron blocking layer may be in direct contact with each other.

In one or more exemplary embodiments, the organic layer may include an electron transport layer or a hole blocking layer between the cathode and the third exciton quenching layer, and the third exciton quenching layer and the electron transport layer or the hole blocking layer may be in direct contact with each other.

The cathode 190 may be disposed on the organic layer 150 having such a structure. A material for forming the cathode 190 may be metal, an alloy, an electrically conductive compound, and a combination thereof, which have a relatively low work function.

The cathode 190 may include at least one selected from lithium (Li), silver (Ag), magnesium (Mg), aluminum (Al), aluminum-lithium (Al—Li), calcium (Ca), magnesium-indium (Mg—In), magnesium-silver (Mg—Ag), ITO, and IZO, but exemplary embodiments of the inventive concepts are not limited thereto. The cathode 190 may be a transmissive electrode, a semi-transmissive electrode, or a reflective electrode.

The cathode 190 may have a single-layered structure, or a multi-layered structure including two or more layers.

In the FIGURE, a substrate may be additionally disposed under the anode 110 (i.e., a surface not in contact with the organic layer) or above the cathode 120 (i.e., a surface not in contact with the organic layer) as understood by one of ordinary skill in the art. The substrate may be a glass substrate or a plastic substrate, each having excellent mechanical strength, thermal stability, transparency, surface smoothness, ease of handling, and water resistance.

In one exemplary embodiment, the organic light-emitting device 10 may further include a capping layer in a direction in which light is extracted. The capping layer may increase external luminescent efficiency according to the principle of constructive interference.

The capping layer may each independently be an organic capping layer including an organic material, an inorganic capping layer including an inorganic material, or a composite capping layer including an organic material and an inorganic material.

The capping layer may each independently include at least one material selected from carbocyclic compounds, heterocyclic compounds, amine-based compounds, porphyrine derivatives, phthalocyanine derivatives, a naphthalocyanine derivatives, alkali metal complexes, and alkaline earth metal complexes. The carbocyclic compound, the heterocyclic compound, and the amine-based compound may be optionally substituted with a substituent containing at least one element selected from O, N, S, Se, Si, F, Cl, Br, and I.

In one exemplary embodiment, the capping layer may include an amine-based compound.

In one or more exemplary embodiments, the capping layer may include a compound represented by Formula 201 or Formula 202.

In one or more exemplary embodiments, the capping layer may be selected from Compounds HT28 to HT33 and Compounds CP1 to CP5, but exemplary embodiments of the inventive concepts are not limited thereto:

CP1

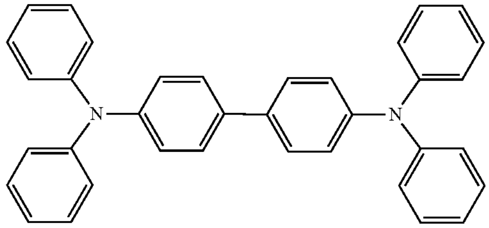

-continued

CP2

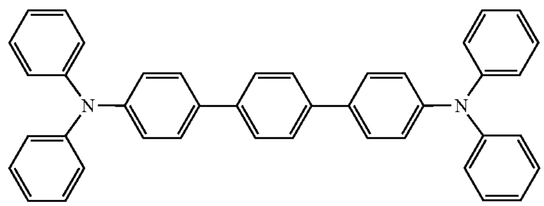

CP3

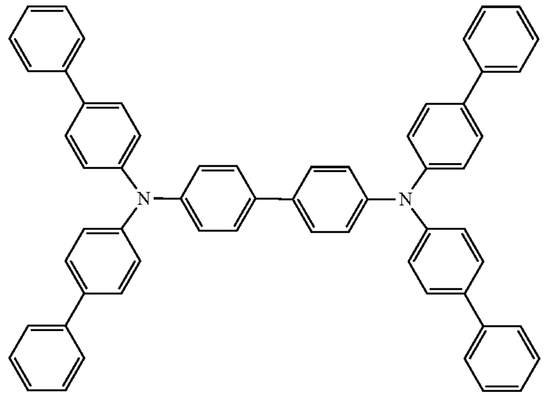

CP4

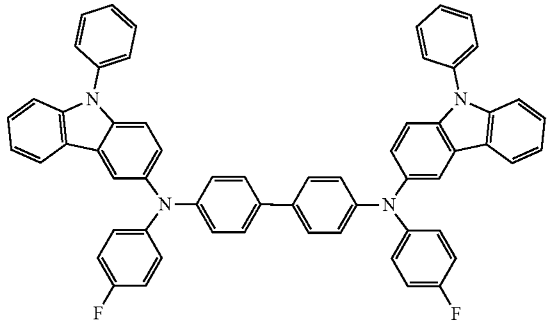

CP5

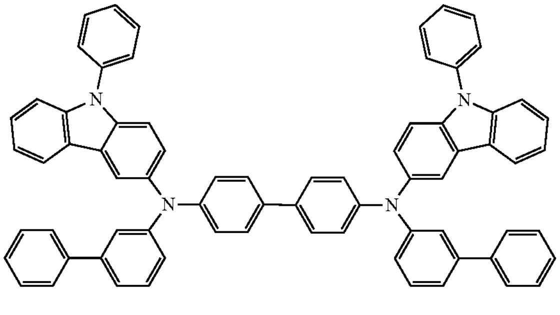

Hereinbefore, the organic light-emitting device according to an embodiment has been described in connection with the FIGURE.

Layers constituting the hole transport region, an emission layer, and layers constituting the electron transport region may be formed in a certain region by using one or more suitable methods selected from vacuum deposition, spin coating, casting, Langmuir-Blodgett (LB) deposition, ink-jet printing, laser-printing, and laser-induced thermal imaging.

When layers constituting the hole transport region, an emission layer, and layers constituting the electron transport region are formed by vacuum deposition, the deposition may be performed at a deposition temperature of about 100° C.

to about 500° C., a vacuum degree of about $10^{-3}$ torr to about $10^{-3}$ torr, and a deposition speed of about 0.01 Å/sec to about 100 Å/sec by taking into account a material to be included in a layer to be formed, and the structure of a layer to be formed.

When layers constituting the hole transport region, an emission layer, and layers constituting the electron transport region are formed by spin coating, the spin coating may be performed at a coating speed of about 2,000 rpm to about 5,000 rpm and at a heat treatment temperature of about 80° C. to about 200° C. by taking into account a material to be included in a layer to be formed, and the structure of a layer to be formed.

The term "$C_1$-$C_{60}$ alkyl group" as used herein refers to a linear or branched aliphatic saturated hydrocarbon monovalent group having 1 to 60 carbon atoms, and examples thereof include a methyl group, an ethyl group, a propyl group, an isobutyl group, a sec-butyl group, a tert-butyl group, a pentyl group, an isoamyl group, and a hexyl group. The term "$C_1$-$C_{60}$ alkylene group" as used herein refers to a divalent group having the same structure as the $C_1$-$C_{60}$ alkyl group.

In one or more embodiment, an electronic apparatus having: a thin-film transistor including a source electrode, a drain electrode, and an activation layer; and the organic light-emitting device is provided. The anode or the cathode of the organic light-emitting device is electrically connected to one of the source electrode and the drain electrode of the thin-film transistor.

The term "$C_2$-$C_{60}$ alkenyl group" as used herein refers to a hydrocarbon group having at least one carbon-carbon double bond in the middle or at the terminus of the $C_2$-$C_{60}$ alkyl group, and examples thereof include an ethenyl group, a propenyl group, and a butenyl group. The term "$C_2$-$C_{60}$ alkenylene group" as used herein refers to a divalent group having the same structure as the $C_2$-$C_{60}$ alkenyl group.

The term "$C_2$-$C_{60}$ alkynyl group" as used herein refers to a hydrocarbon group having at least one carbon-carbon triple bond in the middle or at the terminus of the $C_2$-$C_{60}$ alkyl group, and examples thereof include an ethynyl group, and a propynyl group. The term "$C_2$-$C_{60}$ alkynylene group" as used herein refers to a divalent group having the same structure as the $C_2$-$C_{60}$ alkynyl group.

The term "$C_1$-$C_{60}$ alkoxy group" as used herein refers to a monovalent group represented by —$OA_{101}$ (wherein $A_{101}$ is the $C_1$-$C_{60}$ alkyl group), and examples thereof include a methoxy group, an ethoxy group, and an isopropyloxy group.

The term "$C_3$-$C_{10}$ cycloalkyl group" as used herein refers to a monovalent saturated hydrocarbon monocyclic group having 3 to 10 carbon atoms, and examples thereof include a cyclopropyl group, a cyclobutyl group, a cyclopentyl group, a cyclohexyl group, and a cycloheptyl group. The term "$C_3$-$C_{10}$ cycloalkylene group" as used herein refers to a divalent group having the same structure as the $C_3$-$C_{10}$ cycloalkyl group.

The term "$C_1$-$C_{10}$ heterocycloalkyl group" as used herein refers to a monovalent monocyclic group having at least one heteroatom selected from N, O, Si, P, and S as a ring-forming atom and 1 to 10 carbon atoms, and examples thereof include a 1,2,3,4-oxatriazolidinyl group, a tetrahydrofuranyl group, and a tetrahydrothiophenyl group. The term "$C_1$-$C_{10}$ heterocycloalkylene group" as used herein refers to a divalent group having the same structure as the $C_1$-$C_{10}$ heterocycloalkyl group.

The term $C_3$-$C_{10}$ cycloalkenyl group as used herein refers to a monovalent monocyclic group that has 3 to 10 carbon atoms and at least one carbon-carbon double bond in the ring thereof and no aromaticity, and examples thereof include a cyclopentenyl group, a cyclohexenyl group, and a cycloheptenyl group. The term "$C_3$-$C_{10}$ cycloalkenylene group" as used herein refers to a divalent group having the same structure as the $C_3$-$C_{10}$ cycloalkenyl group.

The term "$C_1$-$C_{10}$ heterocycloalkenyl group" as used herein refers to a monovalent monocyclic group that has at least one heteroatom selected from N, O, Si, P, and S as a ring-forming atom, 1 to 10 carbon atoms, and at least one carbon-carbon double bond in its ring. Non-limiting examples of the $C_1$-$C_{10}$ heterocycloalkenyl group include a 4,5-dihydro-1,2,3,4-oxatriazolyl group, a 2,3-dihydrofuranyl group, and a 2,3-dihydrothiophenyl group. The term "$C_1$-$C_{10}$ heterocycloalkenylene group" as used herein refers to a divalent group having the same structure as the $C_1$-$C_{10}$ heterocycloalkenyl group.

The term "$C_6$-$C_{60}$ aryl group" as used herein refers to a monovalent group having a carbocyclic aromatic system having 6 to 60 carbon atoms, and a $C_6$-$C_{60}$ arylene group used herein refers to a divalent group having a carbocyclic aromatic system having 6 to 60 carbon atoms. Non-limiting examples of the $C_6$-$C_{60}$ aryl group include a phenyl group, a naphthyl group, an anthracenyl group, a phenanthrenyl group, a pyrenyl group, and a chrysenyl group. When the $C_6$-$C_{60}$ aryl group and the $C_6$-$C_{60}$ arylene group each include two or more rings, the rings may be fused to each other.

The term "$C_1$-$C_{60}$ heteroaryl group" as used herein refers to a monovalent group having a carbocyclic aromatic system that has at least one heteroatom selected from N, O, Si, P, and S as a ring-forming atom, in addition to 1 to 60 carbon atoms. The term "$C_1$-$C_{60}$ heteroarylene group" as used herein refers to a divalent group having a carbocyclic aromatic system that has at least one heteroatom selected from N, O, Si, P, and S as a ring-forming atom, in addition to 1 to 60 carbon atoms. Non-limiting examples of the $C_1$-$C_{60}$ heteroaryl group include a pyridinyl group, a pyrimidinyl group, a pyrazinyl group, a pyridazinyl group, a triazinyl group, a quinolinyl group, and an isoquinolinyl group. When the $C_1$-$C_{60}$ heteroaryl group and the $C_1$-$C_{60}$ heteroarylene group each include two or more rings, the rings may be condensed with each other.

The term "$C_6$-$C_{60}$ aryloxy group" as used herein refers to —$OA_{102}$ (wherein $A_{102}$ is the $C_6$-$C_{60}$ aryl group), and a $C_6$-$C_{60}$ arylthio group used herein indicates —$SA_{103}$ (wherein $A_{103}$ is the $C_6$-$C_{60}$ aryl group).

The term "$C_1$-$C_{60}$ heteroaryloxy group" as used herein refers to —$OA_{104}$ (wherein $A_{104}$ is the $C_1$-$C_{60}$ heteroaryl group), and the term "$C_1$-$C_{60}$ heteroarylthio group" as used herein refers to —$SA_{105}$ (wherein $A_{105}$ is the $C_1$-$C_{60}$ heteroaryl group).

The term "monovalent non-aromatic condensed polycyclic group" as used herein refers to a monovalent group (for example, having 8 to 60 carbon atoms) having two or more rings condensed with each other, only carbon atoms as ring-forming atoms, and no aromaticity in its entire molecular structure. A detailed example of the monovalent non-aromatic condensed polycyclic group is a fluorenyl group. The term "divalent non-aromatic condensed polycyclic group" as used herein refers to a divalent group having the same structure as the monovalent non-aromatic condensed polycyclic group.

The term "monovalent non-aromatic condensed heteropolycyclic group" as used herein refers to a monovalent group (for example, having 1 to 60 carbon atoms) having two or more rings condensed to each other, at least one heteroatom selected from N, O, Si, P, and S, other than carbon atoms, as a ring-forming atom, and no aromaticity in its entire molecular structure. An example of the monovalent non-aromatic condensed heteropolycyclic group is a carbazolyl group. The term "divalent non-aromatic condensed heteropolycyclic group" as used herein refers to a divalent group having the same structure as the monovalent non-aromatic condensed heteropolycyclic group.

The term "$C_5$-$C_{60}$ carbocyclic group" as used herein refers to a monocyclic or polycyclic group having 5 to 60 carbon atoms in which a ring-forming atom is a carbon atom only. The term "$C_5$-$C_{60}$ carbocyclic group" as used herein refers to an aromatic carbocyclic group or a non-aromatic carbocyclic group. The $C_5$-$C_{60}$ carbocyclic group may be a ring, such as benzene, a monovalent group, such as a phenyl group, or a divalent group, such as a phenylene group. In one or more exemplary embodiments, depending on the number of substituents connected to the $C_5$-$C_{60}$ carbocyclic group, the $C_5$-$C_{60}$ carbocyclic group may be a trivalent group or a quadrivalent group.

The term "$C_1$-$C_{60}$ heterocyclic group" as used herein refers to a group having the same structure as the $C_5$-$C_{60}$ carbocyclic group, except that as a ring-forming atom, at least one heteroatom selected from N, O, Si, P, and S is used in addition to carbon (the number of carbon atoms may be in a range of 1 to 60).

In the present specification, at least one substituent of the $C_5$-$C_{60}$ carbocyclic group, the substituted $C_1$-$C_{60}$ heterocyclic group, the substituted $C_3$-$C_{10}$ cycloalkylene group, the substituted $C_1$-$C_{10}$ heterocycloalkylene group, the substituted $C_3$-$C_{10}$ cycloalkenylene group, the substituted $C_1$-$C_{10}$ heterocycloalkenylene group, the substituted $C_6$-$C_{60}$ arylene group, the substituted $C_1$-$C_{60}$ heteroarylene group, the substituted divalent non-aromatic condensed polycyclic group, the substituted divalent non-aromatic condensed heteropolycyclic group, the substituted $C_1$-$C_{60}$ alkyl group, the substituted $C_2$-$C_{60}$ alkenyl group, the substituted $C_2$-$C_{60}$ alkynyl group, the substituted $C_1$-$C_{60}$ alkoxy group, the substituted $C_3$-$C_{10}$ cycloalkyl group, the substituted $C_1$-$C_{10}$ heterocycloalkyl group, the substituted $C_3$-$C_{10}$ cycloalkenyl group, the substituted $C_1$-$C_{10}$ heterocycloalkenyl group, the substituted $C_6$-$C_{60}$ aryl group, the substituted $C_6$-$C_{60}$ aryloxy group, the substituted $C_6$-$C_{60}$ arylthio group, the substituted $C_1$-$C_{60}$ heteroaryl group, the substituted $C_1$-$C_{60}$ heteroaryloxy group, the substituted $C_1$-$C_{60}$ heteroarylthio group, the substituted monovalent non-aromatic condensed polycyclic group, and the substituted monovalent non-aromatic condensed heteropolycyclic group may be selected from:

Deuterium, —F, —Cl, —Br, —I, a hydroxyl group, a cyano group, a nitro group, an amidino group, a hydrazino group, a hydrazono group, a $C_1$-$C_{60}$ alkyl group, a $C_2$-$C_{60}$ alkenyl group, a $C_2$-$C_{60}$ alkynyl group, and a $C_1$-$C_{60}$ alkoxy group;

a $C_1$-$C_{60}$ alkyl group, a $C_2$-$C_{60}$ alkenyl group, a $C_2$-$C_{60}$ alkynyl group, and a $C_1$-$C_{60}$ alkoxy group, each substituted with at least one selected from deuterium, —F, —Cl, —Br, —I, a hydroxyl group, a cyano group, a nitro group, an amidino group, a hydrazino group, a hydrazono group, a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_6$-$C_{60}$ aryloxy group, a $C_6$-$C_{60}$ arylthio group, a $C_1$-$C_{60}$ heteroaryl group, a $C_1$-$C_{60}$ heteroaryloxy group, a $C_1$-$C_{60}$ heteroarylthio group, a monovalent non-aromatic condensed polycyclic group, a monovalent non-aromatic condensed heteropolycyclic group, —$Si(Q_{11})(Q_{12})(Q_{13})$, —$N(Q_{11})(Q_{12})$, —$B(Q_{11})(Q_{12})$, —$C(=O)(Q_{11})$, —$S(=O)_2(Q_{11})$, and —$P(=O)(Q_{11})(Q_{12})$;

a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_6$-$C_{60}$ aryloxy group, a $C_6$-$C_{60}$ arylthio group, a $C_1$-$C_{60}$ heteroaryl group, a $C_1$-$C_{60}$ heteroaryloxy group, a $C_1$-$C_{60}$ heteroarylthio group, a monovalent non-aromatic condensed polycyclic group, and a monovalent non-aromatic condensed heteropolycyclic group;

a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_6$-$C_{60}$ aryloxy group, a $C_6$-$C_{60}$ arylthio group, a $C_1$-$C_{60}$ heteroaryl group, a $C_1$-$C_{60}$ heteroaryloxy group, a $C_1$-$C_{60}$ heteroarylthio group, a monovalent non-aromatic condensed polycyclic group, and a monovalent non-aromatic condensed heteropolycyclic group, each substituted with at least one selected from deuterium, —F, —Cl, —Br, —I, a hydroxyl group, a cyano group, a nitro group, an amidino group, a hydrazino group, a hydrazono group, a $C_1$-$C_{60}$ alkyl group, a $C_2$-$C_{60}$ alkenyl group, a $C_2$-$C_{60}$ alkynyl group, a $C_1$-$C_{60}$ alkoxy group, a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_6$-$C_{60}$ aryloxy group, a $C_6$-$C_{60}$ arylthio group, a $C_1$-$C_{60}$ heteroaryl group, a $C_1$-$C_{60}$ heteroaryloxy group, a $C_1$-$C_{60}$ heteroarylthio group, a monovalent non-aromatic condensed polycyclic group, a monovalent non-aromatic condensed heteropolycyclic group, —$Si(Q_{21})(Q_{22})(Q_{23})$, —$N(Q_{21})(Q_{22})$, —$B(Q_{21})(Q_{22})$, —$C(=O)(Q_{21})$, —$S(=O)_2(Q_{21})$, and —$P(=O)(Q_{21})(Q_{22})$; and —$Si(Q_{31})(Q_{32})(Q_{33})$, —$N(Q_{31})(Q_{32})$, —$B(Q_{31})(Q_{32})$, —$C(=O)(Q_{31})$, —$S(=O)_2(Q_{31})$, and —$P(=O)(Q_{31})(Q_{32})$, and $Q_{11}$ to $Q_{13}$, $Q_{21}$ to $Q_{23}$, and $Q_{31}$ to $Q_{33}$ may each independently be selected from hydrogen, deuterium, —F, —Cl, —Br, —I, a hydroxyl group, a cyano group, a nitro group, an amidino group, a hydrazino group, a hydrazono group, a $C_1$-$C_{60}$ alkyl group, a $C_2$-$C_{60}$ alkenyl group, a $C_2$-$C_{60}$ alkynyl group, a $C_1$-$C_{60}$ alkoxy group, a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_1$-$C_{60}$ heteroaryl group, a $C_1$-$C_{60}$ heteroaryloxy group, a $C_1$-$C_{60}$ heteroarylthio group, a monovalent non-aromatic condensed polycyclic group, a monovalent non-aromatic condensed heteropolycyclic group, a $C_1$-$C_{60}$ alkyl group substituted with at least one selected from deuterium, —F, and a cyano group, a $C_6$-$C_{60}$ aryl group substituted with at least one selected from deuterium, —F, and a cyano group, a biphenyl group, and a terphenyl group.

The term "Ph" as used herein represents a phenyl group, the term "Me" as used herein represents a methyl group, the term "Et" as used herein represents an ethyl group, the term "ter-Bu" or "But," as used herein, represents a tert-butyl group, and the term "OMe" as used herein represents a methoxy group.

The term "biphenyl group" as used herein refers to a "phenyl group substituted with a phenyl group. The "biphenyl group" is a "substituted phenyl group" having a "$C_6$-$C_{60}$ aryl group" as a substituent.

The term "terphenyl group" as used herein refers to a "phenyl group substituted with a biphenyl group. The "terphenyl group" is a "phenyl group" having, as a substituent, a "$C_6$-$C_{60}$ aryl group substituted with a $C_6$-$C_{60}$ aryl group."

* and *' as used herein, unless defined otherwise, each refer to a binding site to a neighboring atom in a corresponding formula.

Hereinafter, an organic light-emitting device according to an embodiment will be described in detail with reference to Examples. The expression "B was used instead of A" used in describing Examples means that an identical number of molar equivalents of B was used in place of molar equivalents of A.

EXAMPLES

Evaluation Example 1: Measurement of T1 Energy Level

A mixture of toluene and each of Compounds QD-1 and PD-1 (1 mg of each of Compounds QD-1 and PD-1 was dissolved in 3 mL of toluene) was added to a quartz cell, liquid nitrogen (77 K) was added thereto, and a photoluminescence spectrum was measured by using a photoluminescence measurement instrument. The peak observed only at a low temperature was analyzed by comparing the photoluminescence spectrum with a general room-temperature photoluminescence spectrum. Then, a T1 energy level results thereof are shown in Table 1.

TABLE 1

| Compound | T1 energy level (eV) |
|---|---|
| QD-1 | 1.55 |
| PD-1 | 3.05 |

<QD-1>

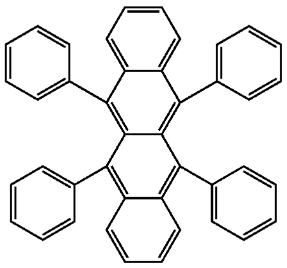 [SMILES: c1ccc(-c2c3ccccc3c(-c3ccccc3)c3c(-c4ccccc4)c4ccccc4c(-c4ccccc4)c23)cc1]

<PD-1>

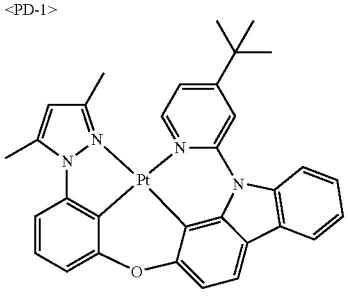

Referring to Table 1, it is confirmed that Compound QD-1 has low T1 energy level.

Example 1

A Corning 15 Ω/cm$^2$ (1,200 Å) ITO glass substrate (anode) was cut to a size of 50 mm×50 mm×0.7 mm, sonicated with isopropyl alcohol and pure water each for 5 minutes, and then cleaned by exposure to ultraviolet rays and ozone for 30 minutes. Then, the ITO glass substrate was provided to a vacuum deposition apparatus.

HT18+MoO$_x$ (x=2 to 4, 10% doping) and Compound 221-1 were vacuum-deposited on the ITO glass substrate to form a hole injection layer having a thickness of 100 Å, and HT18 was vacuum-deposited on the hole injection layer to form a hole transport layer having a thickness of 700 Å.

TCTA was vacuum-deposited on the hole transport layer to form an electron blocking layer having a thickness of 50 Å.

Compound HT-1 and Compound ET-3 as a co-host (weight ratio of 1:1) and Compound PD-1 as a dopant (10 wt %) were co-deposited to form a first emission layer having a thickness of 125 Å.

Compound HT-1 and Compound ET-3 as a co-host (weight ratio of 1:1) and Compound QD-1 as a first quenching material were co-deposited on the first emission layer to form a first exciton quenching layer having a thickness of 50 Å.

Compound HT-1 and Compound ET-3 as a co-host (weight ratio of 1:1) and Compound PD-1 as a dopant (10 wt %) were co-deposited on the first exciton quenching layer to form a second emission layer having a thickness of 125 Å.

Compound 221-1 was vacuum-deposited on the second emission layer to form a hole blocking layer having a thickness of 50 Å.

Compound ET-3 was vacuum-deposited on the hole blocking layer to form an electron transport layer having a thickness of 300 Å. LiF was vacuum-deposited on the electron transport layer to form an electron injection layer having a thickness of 10 Å, and Al was vacuum-deposited on the electron injection layer to form a cathode having a thickness of 3,000 Å, thereby completing the manufacture of an organic light-emitting device.

<HT18>

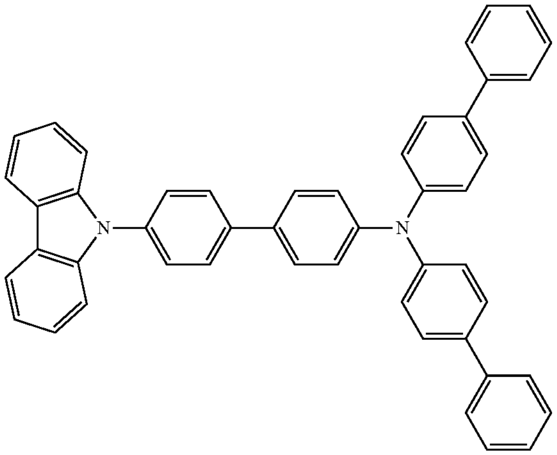

-continued

<Compound 221-1>

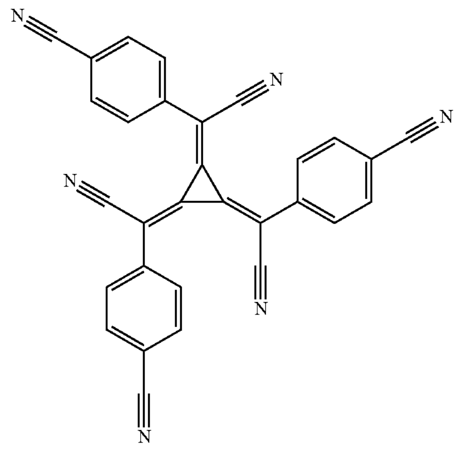

<TCTA>

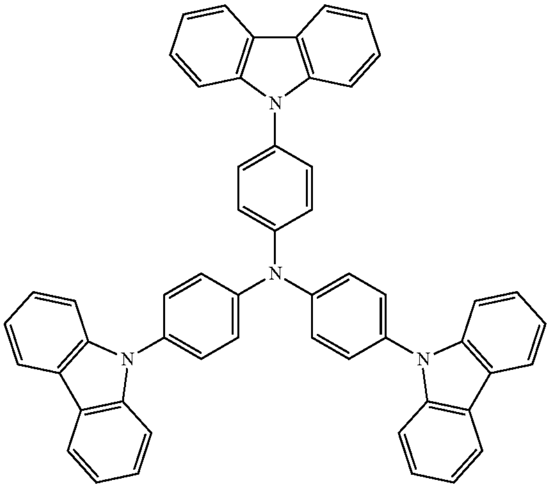

TCTA

<HT-1>

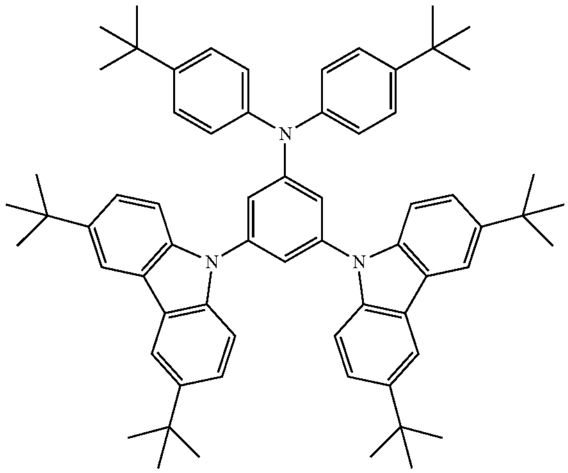

-continued

<ET-3>

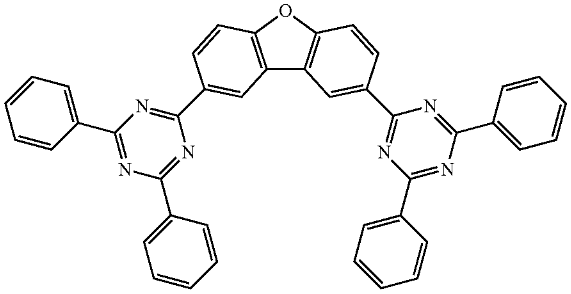

<QD-1>

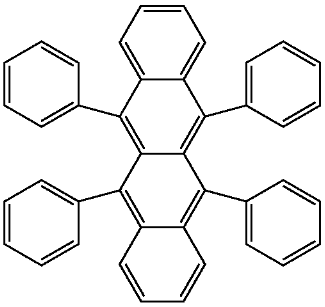

<PD-1>

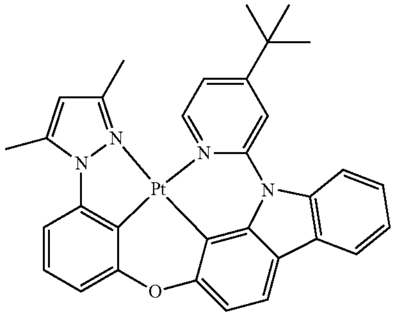

Example 2

An organic light-emitting device was manufactured in the same manner as in Example 1, except that a first exciton quenching layer was formed so as to form a concentration gradient in which a concentration of Compound QD-1 was 5 wt % at an interface between the first exciton quenching layer and the first emission layer, and a concentration of Compound QD-1 was 0.5% at an interface between the first exciton quenching layer and the second emission layer.

Comparative Example 1

An organic light-emitting device was manufactured in the same manner as in Example 1, except that the first exciton quenching layer and the second emission layer were not formed, and the hole blocking layer was formed on the first emission layer.

Evaluation Example 2: Evaluation of Organic Light-Emitting Device

The driving voltage, current efficiency, and lifespan ($LT_{50}$) of the organic light-emitting devices manufactured according to Examples 1 and 2 and Comparative Example 1 were measured by using Keithley SMU 236 and a luminance meter PR650, and results thereof are shown in Table 2. The lifespan indicates the time that lapsed when luminance was 50% of initial luminance (100%).

TABLE 2

| | Driving voltage (V) | Current efficiency (Cd/A) | $LT_{50}$ (hr) |
|---|---|---|---|
| Example 1 | 4.5 | 15.6 | 116 |
| Example 2 | 4.5 | 18.6 | 150 |
| Comparative Example 1 | 4.5 | 16 | 102 |

From Table 2, it is confirmed that the organic light-emitting devices of Example 1 and 2 has high efficiency and a long lifespan, as compared with those of the organic light-emitting device of Comparative Example 1.

Some of the advantages that may be achieved by exemplary embodiments of the invention include an organic light-emitting device that may have a long lifespan.

Although certain exemplary embodiments and implementations have been described herein, other embodiments and modifications will be apparent from this description. Accordingly, the inventive concepts are not limited to such embodiments, but rather to the broader scope of the appended claims and various obvious modifications and equivalent arrangements as would be apparent to a person of ordinary skill in the art.

What is claimed is:

1. An organic light-emitting device comprising:

an anode;

a cathode; and an organic layer between the anode and the cathode and comprising an emission region, wherein:

the emission region comprises a first emission layer, a second emission layer, and a first layer;

the first emission layer comprises a first host and a first dopant; and the second emission layer comprises a second host and a second dopant;

the first layer is disposed between the first emission layer and the second emission layer and comprises a first material, and wherein:

the first host, the first dopant, the second host, the second dopant, and the first material satisfy Equations 1-1 and 1-3; or the first host, the first dopant, the second host, the second dopant, and the first material satisfy Equations 1-2 and 1-4:

$$T1(Q1) \leq T1(H1) \quad \langle\text{Equation 1-1}\rangle$$

$$T1(Q1) \leq T1(D1) \quad \langle\text{Equation 1-2}\rangle$$

$$T1(Q1) \leq T1(H2) \quad \langle\text{Equation 1-3}\rangle$$

$$T1(Q1) \leq T1(D2), \quad \langle\text{Equation 1-4}\rangle$$

in Equations 1-1 to 1-4,

T1(Q1) being a lowest excitation triplet energy level of the first material,

T1(H1) being a lowest excitation triplet energy level of the first host,

T1(D1) being a lowest excitation triplet energy level of the first dopant,

T1(H2) being a lowest excitation triplet energy level of the second host, and

T1(D2) being a lowest excitation triplet energy level of the second dopant.

2. The organic light-emitting device of claim 1, wherein:

the first material comprises a fluorescence emitting material; and the fluorescence emitting material is an organometallic low-molecular-weight host or an organic low-molecular-weight host, the organometallic low-molecular-weight host being at least one alkaline earth metal complex selected from a Be complex, a Mg complex, and a Zn complex, and the organic low-molecular-weight host being at least one selected from a styryl-based compound, an oxadiazole-based compound, and a spiro-bifluorene-based compound.

3. The organic light-emitting device of claim 1, wherein:

the first material comprises a fluorescence emitting material; and the fluorescence emitting material comprises at least one selected from a diamine-based compound, a styryl-based compound, a perylene-based compound, and a coumarin-based compound.

4. The organic light-emitting device of claim 1, wherein:

the first material comprises a phosphorescence emitting material; and the phosphorescence emitting material is a compound represented by Formula 301:

$$[Ar_{301}]_{xb11}-[(L_{301})_{xb1}-R_{301}]_{xb21}, \quad \langle\text{Formula 301}\rangle$$

in Formula 301, $Ar_{301}$ is a substituted or unsubstituted $C_5$-$C_{60}$ carbocyclic group or a substituted or unsubstituted $C_1$-$C_{60}$ heterocyclic group, xb11 is 1, 2, or 3, $L_{301}$ is selected from a substituted or unsubstituted $C_3$-$C_{10}$ cycloalkylene group, a substituted or unsubstituted $C_1$-$C_{10}$ heterocycloalkylene group, a substituted or unsubstituted $C_3$-$C_{10}$ cycloalkenylene group, a substituted or unsubstituted $C_1$-$C_{10}$ heterocycloalkenylene group, a substituted or unsubstituted $C_6$-$C_{60}$ arylene group, a substituted or unsubstituted $C_1$-$C_{60}$ heteroarylene group, a substituted or unsubstituted divalent non-aromatic condensed polycyclic group, and a substituted or unsubstituted divalent non-aromatic condensed heteropolycyclic group, xb1 is an integer selected from 0 to 5, $R_{301}$ is selected from deuterium, —F, —Cl, —Br, —I, a hydroxyl group, a cyano group, a nitro group, an amidino group, a hydrazino group, a hydrazono group, a substituted or unsubstituted $C_1$-$C_{60}$ alkyl group, a substituted or unsubstituted $C_2$-$C_{60}$ alkenyl group, a substituted or unsubstituted $C_2$-$C_{60}$ alkynyl group, a substituted or unsubstituted $C_1$-$C_{60}$ alkoxy group, a substituted or unsubstituted $C_3$-$C_{10}$ cycloalkyl group, a substituted or unsubstituted $C_1$-$C_{10}$ heterocycloalkyl group, a substituted or unsubstituted $C_3$-$C_{10}$ cycloalkenyl group, a substituted or unsubstituted $C_1$-$C_{10}$ heterocycloalkenyl group, a substituted or unsubstituted $C_6$-$C_{60}$ aryl group, a substituted or unsubstituted $C_6$-$C_{60}$ aryloxy group, a substituted or unsubstituted $C_6$-$C_{60}$ arylthio group, a substituted or unsubstituted $C_1$-$C_{60}$ heteroaryl group, a substituted or unsubstituted monovalent non-aromatic condensed polycyclic group, a substituted or unsubstituted monovalent non-aromatic condensed heteropolycyclic group, —Si($Q_{301}$)($Q_{302}$)($Q_{303}$), —N($Q_{301}$)($Q_{302}$), —B($Q_{301}$)($Q_{302}$), —C(=O)($Q_{301}$), —S(=O)$_2$($Q_{301}$), and —P(=O)($Q_{301}$)($Q_{302}$), xb21 is integer selected from 1 to 5, and $Q_{301}$ to $Q_{303}$ are each independently selected from a $C_1$-$C_{10}$ alkyl group, a $C_1$-$C_{10}$ alkoxy group, a phenyl group, a biphenyl group, a terphenyl group, a pentalenyl group, an indenyl group, a naphthyl group, an azulenyl group, a heptalenyl group, an indacenyl group, an acenaphthenyl group, a fluorenyl group, a spiro-bifluorenyl group, a benzofluorenyl group, a dibenzofluorenyl group, a phenalenyl group, a phenanthrenyl group, an anthracenyl group, a fluoranthenyl group, a triphenylenyl group, a pyrenyl group, a chrysenyl group, a naphthacenyl group, a picenyl group, a perylenyl group, a pentaphenyl group, a hexacenyl group, a pentacenyl group, a rubicenyl group, a coronenyl group, an ovalenyl group, a thiophenyl group, a furanyl group, a carbazolyl group, an indolyl group, an isoindolyl group, a benzofuranyl group, a benzothiophenyl group, a dibenzofuranyl group, a dibenzothiophenyl group, a benzocarbazolyl group, a dibenzocarbazolyl group, a dibenzosilolyl group, and a pyridinyl group.

5. The organic light-emitting device of claim 1, wherein:

the first material comprises a phosphorescence emitting material; and the phosphorescence emitting material is utilized for red or green light emission.

6. The organic light-emitting device of claim 1, wherein an amount of the first material is in a range of about 0.05 parts by weight to about 20 parts by weight based on 100 parts by weight of the first layer.

7. The organic light-emitting device of claim 1, wherein, with respect to a length of 100 length % from an interface between the first layer and the first emission layer to an interface between the first layer and the second emission layer, about 70 parts by weight or more among 100 parts by weight of the first material is in (i) a region ($M_{0,20}$) in which a length from the interface between the first layer and the first emission layer is in a range of about 0 length % to about 20 length % and (ii) a region ($M_{80,100}$) in which a length from the interface between the first layer and the first emission layer is in a range of about 80 length % to about 100 length %.

8. The organic light-emitting device of claim 1, wherein, with respect to a length of 100 length % from an interface between the first layer and the first emission layer to an interface between the first layer and the second emission layer, about 70 parts by weight or more among 100 parts by weight of the first material is in (i) a region ($M_{0,50}$) in which a length from the interface between the first layer and the first emission layer is in a range of about 0 length % to about 50 length % or (ii) a region ($M_{50,100}$) in which a length from the interface between the first layer and the first emission layer is in a range of about 50 length % to about 100 length %.

9. The organic light-emitting device of claim 1, wherein the first layer is in direct contact with the first emission layer and the second emission layer;

the first host comprises a first hole transport host comprising no electron transport moiety and a first electron transport host comprising at least one electron transport moiety; and the second host comprises a second hole transport host comprising no electron transport moiety and a second electron transport host comprising at least one electron transport moiety.

10. An organic light-emitting device comprising:

an anode;

a cathode; and an organic layer between the anode and the cathode and comprising an emission region, wherein:

the emission region comprises a first emission layer, a second emission layer, and a first layer;

the first emission layer comprises a first host and a first dopant;

the second emission layer comprises a second host and a second dopant;

the first layer is between the first emission layer and the second emission layer and comprises a first material;

the first host comprises a first hole transport host and a first electron transport host;

the second host comprises a second hole transport host and a second electron transport host;

the first hole transport host and the second hole transport host are each independently a compound represented by one selected from Formulae 301-1 to 301-6; and the first electron transport host and the second electron transport host are each independently a compound represented by one selected from Formulae 301-7 to 301-9:

<Formula 301-1>

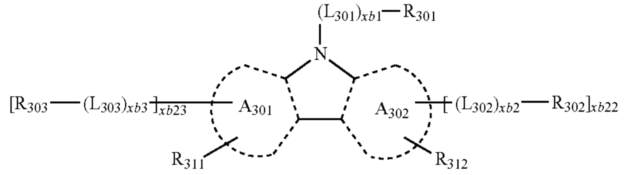

-continued

<Formula 301-2>

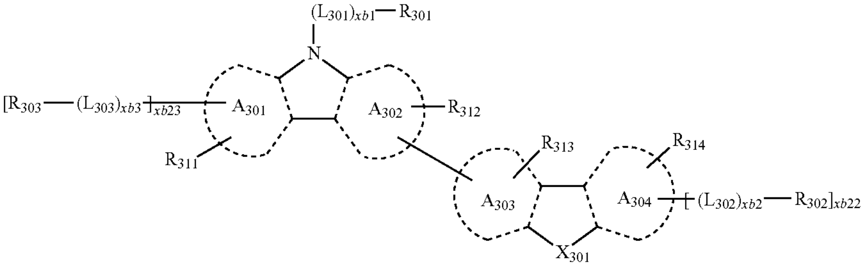

<Formula 301-3>

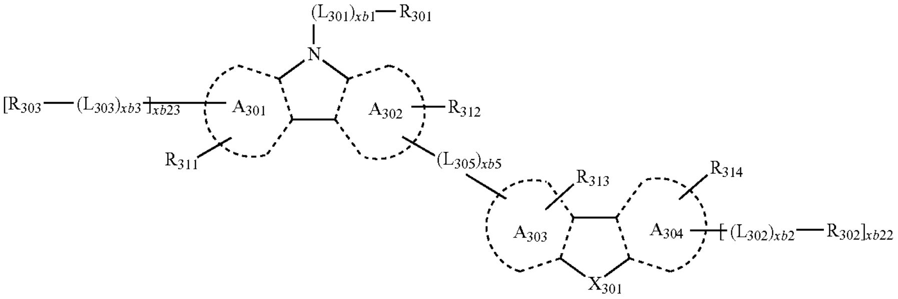

<Formula 301-4>

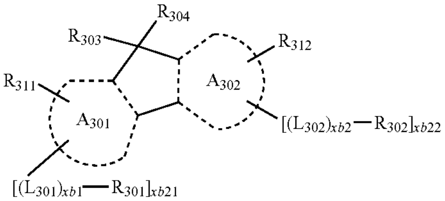

<Formula 301-5>

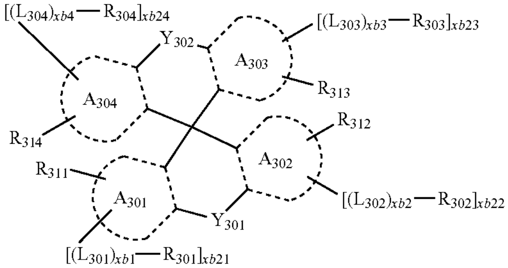

<Formula 301-6>

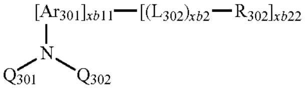

<Formula 301-7>

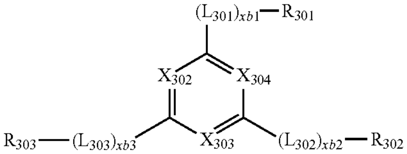

<Formula 301-8>

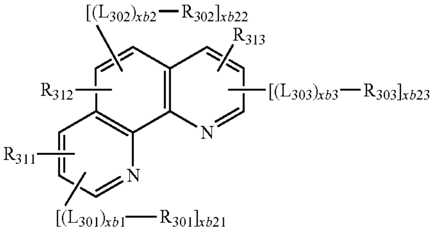

<Formula 301-9>

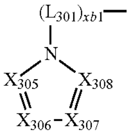

in Formulae 301-1 to 301-9, $A_{301}$ to $A_{304}$ are each independently selected from a benzene group, a naphthalene group, a phenanthrene group, a fluoranthene group, a triphenylene group, a pyrene group, a chrysene group, a pyridine group, a pyrimidine group, an indene group, a fluorene group, a spiro-bifluorene group, a benzofluorene group, a dibenzofluorene group, an indole group, a carbazole group, a benzocarbazole group, a dibenzocarbazole group, a furan group, a benzofuran group, a dibenzofuran group, a naphthofuran group, a benzonaphthofuran group, a dinaphthofuran group, a thiophene group, a benzothiophene group, a dibenzothiophene group, a naphthothiophene group, a benzonaphthothiophene group, and a dinaphthothiophene group, $X_{301}$ is O, S, or N-[$(L_{304})_{xb4}$-$R_{304}$], $X_{302}$ is N or C($R_{311}$), $X_{303}$ is N or C($R_{312}$), $X_{304}$ is N or C($R_{313}$), and at least one selected from $X_{302}$ to $X_{304}$ is N, $X_{305}$ is N or C($R_{311}$), $X_{306}$ is N or C($R_{312}$), $X_{307}$ is N or C($R_{313}$), $X_{308}$ is N or C($R_{314}$), and at least one selected from $X_{305}$ to $X_{308}$ is N, $Y_{301}$ and $Y_{302}$ are each independently a single bond, O, S, N-[$(L_{305})_{xb5}$-$R_{305}$], or S(=O)$_2$, xb21 to xb24 are each independently 0, 1, or 2, $Ar_{301}$ is a substituted or unsubstituted $C_5$-$C_{60}$ carbocyclic group or a substituted or unsubstituted $C_1$-$C_{60}$ heterocyclic group, $L_{301}$ to $L_{305}$ are each independently selected from a substituted or unsubstituted $C_3$-$C_{10}$ cycloalkylene group, a substituted or unsubstituted $C_1$-$C_{10}$ heterocycloalkylene group, a substituted or unsubstituted $C_3$-$C_{10}$ cycloalkenylene group, a substituted or unsubstituted $C_1$-$C_{10}$ heterocycloalkenylene group, a substituted or unsubstituted $C_6$-$C_{60}$ arylene group, a substituted or unsubstituted $C_1$-$C_{60}$ heteroarylene group, a substituted or unsubstituted divalent non-aromatic condensed polycyclic group, and a substituted or unsubstituted divalent non-aromatic condensed heteropolycyclic group, xb1 to xb4 are each independently an integer from 0 to 5, xb5 is an integer from 1 to 5, $R_{301}$ to $R_{305}$ are each independently selected from deuterium, —F, —Cl, —Br, —I, a hydroxyl group, a cyano group, a nitro group, an amidino group, a hydrazino group, a hydrazono group, a substituted or unsubstituted $C_1$-$C_{60}$ alkyl group, a substituted or unsubstituted $C_2$-$C_{60}$ alkenyl group, a substituted or unsubstituted $C_2$-$C_{60}$ alkynyl group, a substituted or unsubstituted $C_1$-$C_{60}$ alkoxy group, a substituted or unsubstituted $C_3$-$C_{10}$ cycloalkyl group, a substituted or unsubstituted $C_1$-$C_{10}$ heterocycloalkyl group, a substituted or unsubstituted $C_3$-$C_{10}$ cycloalkenyl group, a substituted or unsubstituted $C_1$-$C_{10}$ heterocycloalkenyl group, a substituted or unsubstituted $C_6$-$C_{60}$ aryl group, a substituted or unsubstituted $C_6$-$C_{60}$ aryloxy group, a substituted or unsubstituted $C_6$-$C_{60}$ arylthio group, a substituted or unsubstituted $C_1$-$C_{60}$ heteroaryl group, a substituted or unsubstituted monovalent non-aromatic condensed polycyclic group, a substituted or unsubstituted monovalent non-aromatic condensed heteropolycyclic group, $—Si(Q_{301})(Q_{302})(Q_{303})$, $—N(Q_{301})(Q_{302})$, $—B(Q_{301})(Q_{302})$, $—C(=O)(Q_{301})$, $—S(=O)_2(Q_{301})$, and $—P(=O)(Q_{301})(Q_{302})$, $R_{311}$ to $R_{314}$ are each independently selected from hydrogen, deuterium, —F, —Cl, —Br, —I, a hydroxyl group, a cyano group, a nitro group, an amidino group, a hydrazino group, a hydrazono group, a $C_1$-$C_{20}$ alkyl group, a $C_1$-$C_{20}$ alkoxy group, a phenyl group, a biphenyl group, a terphenyl group, a naphthyl group, a dibenzofuranyl group, a dibenzothiophenyl group, —SH, $—S(Q_{301})$, $—Si(Q_{301})(Q_{302})(Q_{303})$, $—N(Q_{301})(Q_{302})$, $—B(Q_{301})(Q_{302})$, $—C(=O)(Q_{301})$, $—S(=O)_2(Q_{301})$, and $—P(=O)(Q_{301})(Q_{302})$, $Q_{301}$ to $Q_{303}$ are each independently selected from a $C_1$-$C_{10}$ alkyl group, a $C_1$-$C_{10}$ alkoxy group, a phenyl group, a biphenyl group, a terphenyl group, a pentalenyl group, an indenyl group, a naphthyl group, an azulenyl group, a heptalenyl group, an indacenyl group, an acenaphthenyl group, a fluorenyl group, a spiro-bifluorenyl group, a benzofluorenyl group, a dibenzofluorenyl group, a phenalenyl group, a phenanthrenyl group, an anthracenyl group, a fluoranthenyl group, a triphenylenyl group, a pyrenyl group, a chrysenyl group, a naphthacenyl group, a picenyl group, a perylenyl group, a pentaphenyl group, a hexacenyl group, a pentacenyl group, a rubicenyl group, a coronenyl group, an ovalenyl group, a thiophenyl group, a furanyl group, a carbazolyl group, an indolyl group, an isoindolyl group, a benzofuranyl group, a benzothiophenyl group, a dibenzofuranyl group, a dibenzothiophenyl group, a benzocarbazolyl group, a dibenzocarbazolyl group, a dibenzosilolyl group, and a pyridinyl group, two or more neighboring substituents selected from $R_{301}$ to $R_{303}$ and $R_{311}$ to $R_{313}$ in Formula 301-7 are optionally linked to form a substituted or unsubstituted $C_5$-$C_{60}$ carbocyclic group or a substituted or unsubstituted $C_1$-$C_{60}$ heterocyclic group, and two or more substituents selected from $R_{311}$ to $R_{314}$ in Formula 301-9 are optionally linked to form a substituted or unsubstituted $C_5$-$C_{60}$ carbocyclic group or a substituted or unsubstituted $C_1$-$C_{60}$ heterocyclic group.

11. The organic light-emitting device of claim 10, wherein the first hole transport host does not comprise at least one of a cyano group, a phosphine oxide group, a sulfone oxide group, a sulfonate group, or a π electron-depleted nitrogen-containing cyclic group, the π electron-depleted nitrogen-containing cyclic group being a cyclic group having at least one *—N=*' moiety, the first electron transport host comprises at least one of a cyano group, a phosphine oxide group, a sulfone oxide group, a sulfonate group, and/or a π electron-depleted nitrogen-containing cyclic group, the π electron-depleted nitrogen-containing cyclic group being a cyclic group having at least one *—N=*' moiety, the second hole transport host does not comprise at least one a cyano group, a phosphine oxide group, a sulfone oxide group, a sulfonate group, or a π electron-depleted nitrogen-containing cyclic group, the π electron-depleted nitrogen-containing cyclic group being a cyclic group having at least one *—N=*' moiety, and the second electron transport host comprises at least one of a cyano group, a phosphine oxide group, a sulfone oxide group, a sulfonate group, or a π electron-depleted nitrogen-containing cyclic group, the π electron-depleted nitrogen-containing cyclic group being a cyclic group having at least one *—N=*' moiety.

12. The organic light-emitting device of claim 1, wherein the first dopant and the second dopant are each independently a phosphorescent dopant or a delayed fluorescence dopant.

13. The organic light-emitting device of claim 12, wherein:

the phosphorescent dopant comprises an organometallic complex represented by Formula 401:

<Formula 401>

$M(L_{401})_{xc1}(L_{402})_{xc2}$

<Formula 402>

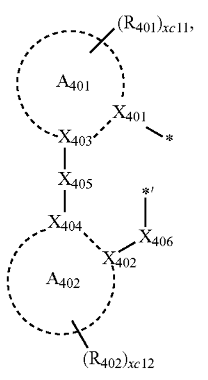

in Formulae 401 and 402,

M is selected from iridium (Ir), platinum (Pt), palladium (Pd), osmium (Os), titanium (Ti), zirconium (Zr), hafnium (Hf), europium (Eu), terbium (Tb), rhodium (Rh), and thulium (Tm), $L_{401}$ is selected from a ligand represented by Formula 402, and xc1 is 1, 2, or 3, wherein, when xc1 is two or more, two or more $L_{401}$(s) are identical to or different from each other, $L_{402}$ is an organic ligand, and xc2 is an integer from 0 to 4, wherein, when xc2 is two or more two or more $L_{402}$(s) are identical to or different from each other, $X_{401}$ to $X_{404}$ are each independently nitrogen or carbon, $X_{401}$ and $X_{403}$ are linked via a single bond or a double bond, and $X_{402}$ and $X_{404}$ are linked via a single bond or a double bond, $A_{401}$ and $A_{402}$ are each independently a $C_5$-$C_{60}$ carbocyclic group or a $C_1$-$C_{60}$ heterocyclic group, $X_{405}$ is a single bond, *—O—*', *—S—*', *—C(=O)—*', *—N($Q_{411}$)-*', *—C($Q_{411}$)($Q_{412}$)-*', *—C($Q_{411}$)=C($Q_{412}$)-*', *—C($Q_{411}$)-*', or *=C($Q_{411}$)=*', wherein $Q_{411}$ and $Q_{412}$ are each independently hydrogen, deuterium, a $C_1$-$C_{20}$ alkyl group, a $C_1$-$C_{20}$ alkoxy group, a phenyl group, a biphenyl group, a terphenyl group, or a naphthyl group, $X_{406}$ is a single bond, O, or S, $R_{401}$ and $R_{402}$ are each independently selected from hydrogen, deuterium, —F, —Cl, —Br, —I, a hydroxyl group, a cyano group, a nitro group, an amidino group, a hydrazino group, a hydrazono group, a substituted or unsubstituted $C_1$-$C_{20}$ alkyl group, a substituted or unsubstituted $C_1$-$C_{20}$ alkoxy group, a substituted or unsubstituted $C_3$-$C_{10}$ cycloalkyl group, a substituted or unsubstituted $C_1$-$C_{10}$ heterocycloalkyl group, a substituted or unsubstituted $C_3$-$C_{10}$ cycloalkenyl group, a substituted or unsubstituted $C_1$-$C_{10}$ heterocycloalkenyl group, a substituted or unsubstituted $C_6$-$C_{60}$ aryl group, a substituted or unsubstituted $C_6$-$C_{60}$ aryloxy group, a substituted or unsubstituted $C_6$-$C_{60}$ arylthio group, a substituted or unsubstituted $C_1$-$C_{60}$ heteroaryl group, a substituted or unsubstituted monovalent non-aromatic condensed polycyclic group, a substituted or unsubstituted monovalent non-aromatic condensed heteropolycyclic group, —Si($Q_{401}$)($Q_{402}$)($Q_{403}$), —N($Q_{401}$)($Q_{402}$), —B($Q_{401}$)($Q_{402}$), —C(=O)($Q_{401}$), —S(=O)$_2$($Q_{401}$), and —P(=O)($Q_{401}$)($Q_{402}$), wherein $Q_{401}$ to $Q_{403}$ are each independently selected from a $C_1$-$C_{10}$ alkyl group, a $C_1$-$C_{10}$ alkoxy group, a $C_6$-$C_{20}$ aryl group, and a $C_1$-$C_{20}$ heteroaryl group, xc11 and xc12 are each independently an integer from 0 to 10, and

* and *' in Formula 402 each indicate a binding site to M in Formula 401.

14. The organic light-emitting device of claim 1, wherein:

the second emission layer is between the first emission layer and the cathode;

the organic layer comprises:

a hole transport region between the anode and the first emission layer and comprising an electron blocking layer; and an electron transport region between the second emission layer and the cathode and comprising a hole blocking layer;

the electron blocking layer is in direct contact with the first emission layer; and the hole blocking layer is in direct contact with the second emission layer.

15. An electronic apparatus comprising:

a thin-film transistor comprising a source electrode, a drain electrode, and an activation layer; and the organic light-emitting device of claim 1, wherein the anode or the cathode of the organic light-emitting device is electrically connected to the source electrode or the drain electrode of the thin-film transistor.

* * * * *